(12) United States Patent
Sugisaki et al.

(10) Patent No.: US 8,258,600 B2
(45) Date of Patent: Sep. 4, 2012

(54) CAPACITOR ELEMENT AND SEMICONDUCTOR DEVICE

(75) Inventors: Tsuyoshi Sugisaki, Kawasaki (JP);
Hajime Kurata, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 177 days.

(21) Appl. No.: 12/720,132

(22) Filed: Mar. 9, 2010

(65) Prior Publication Data

US 2010/0164067 A1 Jul. 1, 2010

Related U.S. Application Data

(63) Continuation of application No. PCT/JP2007/069375, filed on Oct. 3, 2007.

(51) Int. Cl.
*H01L 29/92* (2006.01)

(52) U.S. Cl. .................. 257/532; 257/E29.342; 361/303

(58) Field of Classification Search .................. 257/532, 257/E29.342; 361/303
See application file for complete search history.

(56) References Cited

U.S. PATENT DOCUMENTS

| | | | |
|---|---|---|---|
| 6,297,524 B1 | 10/2001 | Vathulya et al. | |
| 6,570,210 B1 | 5/2003 | Sowlati et al. | |
| 2002/0024087 A1 | 2/2002 | Aton | |
| 2002/0047154 A1 | 4/2002 | Sowlati et al. | |
| 2003/0194840 A1 | 10/2003 | Murata | |
| 2005/0145987 A1* | 7/2005 | Okuda et al. | 257/532 |
| 2006/0086965 A1 | 4/2006 | Sakaguchi et al. | |
| 2006/0208339 A1 | 9/2006 | Iioka et al. | |
| 2007/0013029 A1 | 1/2007 | Iioka et al. | |

FOREIGN PATENT DOCUMENTS

| | | |
|---|---|---|
| JP | 2002-124575 A | 4/2002 |
| JP | 2003-309181 A | 10/2003 |
| JP | 2003-529941 A | 10/2003 |
| JP | 2003-530699 A | 10/2003 |
| JP | 2003-536271 A | 12/2003 |
| JP | 2005-108874 A | 4/2005 |
| JP | 2005-183739 A | 7/2005 |
| JP | 2005-197396 A | 7/2005 |
| JP | 2006-108455 A | 4/2006 |
| JP | 2006-128164 A | 5/2006 |
| JP | 2006-261455 A | 9/2006 |
| KR | 1020070002665 A | 1/2007 |
| WO | 01/75983 A2 | 10/2001 |
| WO | 01/78149 A2 | 10/2001 |
| WO | 01/99163 A2 | 12/2001 |

OTHER PUBLICATIONS

Korean Office Action dated Jun. 7, 2011, issued in corresponding Korean Patent Application No. 10-2010-7003265.

(Continued)

*Primary Examiner* — Zandra Smith
*Assistant Examiner* — Paul Patton
(74) *Attorney, Agent, or Firm* — Fujitsu Patent Center

(57) ABSTRACT

A semiconductor device includes a capacitor element including a first comb-shaped interconnection formed over a substrate and including a first comb tooth, a second comb-shaped interconnection formed over the substrate and including a second comb tooth opposed to the first comb tooth, and a first electrode and a second electrode opposed to each other with opposed surfaces of the first electrode and the second electrode intersecting a longitudinal direction of the first comb tooth and the second comb tooth, a first dielectric layer formed between the first electrode and the second electrode, the first electrode being connected to the first comb tooth, and the second electrode being connected to the second comb tooth.

26 Claims, 44 Drawing Sheets

OTHER PUBLICATIONS

J. Kim et al, "3-Dimensional Vertical Parallel Plate Capacitors in an SOI CMOS Technology for Integrated RF Circuits," Symposium on VLSI Circuits Digest of Technical Papers, 2003, cited in spec.

International Search Report of PCT/JP2007/069375, mailing date of Jan. 8, 2008.

* cited by examiner

CAPACITOR ELEMENT AND SEMICONDUCTOR DEVICE

CROSS-REFERENCE TO RELATED APPLICATION

This application is a Continuation of PCT application No. PCT/JP2007/069375, which was filed on Oct. 3, 2007, and which designated the United States of America, the entire contents of which are incorporated herein by reference.

FIELD

The embodiments discussed herein are related to a capacitor element and a semiconductor device including the capacitor element.

BACKGROUND

Capacitor elements are important constituent elements in electronic devices, such as low-pass filters, RF (Radio-Frequency) circuits, AD converters, etc.

Recently, as a capacitor element having good voltage characteristics and high frequency characteristics, the MIM (Metal-Insulator-Metal) capacitor element is noted.

Related references are as follows:
Japanese Laid-open Patent Publication No. 2002-124575,
Japanese Laid-open Patent Publication No. 2003-529941,
Japanese Laid-open Patent Publication No. 2003-530699,
Japanese Laid-open Patent Publication No. 2003-536271,
Japanese Laid-open Patent Publication No. 2005-108874,
Japanese Laid-open Patent Publication No. 2006-128164, and
Jonghae Kim et al., "3-Dimensional Vertical Parallel Plate capacitors in an SOI CMOS Technology for Integrated RF Circuits", 2003 Symposium on VLSI Circuits Digests of Technical Papers, pp. 29-32, June 2003.

SUMMARY

According to one aspect of the embodiment, a capacitor element comprising: a first comb-shaped interconnection formed over a substrate and including a first comb tooth; a second comb-shaped interconnection formed over the substrate and including a second comb tooth opposed to the first comb tooth; a first electrode and a second electrode opposed to each other with opposed surfaces of the first electrode and the second electrode intersecting a longitudinal direction of the first comb tooth and the second comb tooth; and a first dielectric layer formed between the first electrode and the second electrode, the first electrode being connected to the first comb tooth, and the second electrode being connected to the second comb tooth.

According to another aspect of the embodiment, a semiconductor device comprising a capacitor element formed over a semiconductor substrate, the capacitor element including a first comb-shaped interconnection formed over the substrate and including a first comb tooth; a second comb-shaped interconnection formed over the substrate and including a second comb tooth opposed to the first comb tooth; a first electrode and a second electrode opposed to each other with opposed surfaces of the first electrode and the second electrode intersecting a longitudinal direction of the first comb tooth and the second comb tooth; and a first dielectric layer formed between the first electrode and the second electrode, the first electrode being connected to the first comb tooth, and the second electrode being connected to the second comb tooth.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

The dielectric capacities per a unit area of the proposed capacitor elements are not always sufficiently large. Especially, the low-pass filters, etc. requires extremely large dielectric capacities, and to this end, techniques for improving the dielectric capacitance per a unit area have been expected.

Preferred embodiments of the present invention will be explained with reference to accompanying drawings.

[a] First Embodiment

The capacitor element according to a first embodiment, the semiconductor device including the capacitor element, and their manufacturing method will be explained with reference to FIGS. 1 to 11.

(Capacitor Element and Semiconductor Device)

Figure 1:
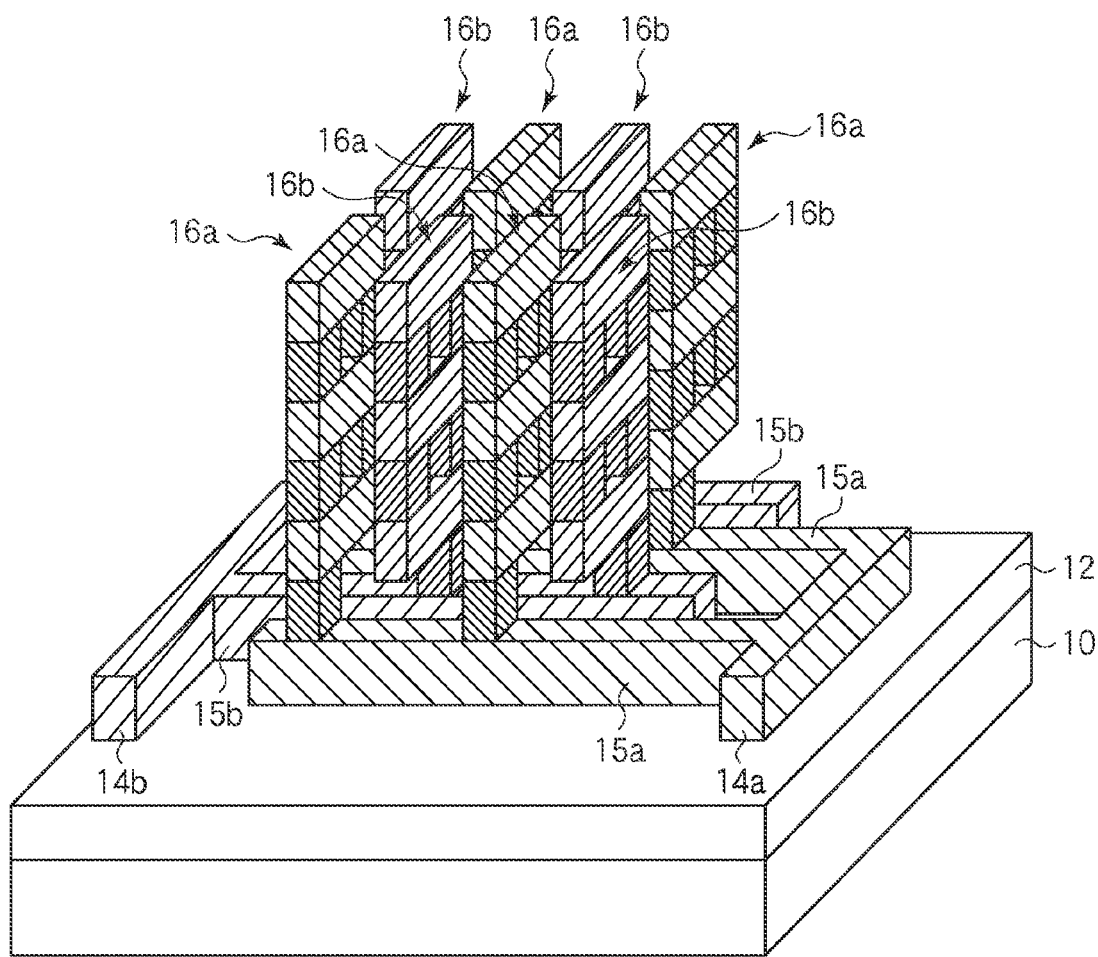
FIG. 1 is a perspective view of a semiconductor device according to a first embodiment.
Figure 2:
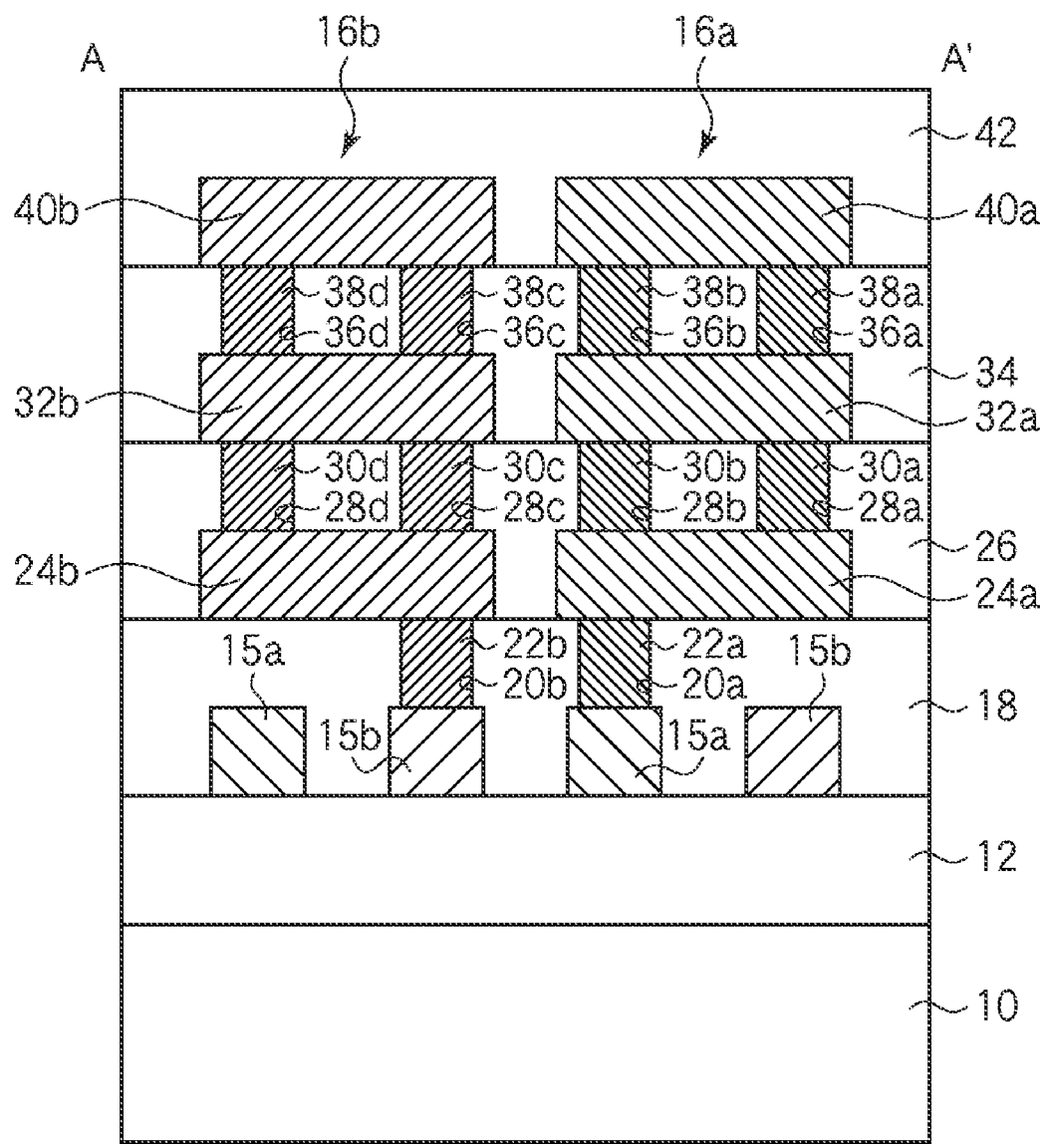
FIG. 2 is a sectional view of the semiconductor device according to the first embodiment.
Figure 3:
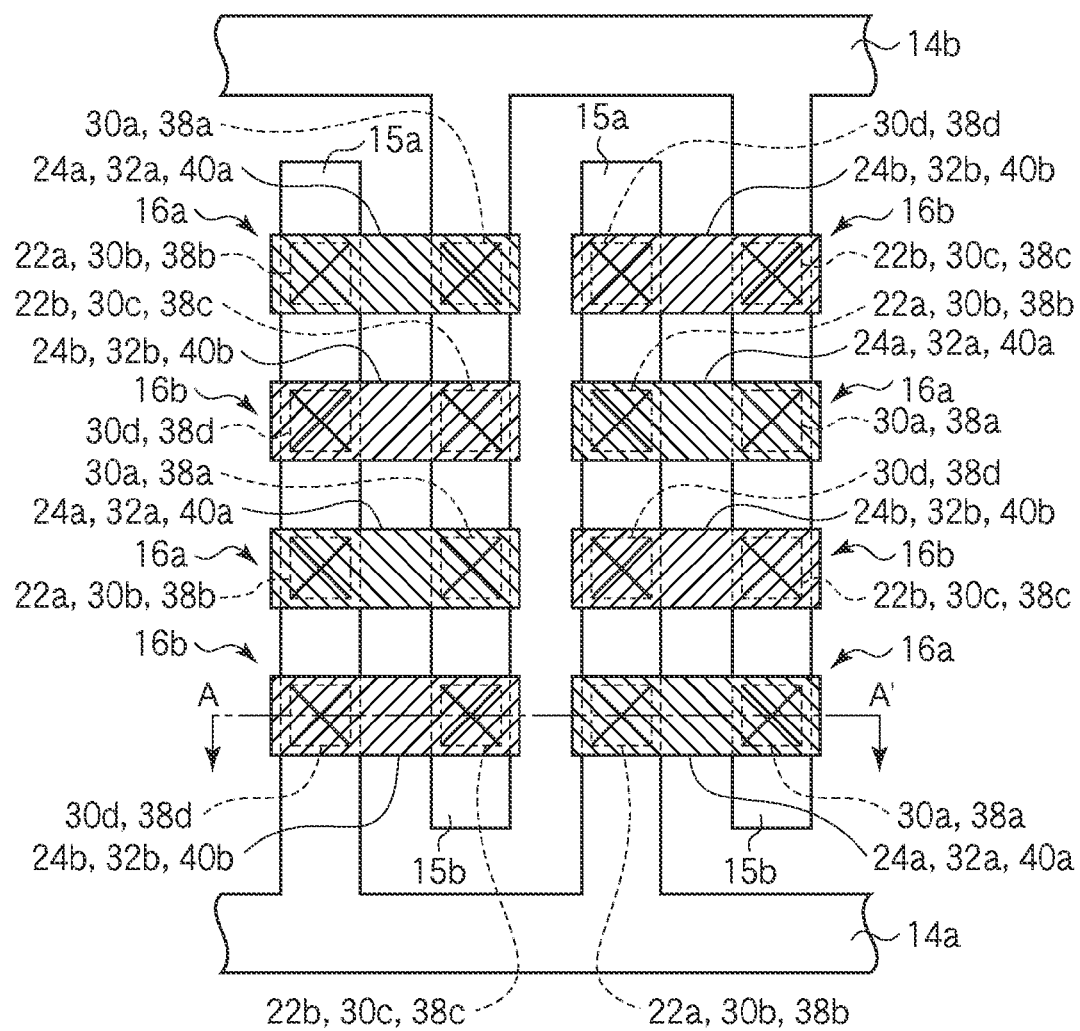
FIG. 3 is a plan view of the semiconductor device according to the first embodiment.

First, the capacitor element according to the present embodiment and the semiconductor device including the capacitor element will be explained with reference to FIGS. 1 to 3. FIG. 1 is a perspective view of the semiconductor device according to the present embodiment, which illustrates the semiconductor device. Inter-layer insulation films 18, 26, 32, 34 burying first electrodes 16a and second electrodes 16b are not illustrated. FIG. 2 is a sectional view of the semiconductor device according to the present embodiment. FIG. 3 is a plan view of the semiconductor device according to the present embodiment. FIG. 2 is the sectional view along the A-A' line in FIG. 3.

As illustrated in FIG. 1, an inter-layer insulation film 12 of, e.g., silicon oxide film is formed on a semiconductor substrate 10 of, e.g., a silicon substrate. On the semiconductor substrate 10, transistors, conductor plugs, interconnections, etc. not illustrated are suitably formed.

On the inter-layer insulation film 12, a first comb-shaped (comb teeth-shaped) interconnection 14a and a second bomb-shaped (comb teeth-shaped) interconnections 14b are formed. The first comb-shaped interconnection 14a and the second comb-shaped interconnection 14b are formed on the same layer. The first comb-shaped interconnection 14a has a plurality of comb teeth 15a. The plural comb teeth 15a of the first comb-shaped interconnection 14a are formed in parallel with each other. The second comb-shaped interconnection 14b has a plurality of comb teeth 15b. The plural comb teeth 15b of the second comb-shaped interconnections 14b are formed in parallel with each other. The plural comb teeth 15a of the first comb-shaped interconnection 14a and the plural comb teeth 15b of the second comb-shaped interconnection 14b are arranged alternately therebetween. In other words, the plural comb teeth 15a of the first comb-shaped interconnection 14a and the plural teeth 15b of the second comb-shaped interconnection 14b are formed in combination with each other. The plural comb teeth 15a of the first comb-shaped interconnection 14a and the plural comb teeth 15b of the second comb-shaped interconnection 14b are arranged opposed to each other. One of the comb tooth 15b of the second comb-shaped interconnection 14b is disposed between one of the comb tooth 15a of the first comb-shaped interconnection 14a and the other of the comb tooth 15b of the first comb-shaped interconnection 14a. The other of the comb tooth 15a of the first comb-shaped interconnection 14a is disposed between one of the comb tooth 15b of the second comb-shaped interconnection 14b and the other of the comb tooth 15b of the second comb-shaped interconnection 14b. The first comb-shaped interconnection 14a is connected to, e.g., a first potential. The second comb-shaped interconnection 14b is connected to, e.g., a second potential which is different from the first potential. The first potential is, e.g., power supply potential. The second potential is, e.g., the ground potential. The gap between the comb teeth 15a of the first comb-shaped interconnection 14a and the comb teeth 15b of the second comb-shaped interconnection 14b is made small, which makes the gaps between the first electrodes 16a and the second electrodes 16b can be made small, whereby the improvement of the dielectric capacitance per a unit area of the capacitor element can be realized.

On the semiconductor substrate 10 with the first comb-shaped interconnection 14a and the second comb-shaped interconnection 14b formed on, a plurality of the first electrodes 16a and a plurality of the second electrodes 16b are formed, projected perpendicularly to the surface of the semiconductor substrate 10. The plural first electrodes 16a and the plural second electrodes 16b are formed alternately and, as viewed from above the semiconductor substrate 10, are arranged in a matrix as a whole (see FIG. 3).

The plural first electrodes 16a form one electrode of the capacitor element (capacitor unit), and the plural second electrodes 16b form the other electrode opposed to said one electrode of the capacitor element (capacitor unit).

As will be detailed below, the first electrodes 16a each comprise a conductor plug 22a, a linear conduction layer 24a, conductor plugs 30a, 30b, a linear conduction layer 32a, conductor plugs 38a, 38b and a linear conduction layer 40a sequentially stacked. The first electrodes 16a are connected to the first comb-shaped interconnection 14a. More specifically, the first electrodes 16a are connected to the comb teeth 15a of the first comb-shaped interconnection 14a.

As will be detailed below, the second electrodes 16b each comprise a conductor plug 22b, a linear conduction layer 24b, conductor plugs 30c, 30d, a linear conduction layer 32b, conductor plugs 38a, 38d and a linear conduction layer 40b sequentially stacked. The second electrodes 16b are connected to the second comb-shaped interconnection 14b. More specifically, the second electrodes 16b are connected to the comb teeth 15b of the second comb-shaped interconnection 14b.

The opposed surfaces of the first electrodes 16a and the second electrodes 16b cross the longitudinal direction of the comb teeth of the first comb-shaped interconnection 14a and the second comb-shaped interconnection 14b, more specifically, are perpendicular to the longitudinal direction of the comb teeth of the first comb-shaped interconnection 14a and the second comb-shaped interconnection 14b.

The plural first electrodes 16a and the plural second electrodes 16b are buried in the inter-layer insulation films 18, 26, 34, 42.

On the inter-layer insulation film 12 with the first comb-shaped interconnection 14a and the second comb-shaped interconnection 14b formed on, the inter-layer insulation film 18 of, e.g., silicon oxide film is formed.

In the inter-layer insulation film 18, contact holes 20a arriving at the comb tooth 15a of the first comb-shaped interconnection 14a and contact holes 20b arriving at the comb tooth 15b of the second comb-shaped interconnection 14b are formed.

In the contact holes 20a, 20b, conductor plugs 22a, 22b are respectively buried.

On the inter-layer insulation film 18 with the conductor plugs 22a, 22b buried in, the linear conduction layers 24a, 24b are formed. The linear conduction layer 24a is connected to the conductor plugs 22a, and the linear conduction layer 24b is connected to the conductor plugs 22b.

On the inter-layer insulation film 18 with the linear conduction layers 24a, 24b formed on, the inter-layer insulation film 26 of, e.g., silicon oxide film is formed.

In the inter-layer insulation 26, contact holes 28a, 28b respectively arriving at the linear conduction layer 24a, and contact holes 28c, 28d respectively arriving at the linear conduction layer 24b are formed.

In the contact holes 28a, 28b, conductor plugs 30a, 30b are respectively buried. The conductor plugs 30a are connected to one ends of the linear conduction layers 24a, and the conductor plugs 30b are connected to the other ends of the linear conduction layers 24a.

In the contact holes 28c, 28d, conductor plugs 30c, 30d are respectively buried. The conductor plugs 30c are connected to one ends of the conduction layers 24b, and the conductor plugs 30d are connected to the other ends of the linear conduction layers 24b.

On the inter-layer insulation film 26 with the conductor plugs 30a-30d buried in, linear conduction layers 32a, 32b are formed.

The linear conduction layers 32a have one ends connected to one ends of the linear conduction layers 24a via the conductor plugs 30a. The linear conduction layers 32a have the other ends connected to the other ends of the linear conduction layers 24a via the conductor plugs 30b.

The linear conduction layers 32b have one ends connected to one ends of the linear conduction layers 24b via the conductor plugs 30c. The linear conduction layers 32b have the other ends connected to the other ends of the linear conduction layer 24b via the conductor plugs 30d.

On the inter-layer insulation film 26 with the linear conduction layers 32a, 32b formed on, the inter-layer insulation film 34 of, e.g., silicon oxide film is formed.

In the inter-layer insulation film 34, contact holes 36a, 36b respectively arriving at the linear conduction layers 32a, and contact holes 36c, 36d respectively arriving at the linear conduction layers 32b are formed.

In the contact holes 36a, 36b, conductor plugs 38a, 38b are respectively buried. The conductor plugs 38a are connected to one ends of the linear conduction layers 32a, and the conductor plugs 38b are connected to the other ends of the linear conduction layers 32a.

In the contact holes 36c, 36d, conductor plugs 38c, 38d are respectively buried. The conductor plugs 38c are connected to one ends of the linear conduction layers 32b, and the conductor plugs 38d are connected to the other ends of the linear conduction layers 32b.

On the inter-layer insulation film 34 with the conductor plugs 38a-38d buried in, linear conduction layers 40a, 40b are formed.

The linear conduction layers 40a have one ends connected to one ends of the linear conduction layers 32a via the conductor plugs 38a. The linear conduction layers 40a have the other ends connected to the other ends of the linear conduction layers 32a via the conductor plugs 38b.

The linear conduction layers 40b have one ends connected to one ends of the linear conduction layers 32b via the conductor plugs 38c. The linear conduction layers 40b have the other ends connected to the other ends of the linear conduction layers 32b via the conductor plugs 38d.

On the inter-layer insulation film 34 with the linear conduction layers 40a, 40b formed on, the inter-layer insulation film 42 of, e.g., silicon oxide film is formed.

Thus, the first electrodes 16a each including the conductor plug 22a, the conduction layer 24a, the conductor plugs 30a, 30b, the conduction layer 32a, the conductor plugs 38a, 38b and the conduction layer 40a are constituted.

The second electrodes 16b each including the conductor plug 22b, the conduction layer 24b, the conductor plugs 30c, 30d, the conduction layer 32b, the conductor plugs 38c, 38d and the conduction layer 40b are constituted.

As described above, the first electrodes 16a and the second electrodes 16b are alternately laid out and, as viewed from above the semiconductor substrate 10, are arranged in a matrix as a whole.

The inter-layer insulation films 18, 26, 34, 42 present between the first electrodes 16a and the second electrodes 16b function as the dielectric layers of the capacitor element.

The first electrodes 16a, the dielectric layers 18, 26, 34, 42 and the second electrodes 16b form the capacitor element.

Thus, the semiconductor device according to the present embodiment is constituted.

According to the present embodiment, the first electrodes 16a and the second electrodes 16b are connected respectively to the first comb-shaped interconnection 14a and the second comb-shaped interconnection 14b which are formed in the same layer. This opposes the n-th layer conductor plugs forming a part of the first electrodes 16a and the n-th conductor plugs forming a part of the second electrodes 16b to each other. This opposes the m-th conduction layer 40a forming a part of the first electrodes 16a and the m-th conduction layer 40b forming a part of the second electrodes 16b to each other. According to the present embodiment, the dielectric capacitance between the first electrodes 16a and the second electrodes 16b can be ensured large. Thus, according to the present embodiment, the dielectric capacitance per a unit area can be made sufficiently large.

According to the present embodiment, the first electrodes 16a and the second electrodes 16b are alternately formed and, as viewed from above the semiconductor substrate 10, are arranged in a matrix as a whole. Thus, according to the present embodiment, not only the parallel-plate capacitance between the first electrodes 16a and the second electrodes 16b but also the fringe capacitance between the first electrodes 16a and the second electrodes 16b can be ensured large. Thus, according to the present embodiment, the dielectric capacitance per a unit area can be made sufficiently large.

According to the present embodiment, the first electrodes 16a and the second electrodes 16a are formed, projected perpendicularly to the semiconductor substrate 10. Thus, the gap between the first electrodes 16a and the second electrodes 16b can be made sufficiently smaller in comparison with the gap provided by forming the first electrodes 16a and the second electrodes 16b on different inter-layer insulation films in parallel with the surfaces of the inter-layer insulation films. Thus, according to the present embodiment, the capacitor can have a large the dielectric capacitance per a unit area.

(Manufacturing Method of Capacitor Element and Semiconductor Device)

Figure 10:
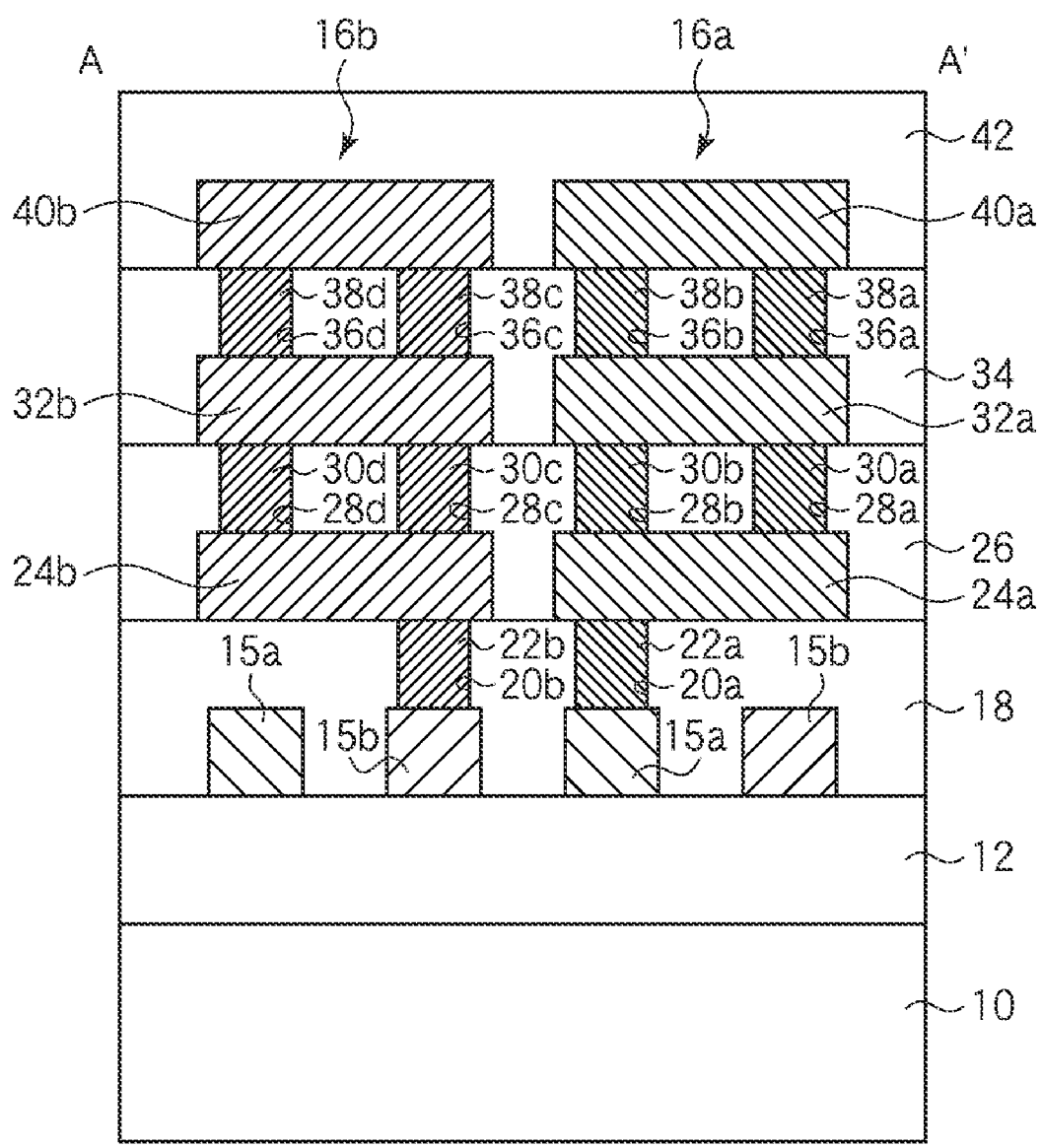
Figure 11:
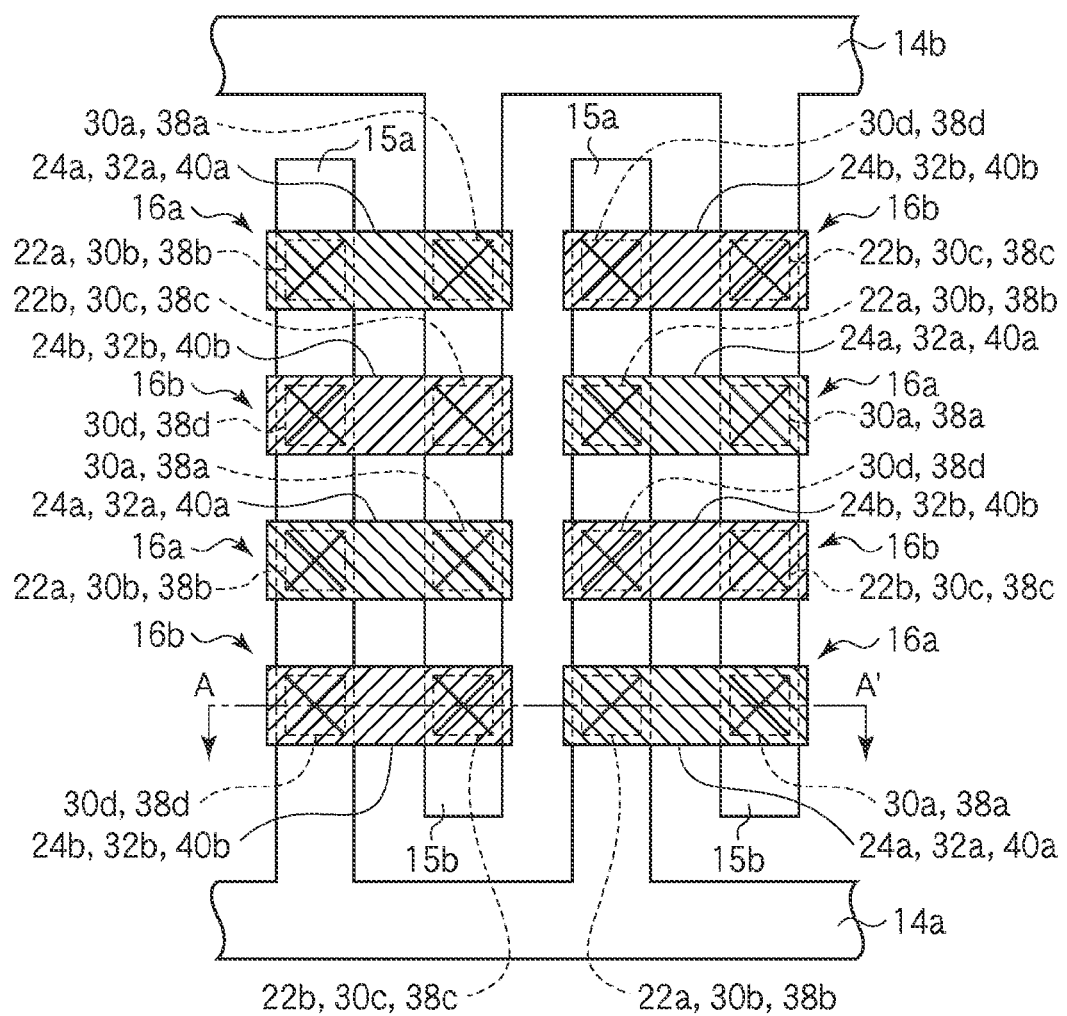

Next, the method of manufacturing the capacitor element according to the present embodiment and the semiconductor device including the capacitor element will be explained with reference to FIGS. 4A to 11. FIGS. 4A to 11 are views of the semiconductor device according to the present embodiment in the steps of the semiconductor manufacturing method, which illustrate the method. FIG. 4A, FIG. 5A, FIG. 6A, FIG. 7A, FIG. 8A and FIG. 9A are sectional views and correspond respectively to the A-A' line section of FIG. 4B, FIG. 5B, FIG. 6B, FIG. 7B, FIG. 8B and FIG. 9B. FIG. 10 is a sectional view, and FIG. 11 is a plan view. FIG. 10 corresponds to the A-A' line section of FIG. 11.

Figure 4A:
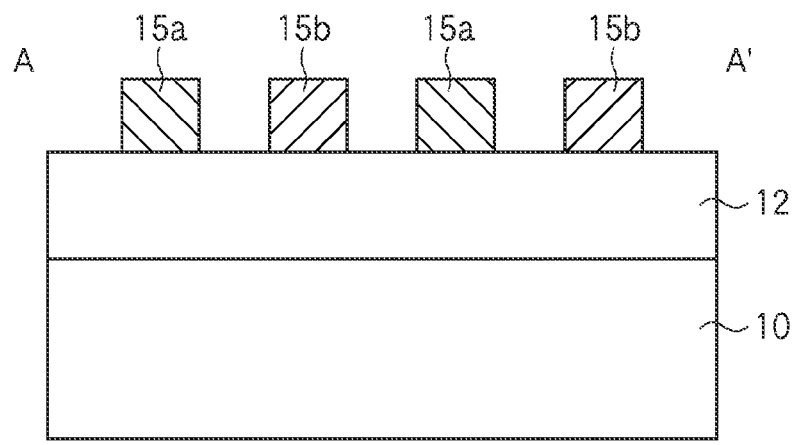
FIGS. 4A to 11 are views of the semiconductor device according to the first embodiment in the steps of the method of manufacturing the semiconductor device, which illustrate the method.
Figure 4B:
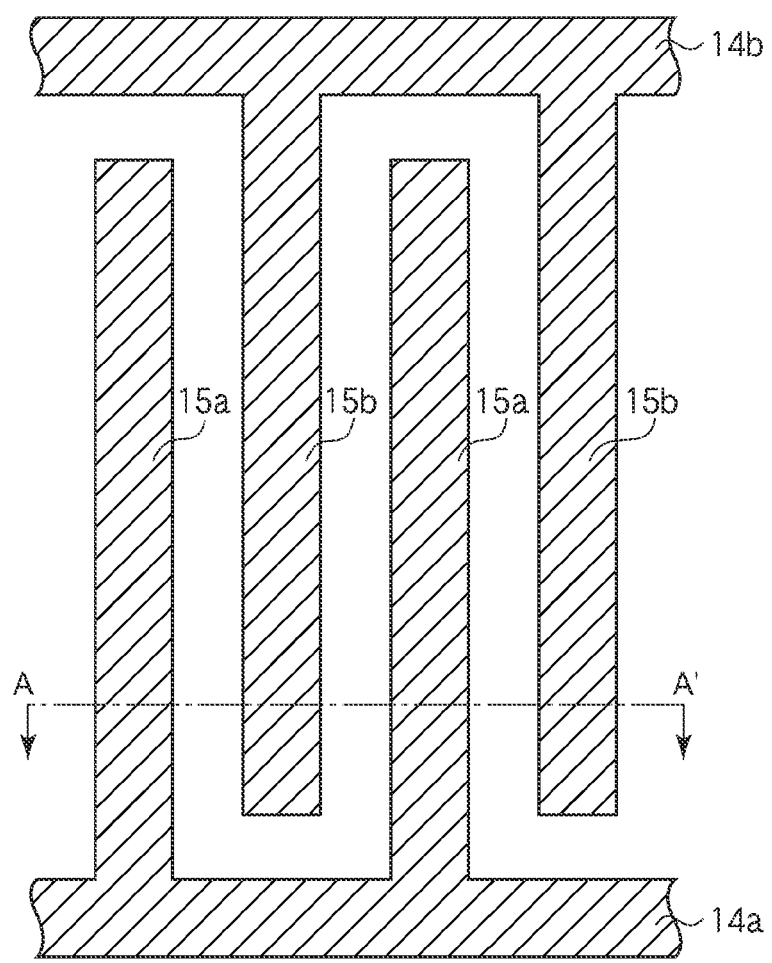

First, as illustrated in FIGS. 4A and 4B, the inter-layer insulation film 12 of, e.g., silicon oxide film is formed on the semiconductor substrate 10 of, e.g., a silicon substrate.

Next, on the entire surface, a conduction film of aluminum or others of an about 200-300 nm-film thickness is formed by, e.g., sputtering.

Then, the conduction film is patterned by photolithography. Thus, as illustrated in FIG. 4B, on the inter-layer insulation film 12, a first comb-shaped interconnection 14a having a plurality of comb teeth 15a and a second comb-shaped interconnection 14b having a plurality of comb teeth 15b are formed.

The case that the first comb-shaped interconnection 14a and the second comb-shaped interconnection 14b are formed by forming a conduction film of aluminum or others and etching the conduction film is exemplified here. The method for forming the first comb-shaped interconnection 14a and the second comb-shaped interconnection 14b is not limited to this. The first comb-shaped interconnection 14a and the second comb-shaped interconnection 14b may be formed by damascene.

FIGS. 12A to 15 are sectional views of the semiconductor device according to the present embodiment in the steps of the semiconductor manufacturing method according to a modification, which illustrate the method.

Figure 12A:
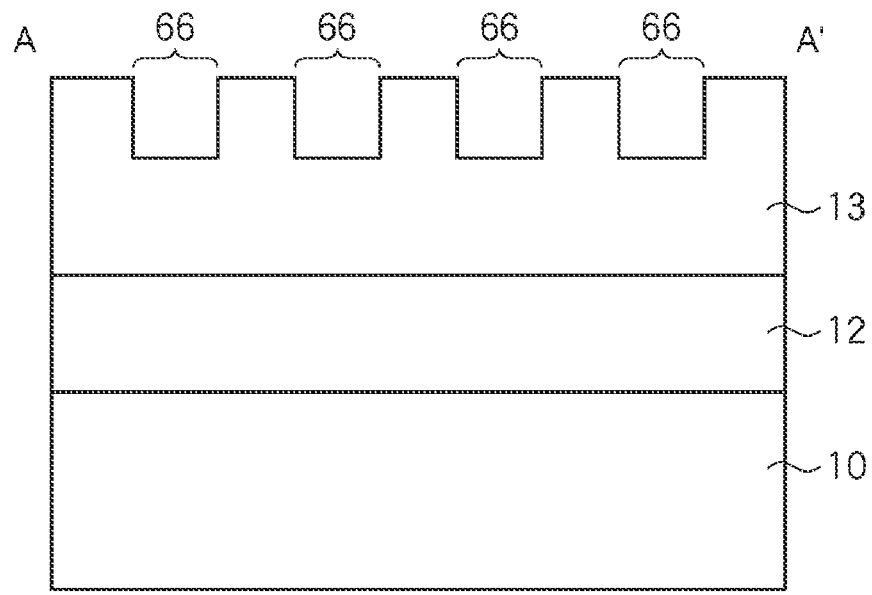
FIGS. 12A to 15 are sectional views of the semiconductor device according to a modification of the first embodiment in the steps of the method of manufacturing the semiconductor device, which illustrate the method.

First, as illustrated in FIG. 12A, trenches 66 are formed in the inter-layer insulation film 13 formed on the inter-layer insulation film 12.

Then, on the entire surface, a barrier metal 68 of TiN or others is formed by, e.g., sputtering.

Next, on the entire surface, a seed layer (not illustrated) of Cu is formed by, e.g., sputtering.

Figure 12B:
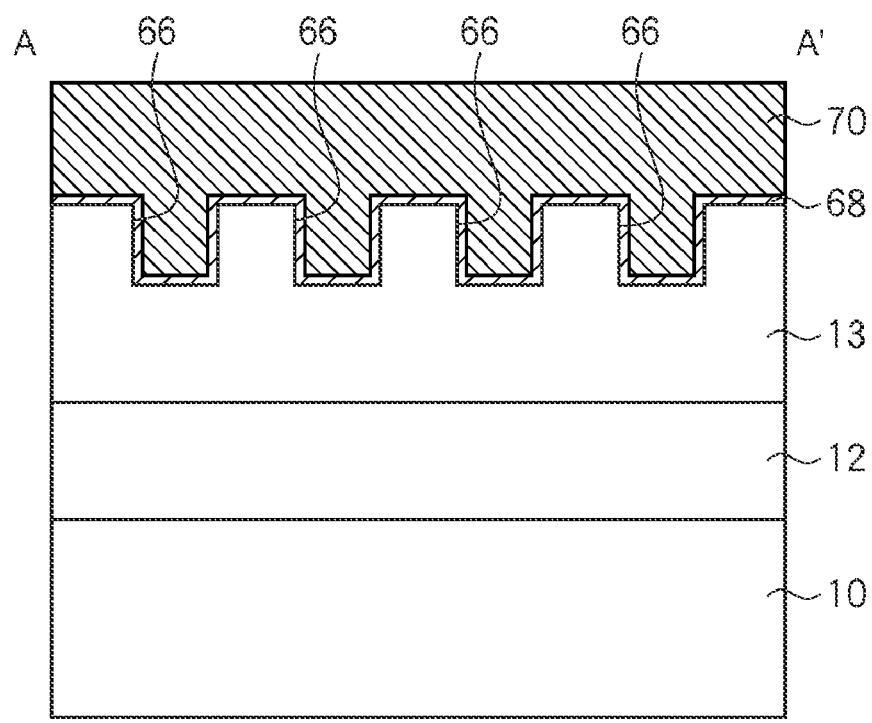

Then, on the entire surface, a conduction film 70 of Cu is formed by electroplating (see FIG. 12B).

Then, by CMP (Chemical Mechanical Polishing), the conduction film 70, the seed layer and the barrier metal 68 are polished until the surface of the inter-layer insulation film 13 is exposed. Thus, the first comb-shaped interconnection 14a of Cu and the second comb-shaped interconnection 14b of Cu are buried in the inter-layer insulation film 13 (see FIG. 13A).

Thus, the first comb-shaped interconnection 15a and the second comb-shaped interconnection 15b may be formed by damascene.

Figure 5A:
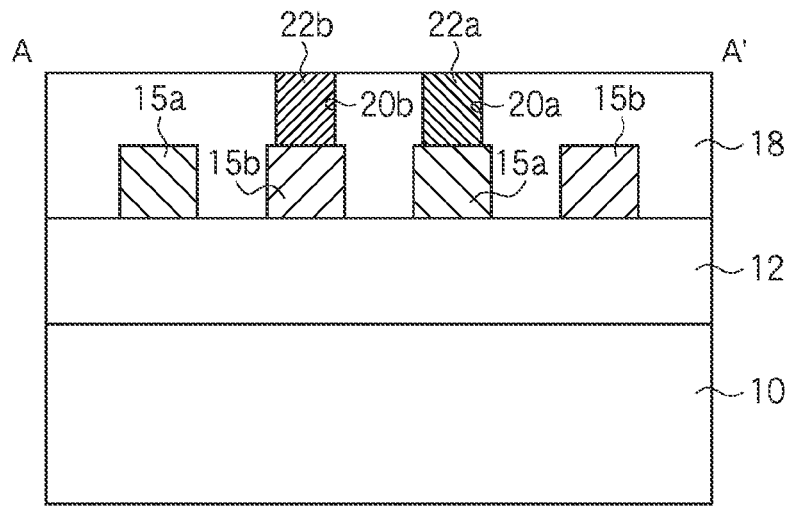
Figure 5B:
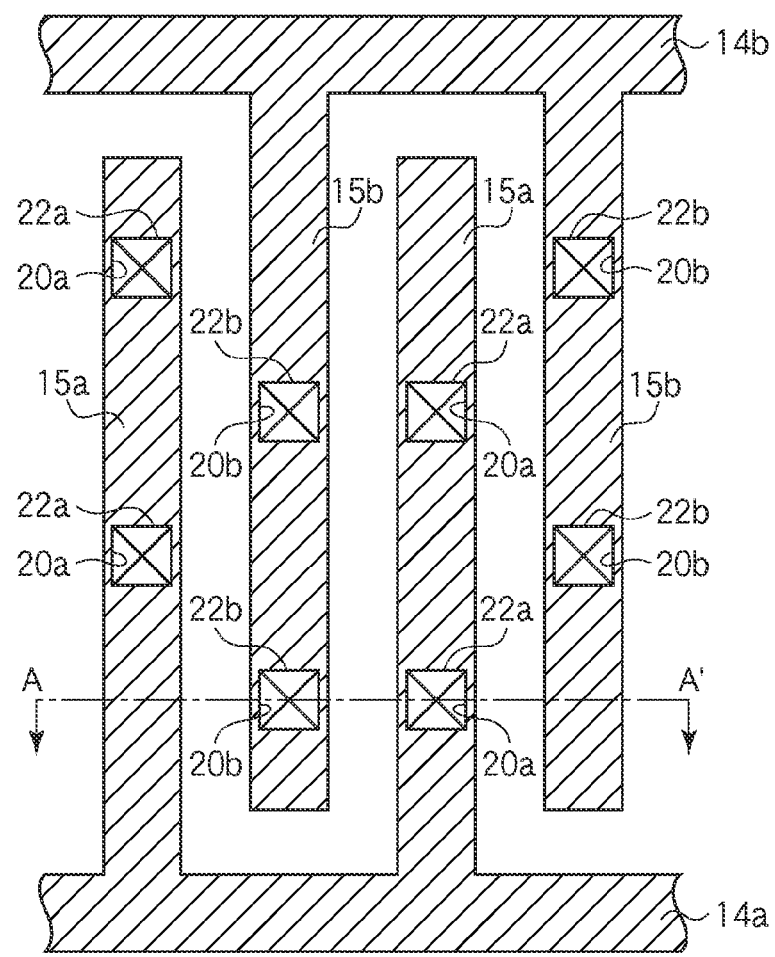
Figure 6A:
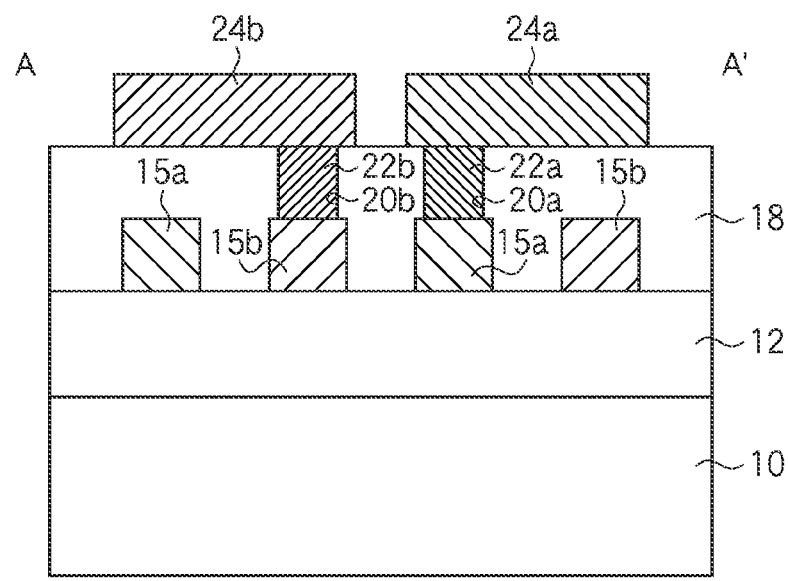
Figure 6B:
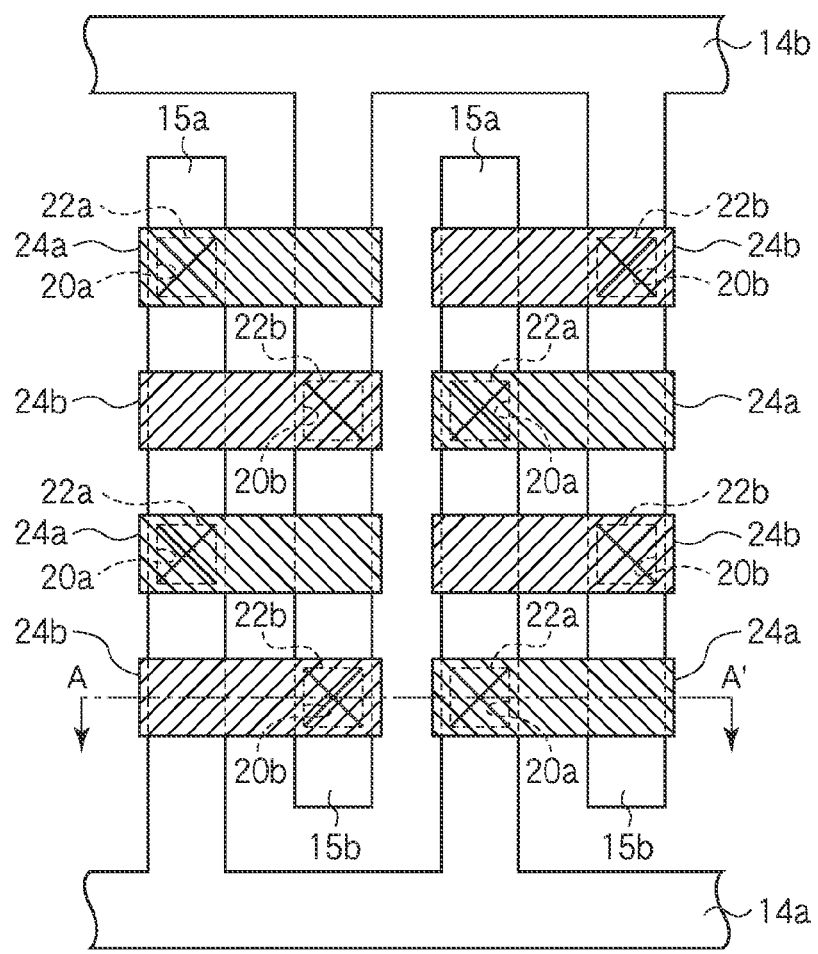

Next, as illustrated in FIGS. 5A and 5B, on the inter-layer insulation film 12 with the first comb-shaped interconnection 14a and the second comb-shaped interconnection 14b formed on, the inter-layer insulation film 18 of, e.g., silicon oxide film is formed.

Next, by, e.g., photolithography, the contact holes 20a arriving at the comb-teeth 15a of the first comb-shaped interconnection 14a and the contact holes 20b arriving at the comb-teeth 15b of the second comb-shaped interconnection 14b are formed in the inter-layer insulation film 18.

Next, on the entire surface, a barrier film and a tungsten film are formed by, e.g., CVD. The material of the barrier film can be Ti, TiN, Ta, TaN or others.

Then, the tungsten film and the barrier film are polished by, e.g., CMP until the surface of the inter-layer insulation film 18 is exposed. Thus, the conductor plugs 22a, 22b of, e.g., tungsten are respectively buried in the contact holes 20a, 20b.

Next, on the entire surface, a conduction film of aluminum or others of a 200-300 nm-film thickness is formed by, e.g., sputtering.

Then, the conduction film is patterned by photolithography. Thus, the linear conduction layers 24a and the linear conduction layers 24b are formed on the inter-layer insulation film 18. These conduction layers 24a, 24b are alternately formed and, as viewed from above the semiconductor substrate 10, the conduction layers 24a, 24b are arranged in a matrix as a whole. One ends of the linear conduction layers 24a are connected to the conductor plugs 22a. The conduction layers 24a are electrically connected to the comb-shaped interconnections 14a via the conductor plugs 22a. One ends of the linear conduction layers 24b are connected to the conductor plugs 22b. The conduction layers 24b are electrically connected to the comb-shaped interconnection 14b via the conductor plugs 22b (see FIGS. 6A and 6B).

The case that the conduction layers 24a and the conduction layers 24b are formed by forming a conduction film of aluminum or others and etching the conduction film is exemplified here. However, the method forming the conduction layers 24a and the conduction layer 24b is not limited to this. The conduction layers 24a and the conduction layers 24b may be formed by dual damascene as follows.

Figure 13A:
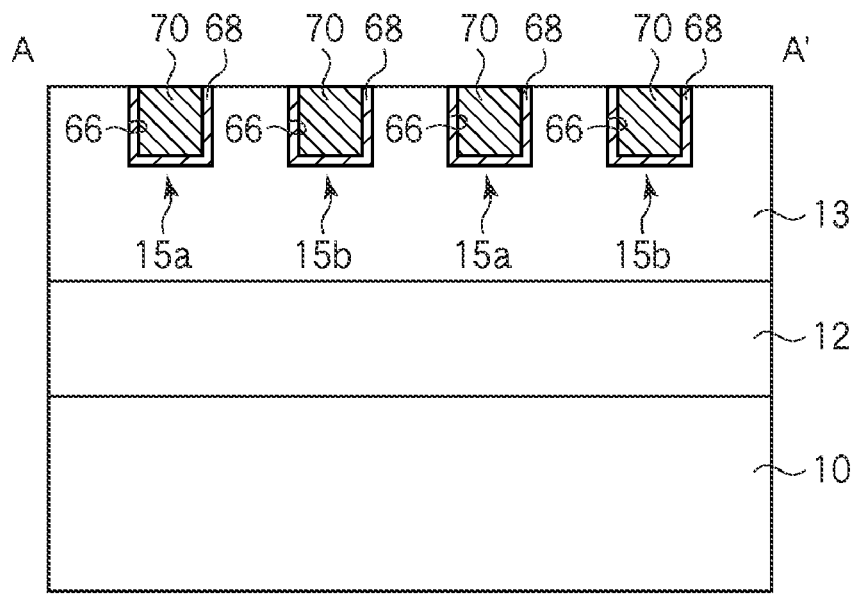
Figure 13B:
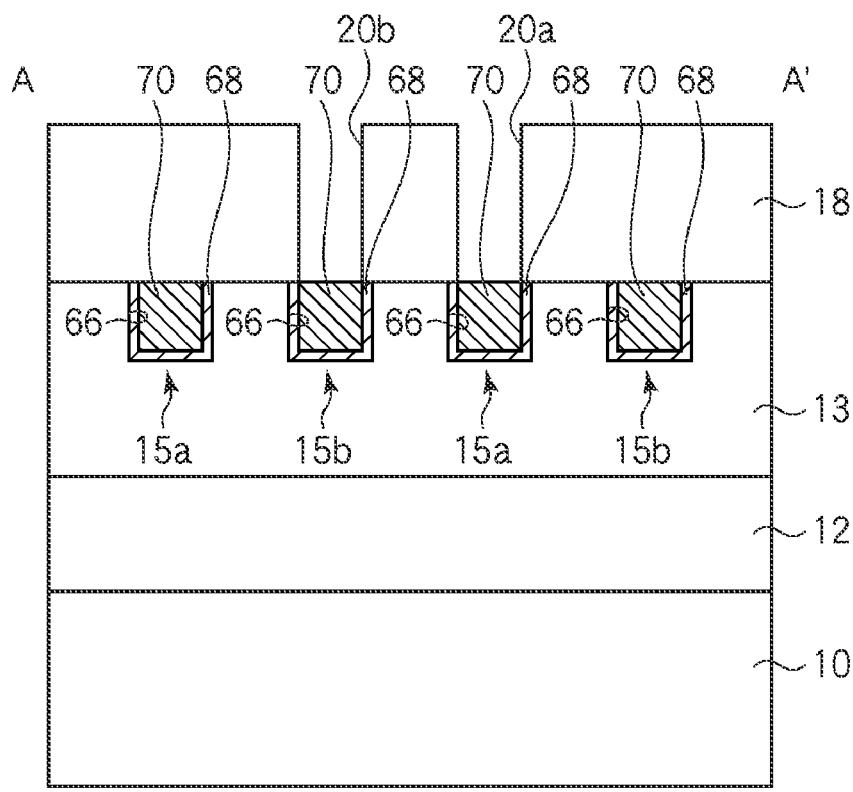

First, as illustrated in FIG. 13B, the contact holes 20a arriving at the first comb-shaped interconnection 15a and the contact holes 20b arriving at the second comb-shaped interconnection 15b are formed in the inter-layer insulation film 18.

Figure 14A:
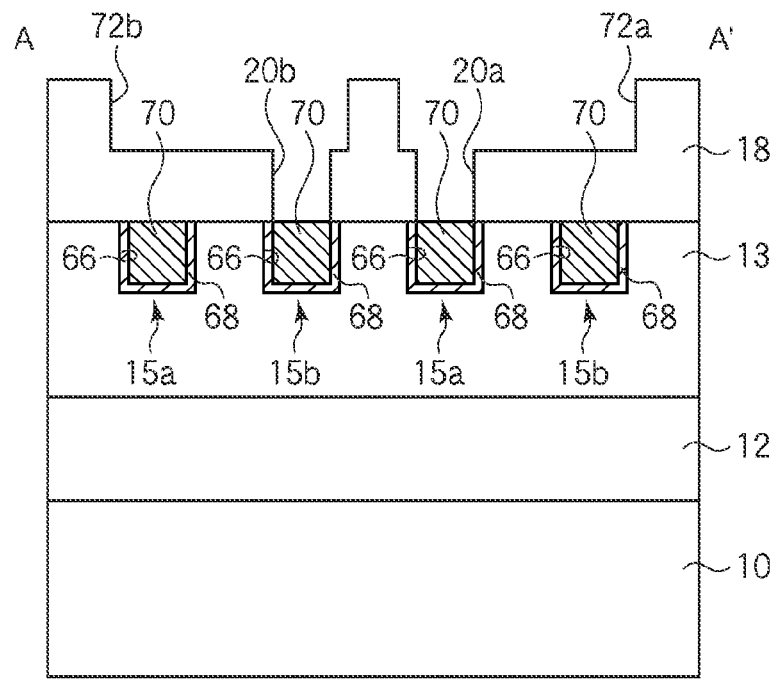

Next, as illustrated in FIG. 14A, trenches 72a, 72b for the conduction layers 24a, 24b to be buried in are formed in the inter-layer insulation film 18.

Then, on the entire surface, the barrier metal 74 of TiN or others is formed by, e.g., sputtering.

Next, on the entire surface, the seed layer (not illustrated) of Cu is formed by, e.g., sputtering.

Figure 14B:
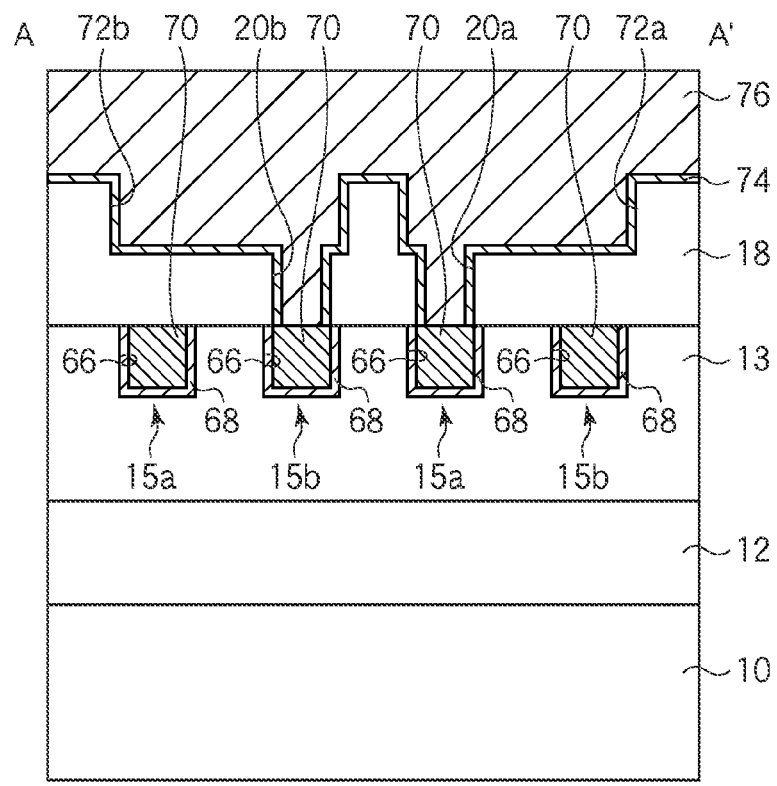
Figure 15:
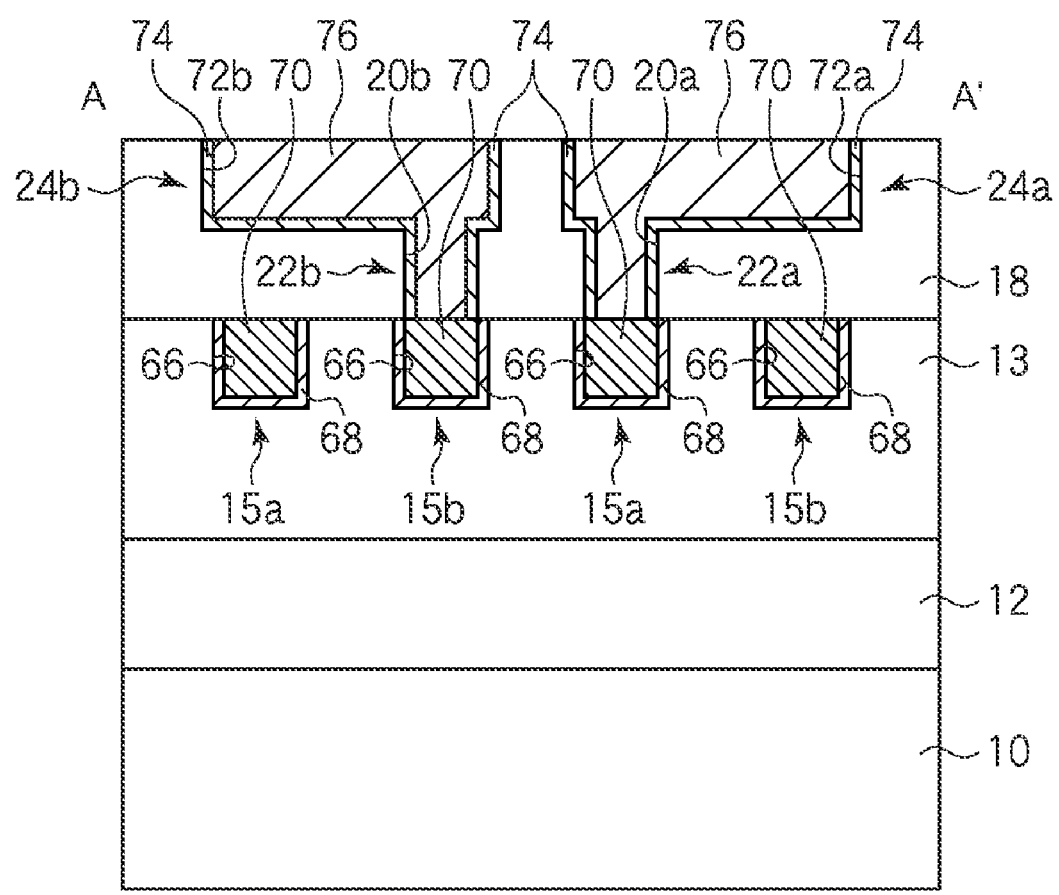

Then, on the entire surface, the conduction film 76 of Cu is formed by electroplating (see FIG. 14B).

Next, the conduction film 76, the seed layer and the barrier metal 74 are polished by CMP until the surface of the inter-layer insulation film 18 is exposed. Thus, the conductor plugs 22a of Cu and the conduction layer 24a of Cu are formed integral, and the conductor plugs 22b of Cu and the conduction layer 24b of Cu are formed integral.

As described above, the conductor plugs 22a, 22b and the conduction layers 24a, 24b may be formed dual damascene.

Figure 7A:
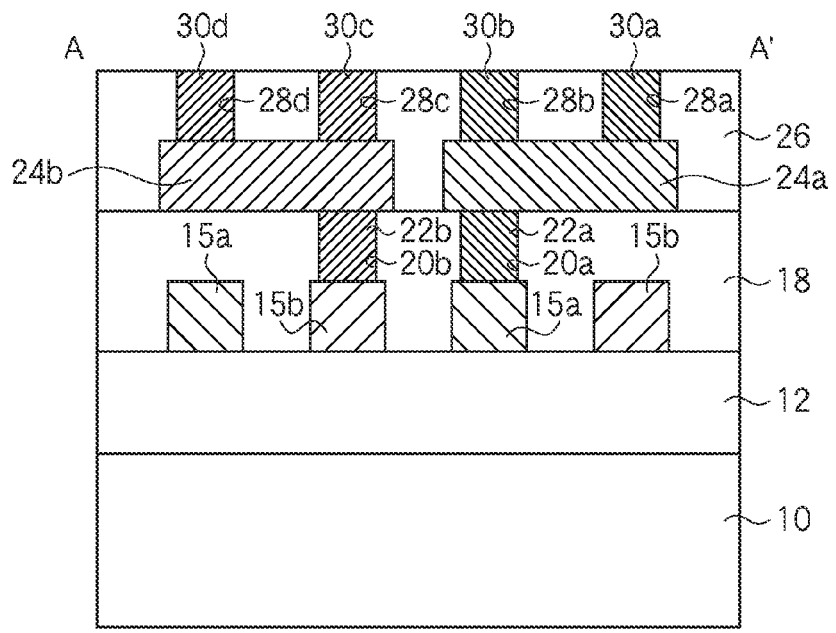
Figure 7B:
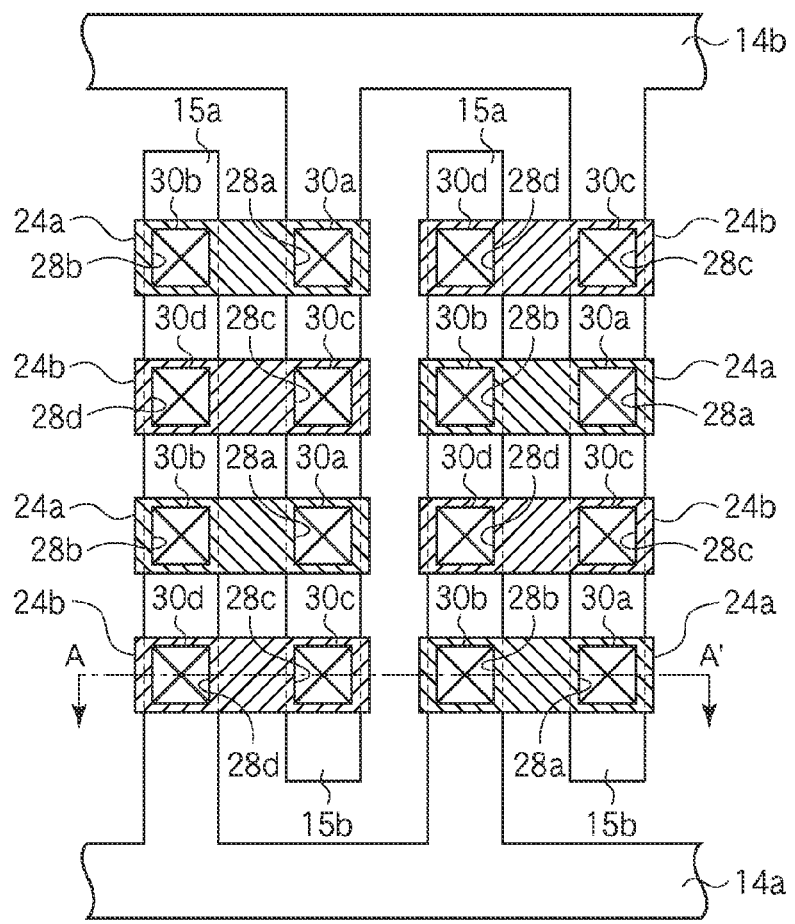
Figure 8A:
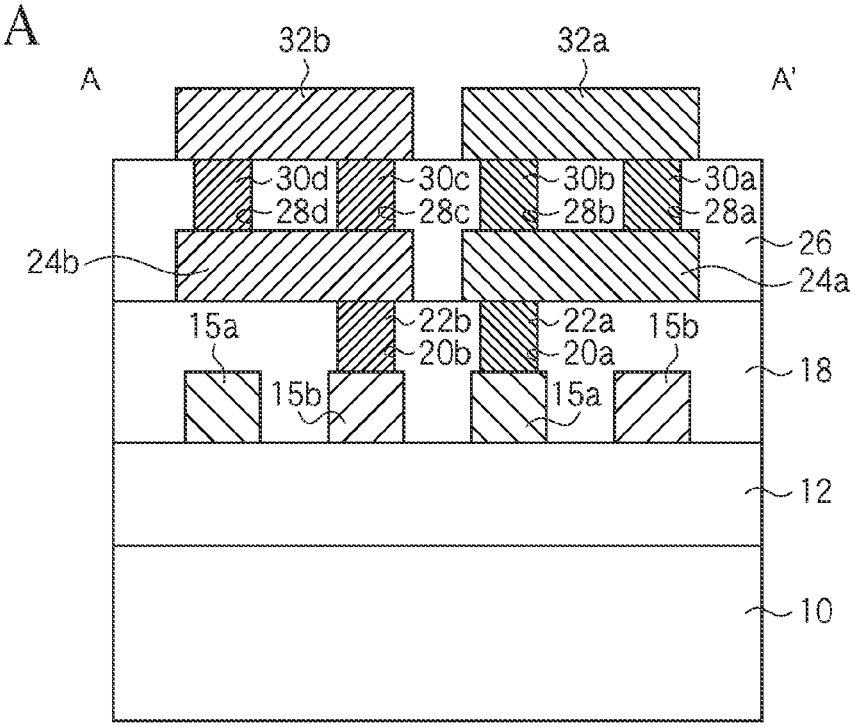
Figure 8B:
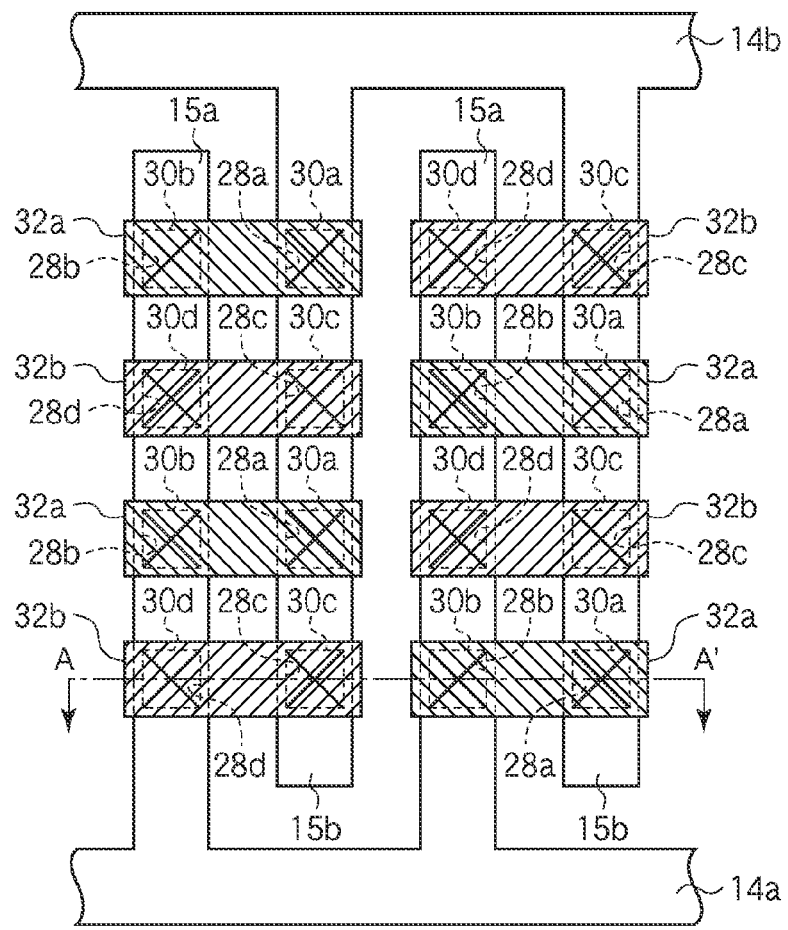
Figure 9A:
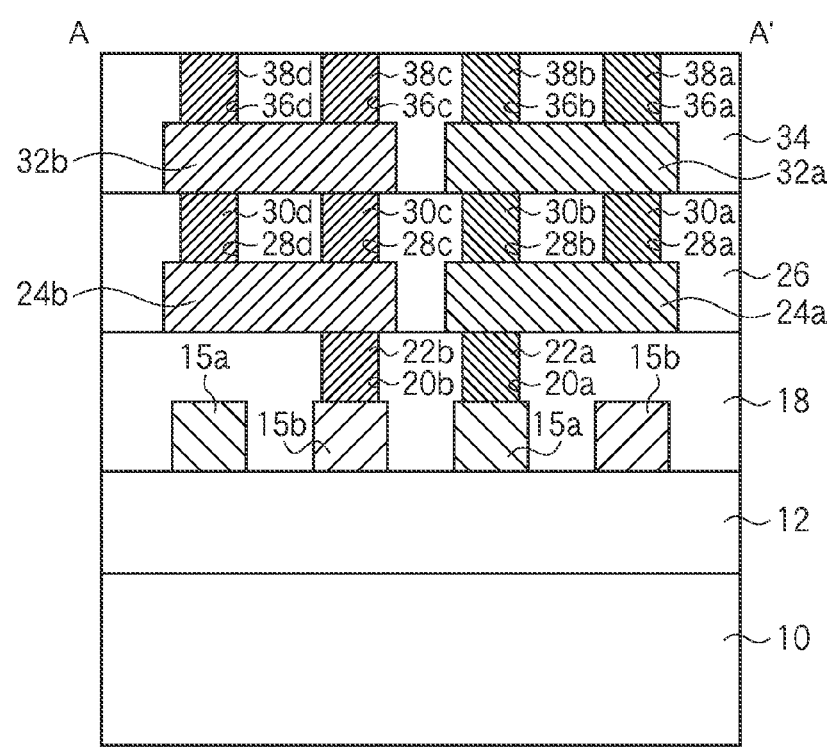
Figure 9B:
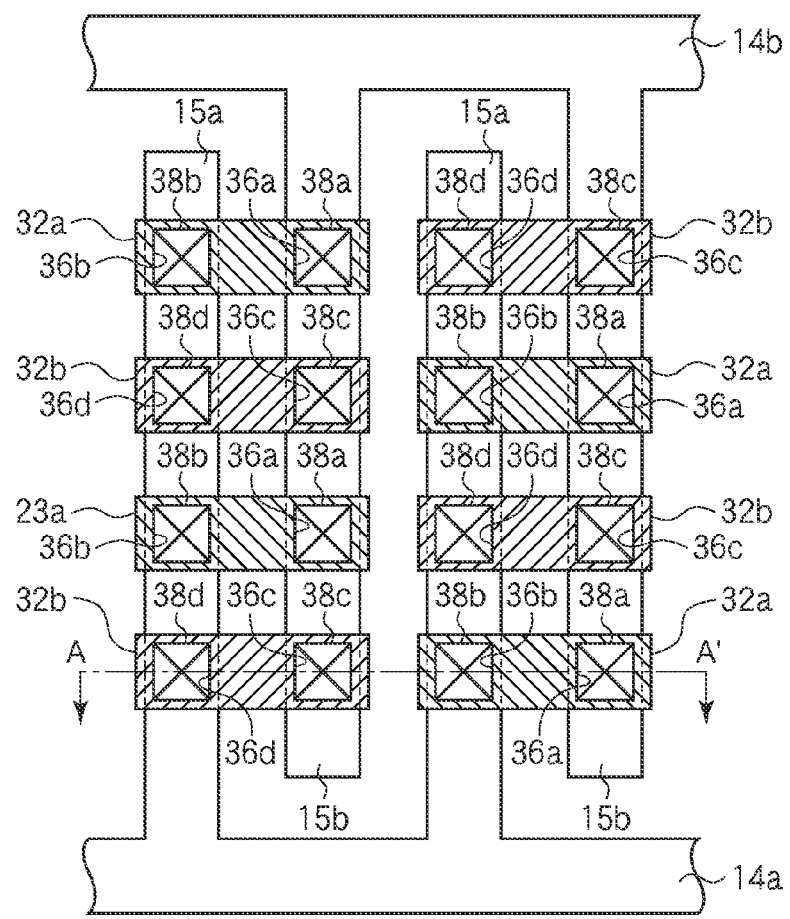

Next, as illustrated in FIGS. 7A and 7B, on the inter-layer insulation film 18 with the conduction layers 24a, 24b formed on, the inter-layer insulation film 26 of, e.g., silicon oxide film is formed on the entire surface by, e.g., CVD.

Next, by photolithography, the contact holes 28a arriving at one ends of the conduction layers 24a and the contact holes 28b arriving at the other ends of the conduction layers 24a, and the contact holes 28c arriving at one ends of the conduction layers 24b and the contact holes 28d arriving at the other ends of the conduction layers 24b are formed in the inter-layer insulation film 26.

Then, a barrier film and a tungsten film are formed on the entire surface by, e.g., CVD.

Next, the tungsten film and the barrier film are polished by, e.g., CMP until the surface of the inter-layer insulation film 26 is exposed. Thus, the conductor plugs 30a-30d of, e.g., tungsten are buried respectively in the contact holes 28a-28d.

Next, on the entire surface, a conduction film of aluminum or others of an about 200-300 nm-film thickness is formed by, e.g., sputtering.

Then, the conduction film is patterned by photolithography. Thus, the linear conduction layers 32a and the linear conduction layers 32b are formed on the inter-layer insulation film 26. These conduction layers 32a, 32b are formed alternately and, as viewed from above the semiconductor substrate 10, are arranged in a matrix as a whole (see FIGS. 8A and 8B). One ends of the linear conduction layers 32a are connected to the conductor plugs 30a, and the other ends of the linear conduction layers 32a are connected to the conductor plugs 30b. The conduction layers 32a are electrically connected to the conduction layers 24a, 24b via the conductor plugs 30a, 30b. In the present embodiment, the conduction layers 32a are each connected to the conduction layers 24a by two conductor plugs 30a, 30b, which can ensure the reliability of the connection between the conduction layers 32a and the conduction layer 24a. The conduction layers 32b are electrically connected to the conduction layers 24b via the conductor plugs 30c, 30d. In the present embodiment, the conduction layers 32b are each electrically connected to the conduction layers 24a by two conductor plugs 30c, 30d, which can ensure the connection between the conduction layers 32b and the conduction layers 24b. In the present embodiment, the opposed area of the conductor plugs 30a, 30b and the conductor plugs 30c, 30d can be made larger in comparison with the opposed area provided by connecting the conduction layers 32a and the conduction layers 24a by one conductor plugs 30a and connecting the conduction layers 32b and the conduction layers 24b by one conductor plugs 30c. Thus, according to the present embodiment, the dielectric capacitance per a unit area can be improved.

The case that the conduction layers 32a and the conduction layers 32b are formed by forming a conduction film of aluminum or others and etching the conduction film is exemplified here. However, the method of forming the conduction layers 32a, the conduction layers 32b is not limited to this. For example, it is possible that contact holes for the conductor plugs 30a-30d to be buried in and trenches for the conduction layers 32a, 32b to be buried in are formed, a conduction film of Cu is formed in the contact holes and trenches and on the inter-layer insulation film, and the conduction film is polished until the surface of the inter-layer insulation film is exposed to thereby bury the conductor plugs 30a-30d of Cu and the conduction layers 32a, 32b of Cu in the inter-layer insulation film (not illustrated). That is, the conductor plugs 30a-30d and the conduction layers 32a, 32b may be formed by dual damascene. In this case, the conductor plugs 30a, 30b of Cu and the conduction layers 32a are formed integral, and the conductor plugs 30c, 30d of Cu and the conduction layer 32b are formed integral.

Next, all over the inter-layer insulation film 26 with the conduction layers 32a, 32b formed on, the inter-layer insulation film 34 of, e.g., silicon oxide film is formed by, e.g., CVD.

Next, the contact holes 38a arriving at one ends of the conduction layers 32a, the contact holes 38b arriving at the other ends of the conduction layers 32a, the contact holes 38c arriving at one ends of the conduction layers 32b and the contact holes 38d arriving at the other ends of the conduction layers 32b are formed in the inter-layer insulation film 34 by photolithography.

Next, a barrier film and a tungsten film are formed on the entire surface by, e.g., CVD.

Then, the tungsten film and the barrier film are polished by, e.g., CMP until the surface of the inter-layer insulation film 34 is exposed. Thus, the conductor plugs 38a-38d of, e.g., tungsten are buried respectively in the contact holes 36a-36d (see FIGS. 9A and 9B).

Next, a conduction film of aluminum or others of an about 200-300 nm-film thickness is formed on the entire surface by, e.g., sputtering.

Next, the conduction film is patterned by photolithography. Thus, on the inter-layer insulation film 34, the linear conduction layers 40a of the conduction film and the linear conduction layers 40b of the conduction film are formed. These conduction layers 40a, 40b are formed alternately and, as viewed form above the semiconductor substrate 10, are arranged in a matrix as a whole. One ends of the linear conduction layers 40a are connected to the conductor plugs 38a, and the other ends of the linear conduction layers 40a are connected to the conductor plugs 38b. One ends of the linear conduction layers 40b are connected to the conductor plugs 38c, and the other ends of the linear conduction layers 40b are connected to the conductor plugs 38d.

The case that the conduction layers 40a and the conduction layers 40b are formed by forming a conduction film of aluminum or others and etching the conduction film is exemplified here. However, the method of forming the conduction layers 40a and the conduction layers 40b is not limited to this. For example, it is possible that the contact holes for the conductor plugs 38a-38d to be buried in and the trenches for the conduction layers 40a, 40b to be buried in are formed, a conduction film of Cu is formed in the contact holes and the trenches and on the inter-layer insulation film, and the conduction film is polished until the surface of the inter-layer insulation film is exposed to thereby bury the conductor plugs 38a-38d of Cu and the conduction layers 40a, 40b of Cu are buried in the inter-layer insulation film (not illustrated). That is, the conductor plugs 38a-38d and the conduction layers 32a, 32b may be formed by dual damascene. In this case, the conductor plugs 38a, 38b of Cu and the conduction layers 40a of Cu are formed integral, and the conductor plugs 38c, 38d of Cu and the conduction layers 40b of Cu are formed integral.

Next, the inter-layer insulation film 42 of, e.g., silicon oxide film is formed on the entire surface by, e.g., CVD.

Thus, the semiconductor device according to the present embodiment is manufactured (see FIGS. 10 and 11).

According to the present embodiment, the conductor plugs 22a, the conduction layers 24a, the conductor plugs 30a, 30b, the conduction layers 32a, the conductor plugs 38a, 38b and the conduction layers 40a are suitably stacked to thereby form the first electrodes 16a, and the conductor plugs 22b, the conduction layers 24b, the conductor plugs 30c, 30d, the conduction layers 32b, conductor plugs 38c, 38d and the conduction layers 40b are suitably stacked to thereby form the second electrodes 16b. Thus, according to the present embodiment, no special manufacturing process, special interconnection rules, etc. are necessary. Thus, according to the present embodiment, the capacitor element and the semiconductor device including the capacitor element can be manufactured by the usual manufacturing process.

(Modification)

Figure 16:
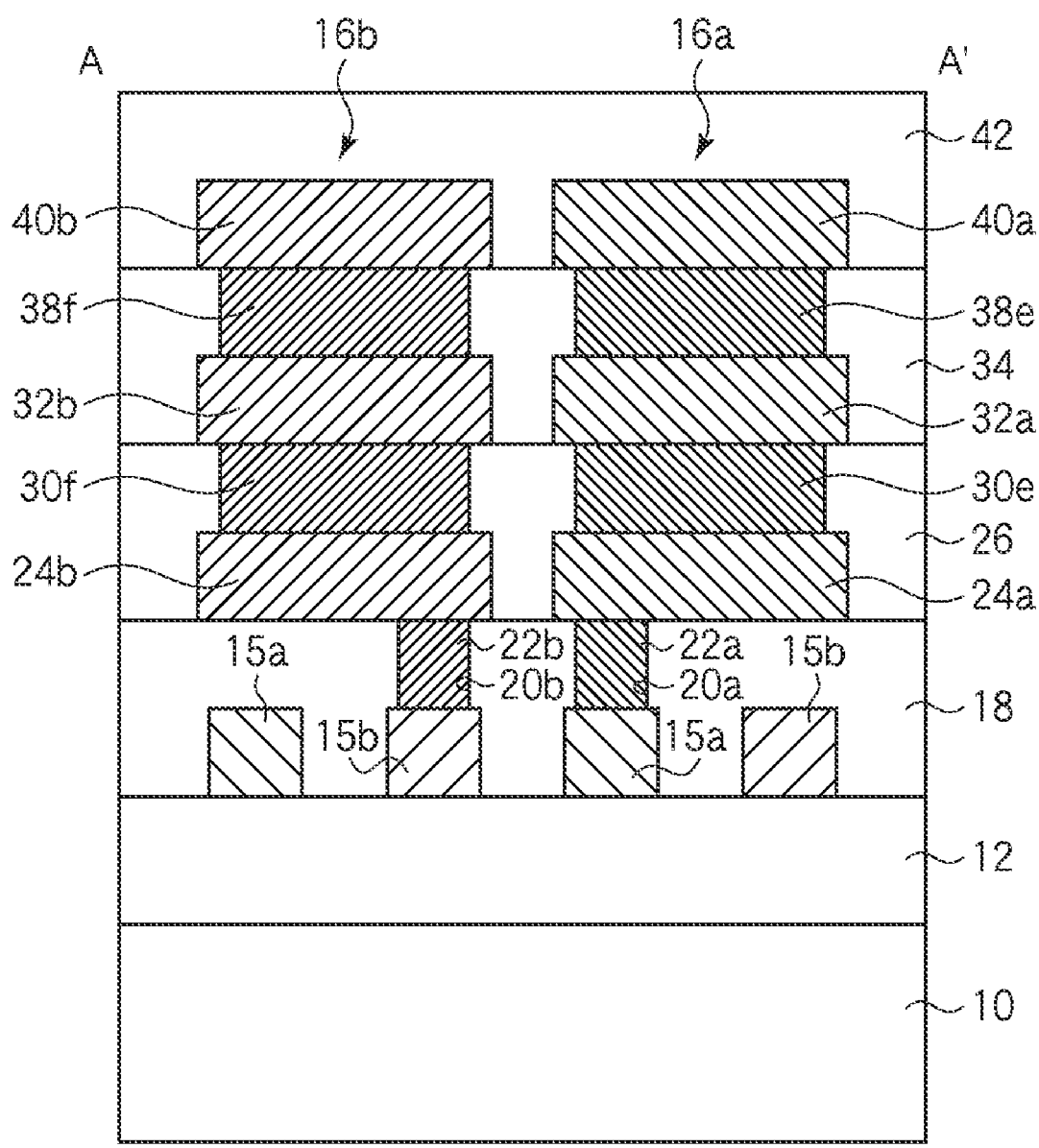
FIG. 16 is a sectional view of the semiconductor device according to a modification of the first embodiment.

Next, The capacitor element according to one example of modifications of the present embodiment and the semiconductor device including the capacitor element will be explained with reference to FIG. 16. FIG. 16 is a sectional view of the semiconductor device according to the present modification.

The capacitor element according to the present embodiment and the semiconductor device including the capacitor element is characterized mainly in that the linear conduction layers 24a, 24b and the linear conduction layers 32a, 32b are respectively connected by linear conduction layers 30e, 30f buried in the inter-layer insulation film 26, and the linear conduction layers 32a, 32b and the linear conduction layers 40a, 40b are respectively connected by linear conduction layers 38e, 38f buried in the inter-layer insulation film 34.

As described above, the linear conduction layers 24a, 24b and the linear conduction layers 32a, 32b may be respectively connected by the linear conduction layers 30e, 30f without being respectively connected by the conductor plugs 30a-30d. The linear conduction layers 32a, 32b and the linear conduction layers 40a, 40b may be respectively connected by the linear conduction layers 38e, 38f without being respectively connected by the conductor plugs 38a-38d.

[b] Second Embodiment

The capacitor element according to a second embodiment and the semiconductor device including the capacitor element, and their manufacturing method will be explained with reference to FIGS. 17 to 31. The same members of the capacitor element and the semiconductor device, etc. according to the first embodiment illustrated in FIGS. 1 to 16 are represented by the same reference numbers not to repeat or to simplify their explanation.

(Capacitor Element and Semiconductor Device)

Figure 17:
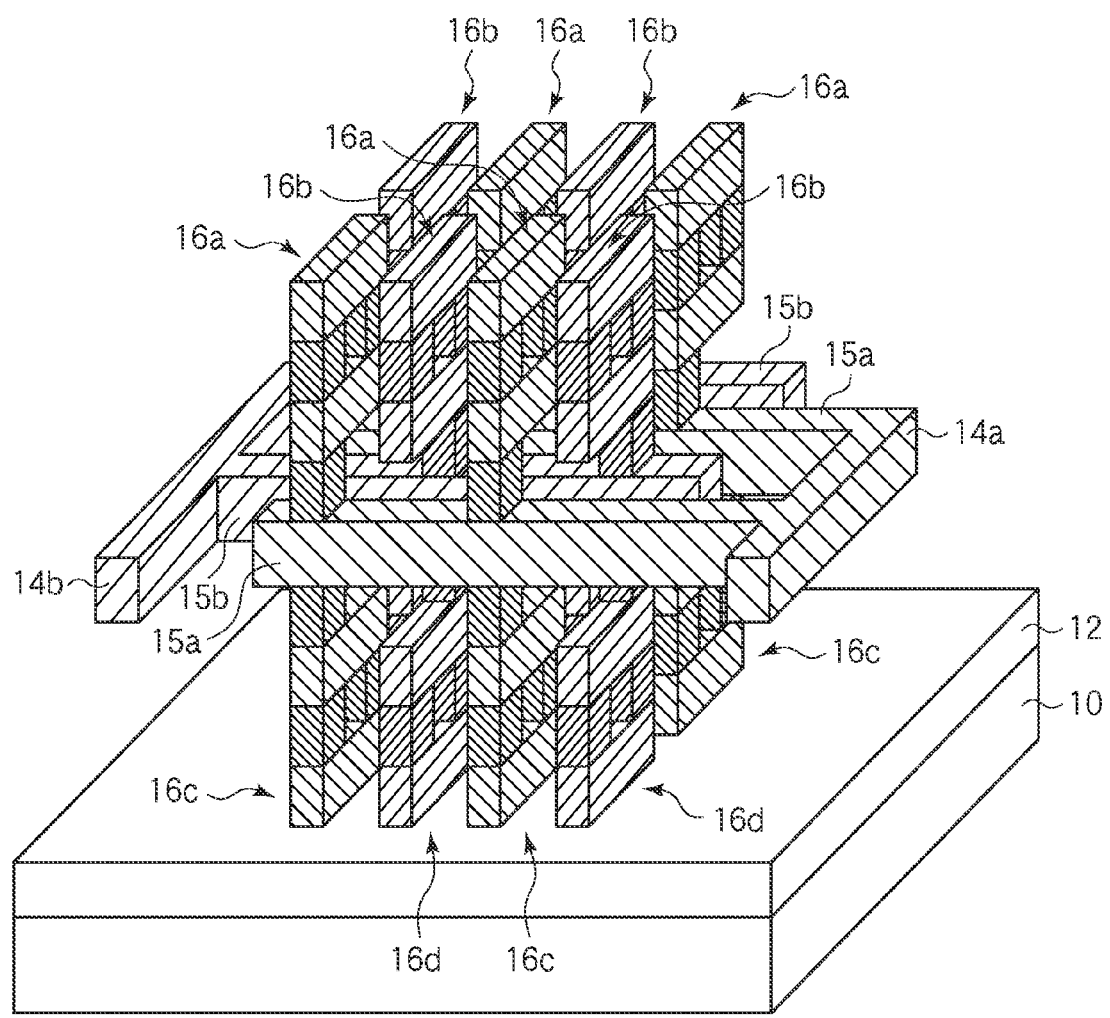
FIG. 17 is a perspective view of a semiconductor device according to a second embodiment.
Figure 18:
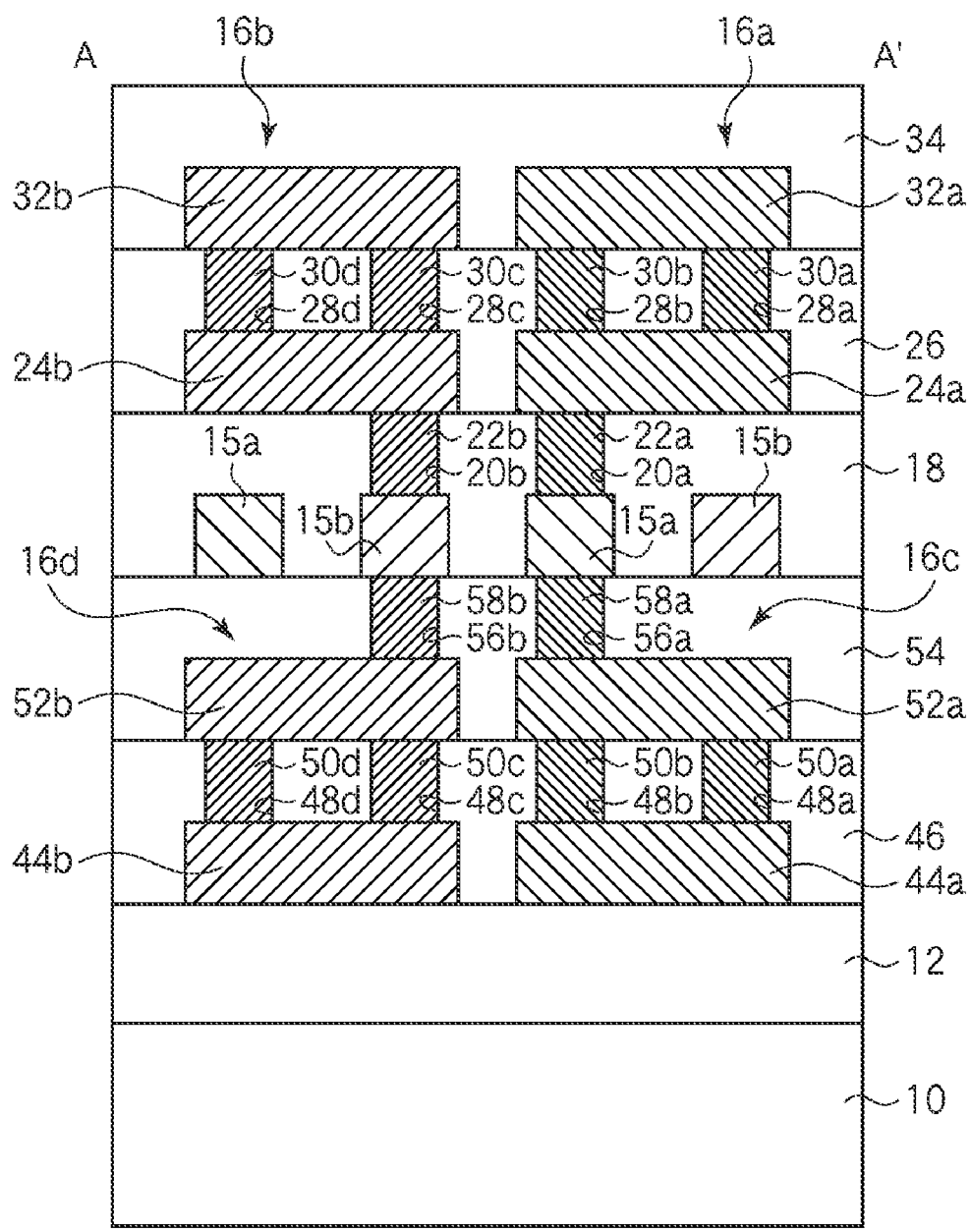
FIG. 18 is a sectional view of the semiconductor device according to the second embodiment.
Figure 19:
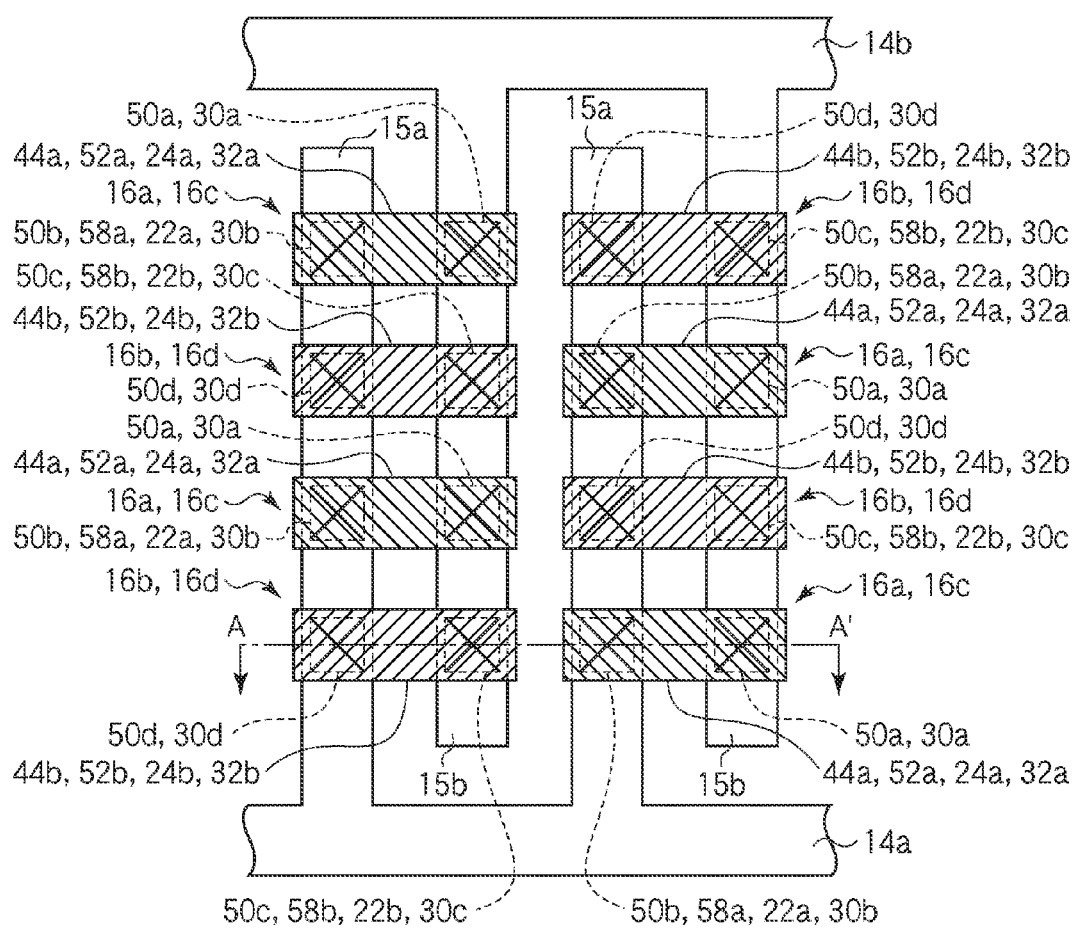
FIG. 19 is a plan view of the semiconductor device according to the second embodiment.
Figure 20A:
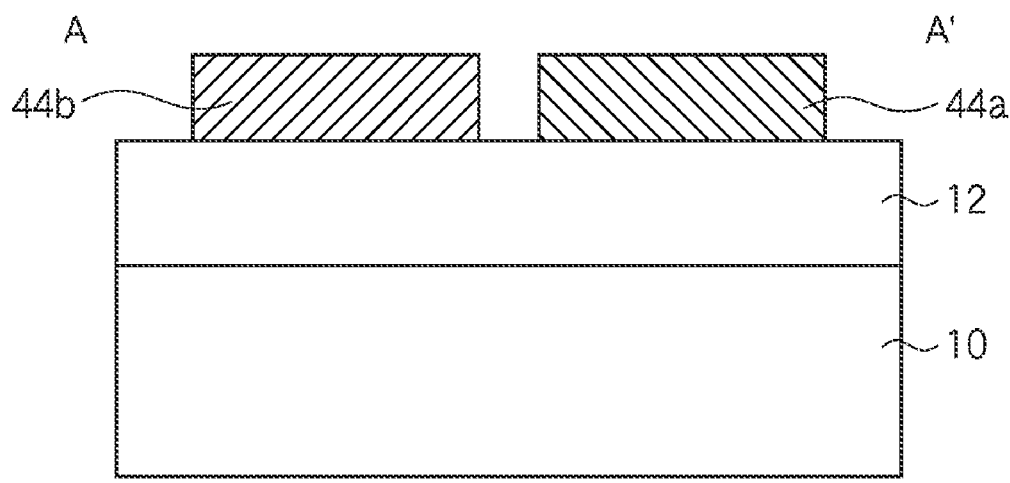
FIGS. 20A to 31 are views of the semiconductor device according to the second embodiment in the steps of the method of manufacturing the semiconductor device, which illustrate the method.
Figure 20B:
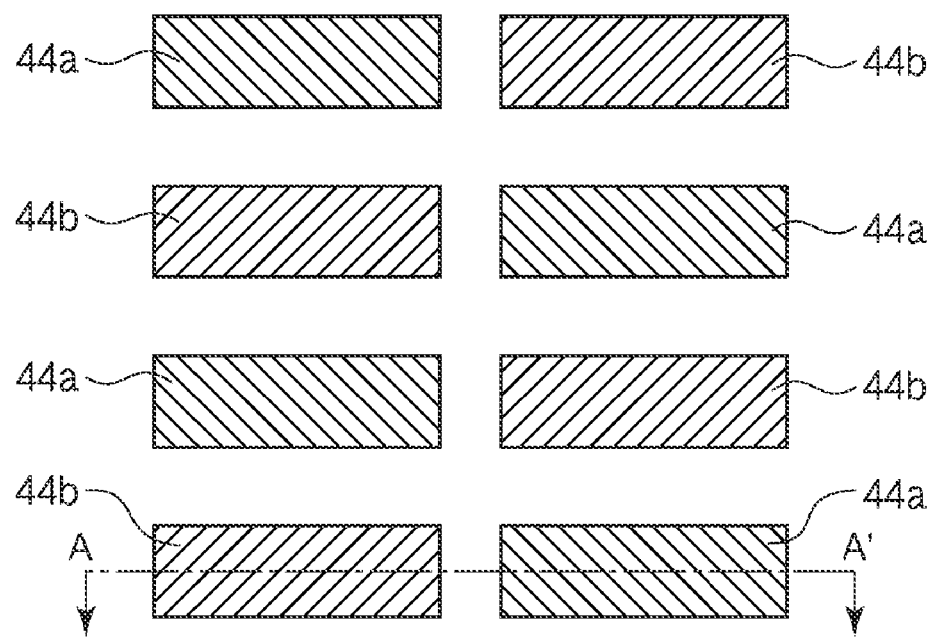

First, the capacitor element according to the present embodiment and the semiconductor device including the capacitor element will be explained with reference to FIGS. 17 to 19. FIG. 17 is a perspective view of the semiconductor device according to the present embodiment. In FIG. 17, the inter-layer insulation films 18, 26, 34 with the first electrodes 16a and the second electrodes 16b buried in, and the inter-layer insulation films 46, with the third electrodes 16c and the fourth electrodes 16d buried in are omitted. FIG. 18 is a sectional view of the semiconductor device according to the present embodiment. FIG. 19 is a plan view of the semiconductor device according to the present embodiment. FIG. 18 is the section along the A-A' line in FIG. 19.

The semiconductor device according to the present embodiment is characterized mainly in that below the layer with the first comb-shaped interconnection 14a and the second comb-shaped interconnection 14b formed on, third electrodes 16c electrically connected to the first comb-shaped interconnection 14a and fourth electrodes 16d electrically connected to the second comb-shaped interconnection 14b are formed.

As illustrated in FIG. 18, on the semiconductor substrate 10 of, e.g., a silicon substrate, the inter-layer insulation film 12 of, e.g., silicon oxide film is formed.

On the semiconductor substrate 10 with the inter-layer insulation film 12 formed on, a plurality of third electrodes 16c and a plurality of the fourth electrodes 16d are formed, projected perpendicularly to the surface of the semiconductor substrate 10.

The plural third electrodes 16c and the plural fourth electrodes 16d are alternately formed and, as viewed form above the semiconductor substrate 10, are arrange in a matrix as a whole. The plural third electrodes 16c and the plural fourth electrodes 16d are buried by the inter-layer insulation films 46, 54.

The inter-layer insulation films 46, 54 between the third electrodes 16a and the fourth electrodes 16b function as the dielectric layers of the capacitor element.

As will be detailed below, the third electrodes 16a are formed of the linear conduction layers 44a, the conductor plugs 50a, 50b, the linear conduction layers 52a and the conductor plugs 58a sequentially stacked.

As will be detailed below, the fourth electrodes 16b are formed of the linear conduction layers 44b, the conductor plugs 50c, 50d, the linear conduction layers 52b and the conductor plugs 58b sequentially stacked.

On the inter-layer insulation film 12, the linear conduction layers 44a, 44b are formed. The conduction layers 44a, 44b are alternately formed and, as viewed from the semiconductor substrate 10, are arranged in a matrix as a whole.

On the inter-layer insulation film 12 with linear conduction layers 44a, 44b formed on, the inter-layer insulation film 46 of, e.g., silicon oxide film is formed.

In the inter-layer insulation film 46, the contact holes 48a, 48b respectively arriving at the linear conduction layers 44a and the contact holes 48c, 48d respectively arriving at the linear conduction layers 44b are formed.

The conductor plugs 50a, 50b are buried respectively in the contact holes 48a, 48b. The conductor plugs 50a are connected to one ends of the linear conduction layers 44a, and the conductor plugs 50b are connected to the other ends of the linear conduction layers 44a.

In the contact holes 48c, 48d, the conductor plugs 50c, 50d are respectively buried. The conductor plugs 50c are connected to one ends of the linear conduction layers 44b, and the conductor plugs 50d are connected to the other ends of the linear conduction layer 44b.

On the inter-layer insulation film 46 with the conductor plugs 50a-50d buried in, the linear conduction layers 52a, 52b are formed.

On the inter-layer insulation film 46 with the linear conduction layers 52a, 52b formed on, the inter-layer insulation film 54 of, e.g., silicon oxide film is formed.

In the inter-layer insulation film 54, the contact holes 56a arriving at one ends of the linear conduction layers 52a and the contact holes 56b arriving at one ends of the linear conduction layers 52b are formed.

In the contact holes 56a, 56b, the conductor plugs 58a, 58b are respectively buried. The conductor plugs 58a are connected to one ends of the conduction layers 52a, and the conductor plugs 58b are connected to one ends of the linear conduction layers 52b.

On the inter-layer insulation film 54 with the conductor plugs 58a, 58b buried in, the first linear comb-shaped interconnection 14a and the second comb-shaped interconnection 14b are formed (see FIG. 19). The first comb-shaped interconnection 14a and the second comb-shaped interconnection 14b are formed on the same layer. The plural comb teeth 15a of the first comb-shaped interconnection 14a and the plural comb teeth 15b of the second comb-shaped interconnection 14b are formed alternately. The tops of the third electrodes 16c are connected to the first comb-shaped interconnection 14a. More specifically, the tops of the third electrodes 16c are connected to the comb teeth 15a of the first comb-shaped interconnection 14a. The tops of the fourth electrodes 16d are connected to the second comb-shaped interconnection 14b. More specifically, the tops of the fourth electrodes 16d are connected to the comb teeth 15b of the second comb-shaped interconnection 14b. The first comb-shaped interconnection 14a is connected to, e.g., a first potential. The second comb-shaped interconnection 14b is connected to, e.g., a second potential different from the first potential. The first potential is, e.g., a power supply potential. The second potential is, e.g., the ground potential.

On the inter-layer insulation film 54 with the first comb-shaped interconnection 14a and the second comb-shaped interconnection 14b formed on, the plural first electrodes 16a and the plural second electrodes 16b are formed, projected perpendicularly to the surface of the semiconductor substrate 10. The plural first electrodes 16a and the plural second electrodes 16b are alternately formed and, as viewed from above the semiconductor substrate 10, are arranged in a matrix as a whole.

As will be detailed below, the first electrodes 16a are formed of the conductor plugs 22a, the linear conduction layers 24a, the conductor plugs 30a, 30b and the linear conduction layer 32a sequentially stacked.

As will be detailed below, the second electrodes 16b are formed of the conductor plugs 22b, the linear conduction layers 24b, the conductor plugs 30c, 30d and the linear conduction layer 32b sequentially stacked.

On the inter-layer insulation film 54 with the first comb-shaped interconnection 14a and the comb-shaped interconnection 14b formed on, the inter-layer insulation film 18 of, e.g. silicon oxide film is formed.

In the inter-layer insulation film 18, the contact holes 20a arriving at the comb teeth 15a of the first comb-shaped interconnection 14a and the contact holes 20b arriving at the comb teeth 15b of the second comb-shaped interconnection 14b are formed.

In the contact holes 20a, 20b, the conductor plugs 22a, 22b are respectively buried.

On the inter-layer insulation film 18 with the conductor plugs 22a, 22b buried in, the linear conduction layers 24a, 24b are formed. The linear conduction layers 24a are connected to the conductor plugs 22a, and the linear conduction layers 24b are connected to the conductor plugs 22b.

On the inter-layer insulation film 18 with the linear conduction layers 24a, 24b formed on, the inter-layer insulation film 26 of, e.g., silicon oxide film is formed.

In the inter-layer insulation film 26, the contact holes 28a, 28b respectively arriving at the linear conduction layers 24a and the contact holes 28c, 28d respectively arriving at the linear conduction layers 24b are formed.

In the contact holes 28a, 28b, the conductor plugs 30a, 30b are respectively buried. The conductor plugs 30a are connected to one ends of the linear conduction layers 24a, and the conductor plugs 30b are connected to the other ends of the linear conduction layers 24a.

In the contact holes 28c, 28d, the conductor plugs 30c, 30d are respectively buried. The conductor plugs 30c are connected to one ends of the linear conduction layers 24b, and the conductor plugs 30d are connected to the other ends of the linear conduction layer 24b.

On the inter-layer insulation film 26 with the conductor plugs 30a-30d buried in, the linear conduction layers 32a, 32b are formed.

The linear conduction layers 32a have one ends connected to one ends of the linear conduction layers 24a via the conductor plugs 30a. The linear conduction layers 32a have the other ends connected to the linear conduction layers 24a via the conductor plugs 30b.

The linear conduction layers 32b have one ends connected to one ends of the linear conduction layers 24b via the conductor plugs 30c. The linear conduction layers 32b have the other ends connected to the other ends of the linear conduction layers 24b via the conductor plugs 30d.

On the inter-layer insulation film 26 with the linear conduction layers 32a, 32b formed on, the inter-layer insulation film 34 of, e.g., silicon oxide film is formed.

Thus, the capacitor element according to the present embodiment and the semiconductor device including the capacitor element are constituted.

According to the present embodiment, the first electrodes 16a and the third electrodes 16c connected to the first potential are formed respectively above and below the first comb-shaped interconnection 14a, and the second electrodes 16b and the fourth electrodes 16d connected to the second potential are formed respectively above and below the second comb-shaped interconnection 14b. Thus, according to the present embodiment, the electric resistance from the first comb-shaped interconnection 14a to the terminals of the first electrodes 16a, the electric resistance from the first comb-shaped interconnection 14a to the terminals of the third electrodes 16c, the electric resistance from the second comb-shaped interconnection 14b to the terminals of the second electrodes 16b, and the electric resistance from the second comb-shaped interconnection 14b to the terminals of the fourth electrodes 16d can be respectively small, whereby resultantly the capacitor element can have good frequency characteristics.

(Manufacturing Method of Capacitor Element and Semiconductor Device)

Figure 26:
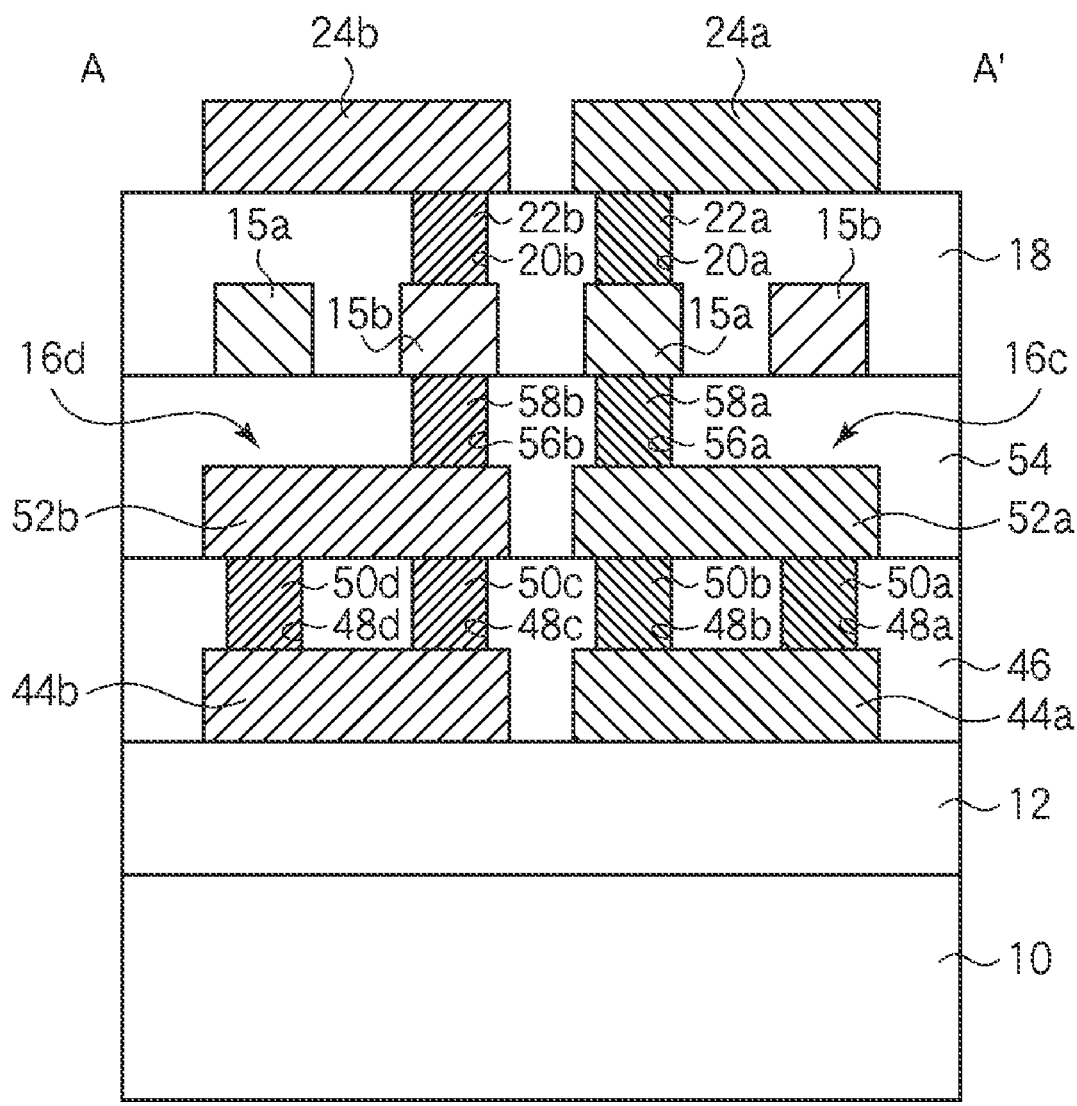
Figure 27:
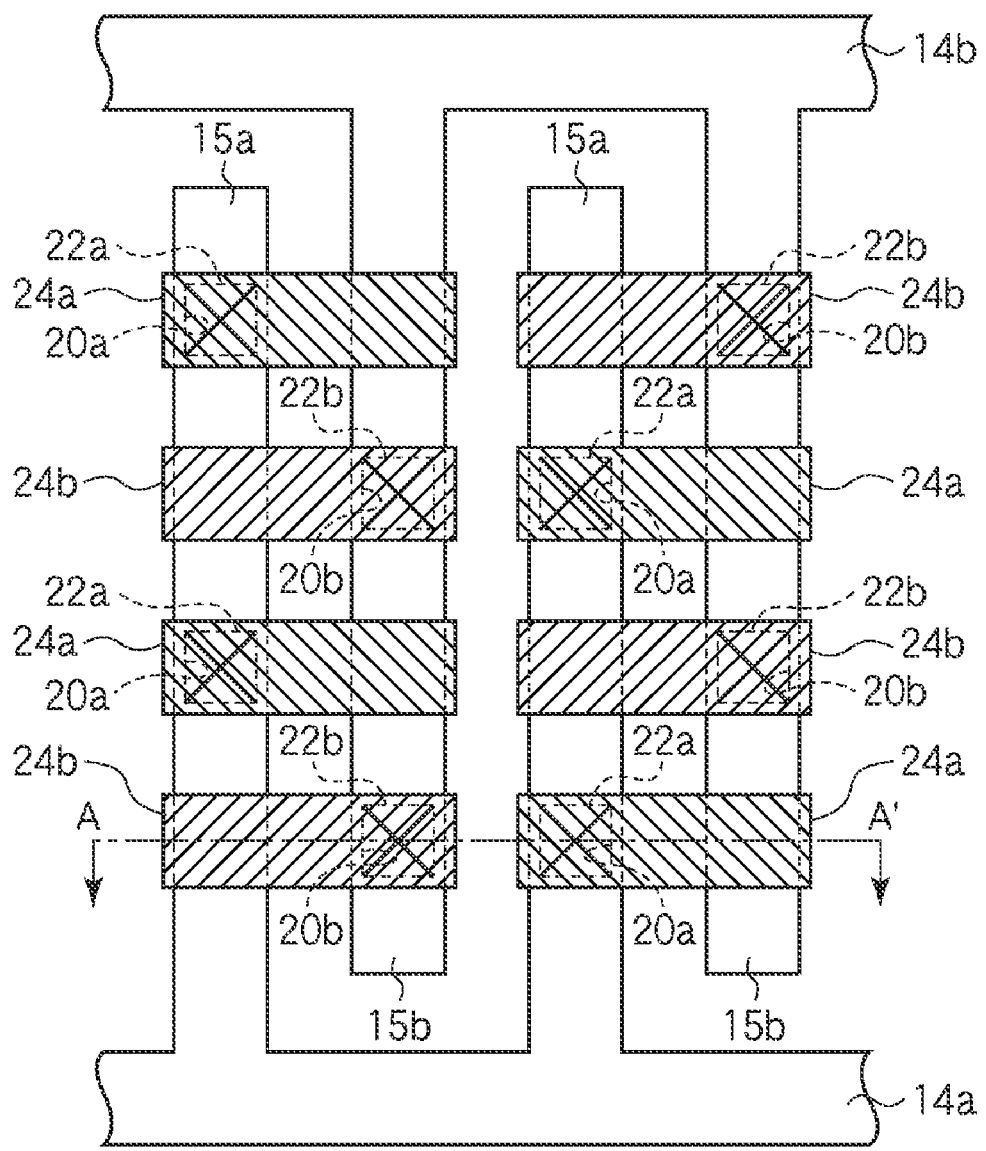
Figure 28:
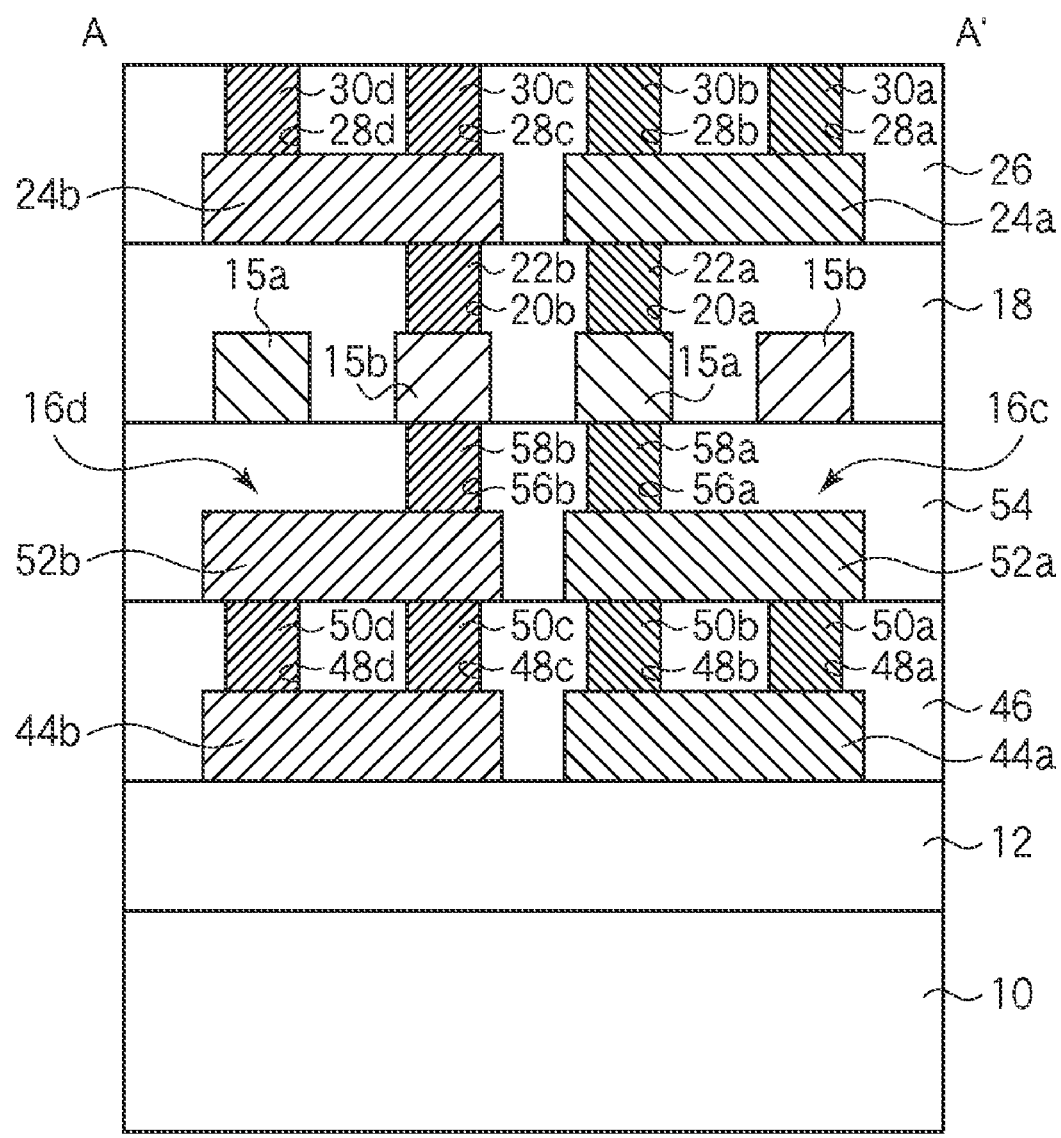
Figure 29:
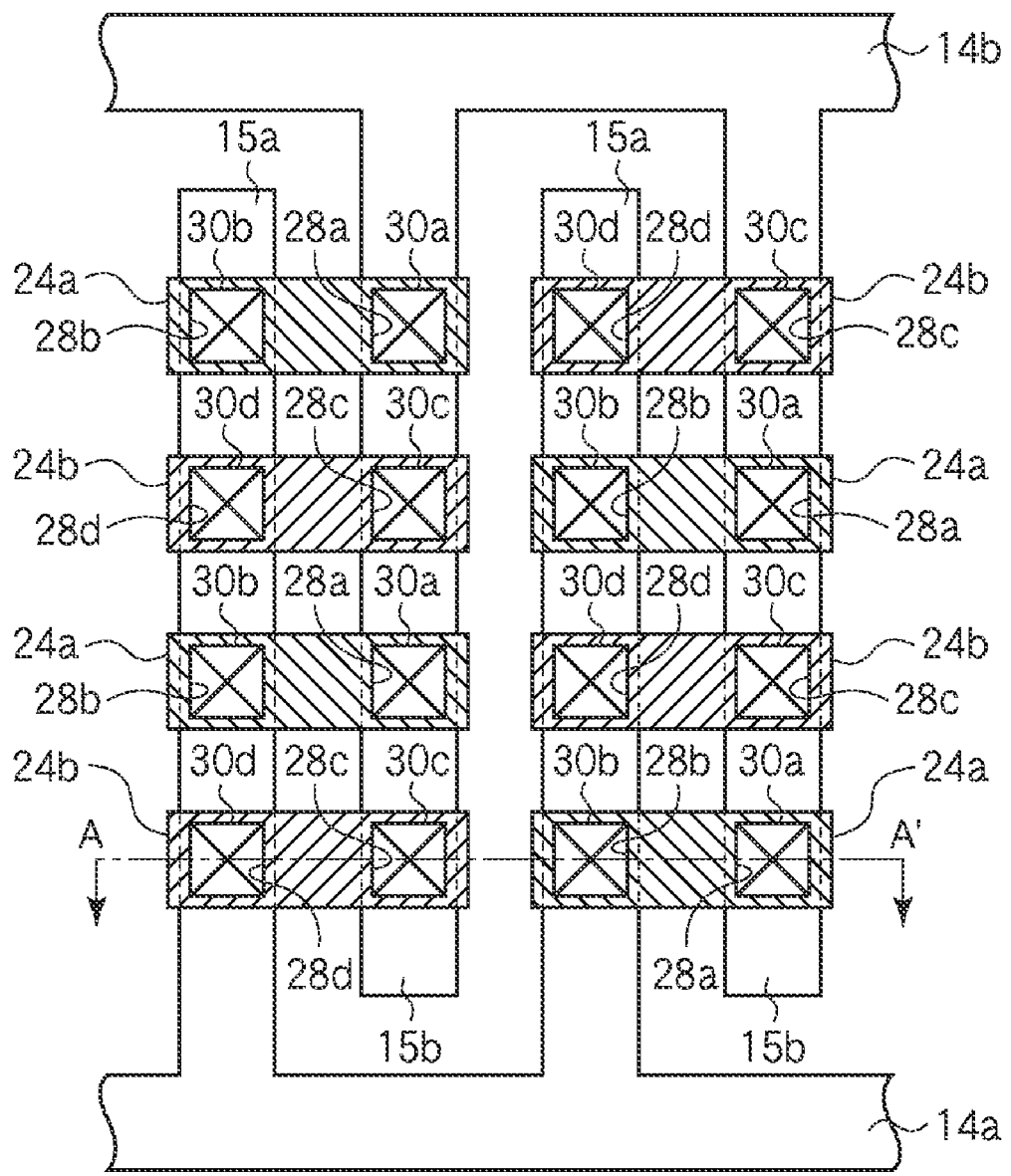
Figure 30:
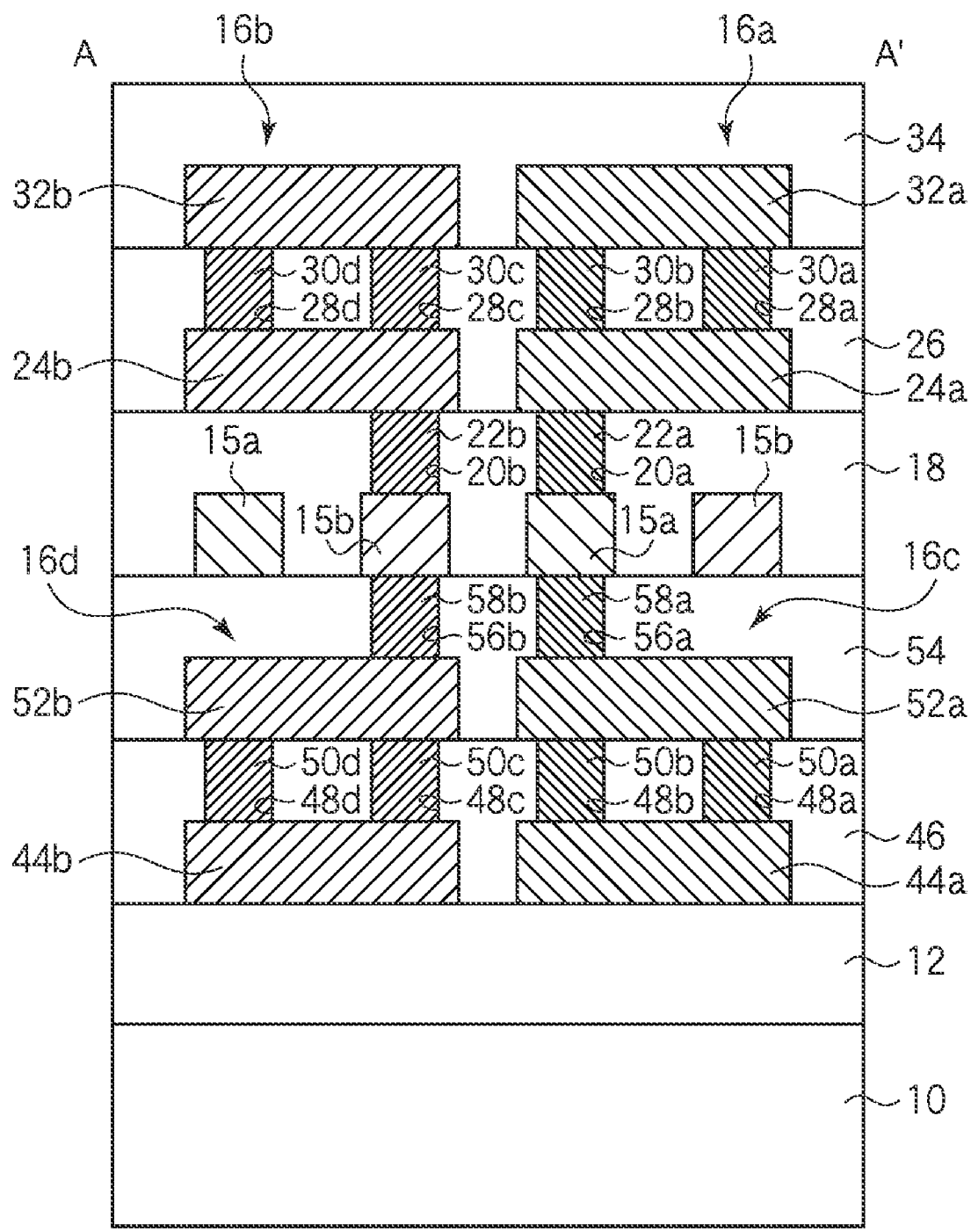
Figure 31:
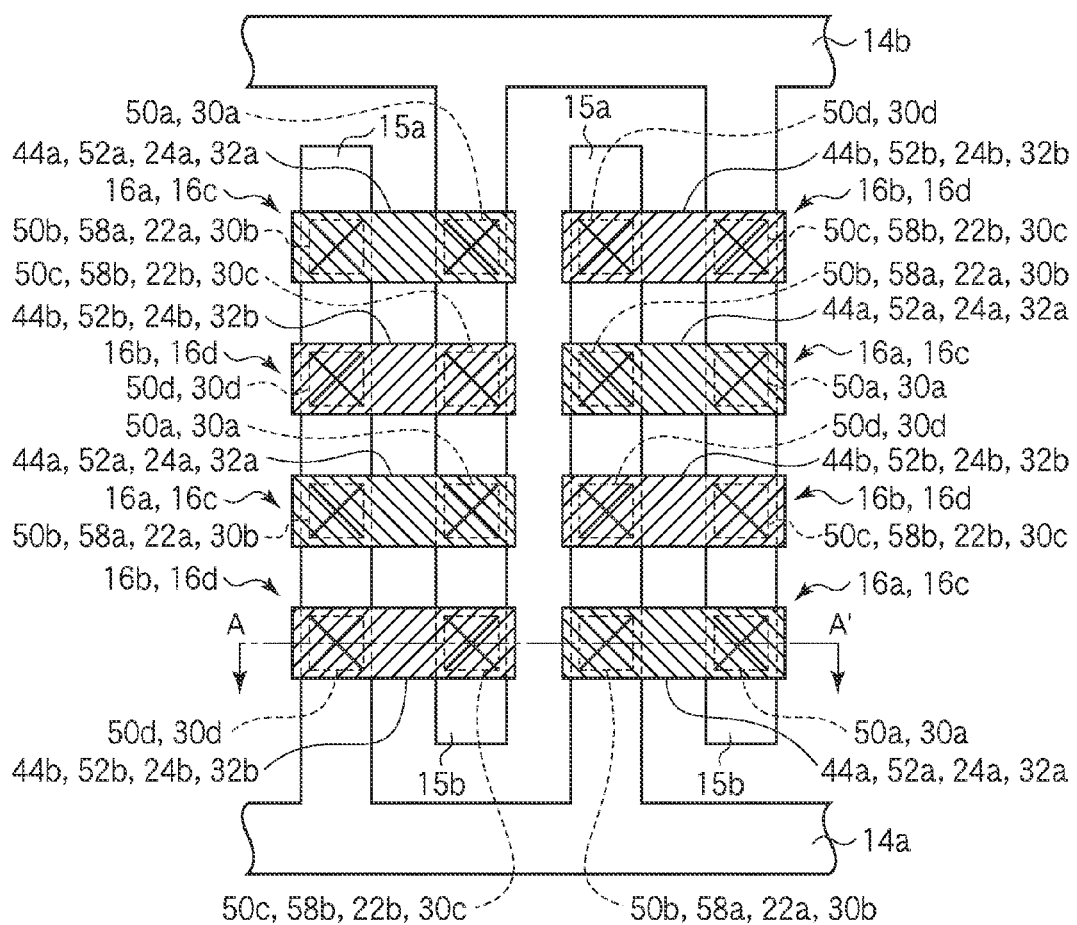

Next, the method of manufacturing the capacitor element according to the present embodiment and the semiconductor device including the capacitor element will be explained with reference to FIGS. 20A to 31. FIGS. 20A to 31 views of the semiconductor device according to the present embodiment in the steps of the method of manufacturing the semiconductor device. FIG. 20A, FIG. 21A, FIG. 22A, FIG. 23A, FIG. 24A and FIG. 25A are sectional views respectively along the A-A' line in FIG. 20B, FIG. 21B, FIG. 22B, FIG. 23B, FIG. 24B and FIG. 25B. FIG. 26 is a sectional view, and FIG. 27 is a plan view. FIG. 26 is the sectional view along the A-A' line in FIG. 27. FIG. 28 is a sectional view, and FIG. 29 is a plan view. FIG. 28 is the sectional view along the A-A' line in FIG. 29. FIG. 30 is a sectional view, and FIG. 31 is a plan view. FIG. 30 is the sectional view along the A-A' in FIG. 31.

First, on the semiconductor substrate 10 of, e.g., a silicon substrate, the inter-layer insulation film 12 of, e.g., silicon oxide film is formed.

Next, on the entire surface, a conduction film of aluminum or others of an about 200-300 nm-film thickness is formed by, e.g., sputtering.

Then, the conduction film is patterned by photolithography. Thus, on the inter-layer insulation film 12, the linear conduction layers 44a, 44b are formed. The conduction layers 44a, 44b are alternately formed and, as viewed from above the semiconductor substrate 10, are arranged in a matrix as a whole (see FIGS. 20A and 20B).

The case that the conduction layers 44a, 44b are formed by forming a conduction film of aluminum or others and etching the conduction film is exemplified here. However, the method forming the conduction layers 44a, 44b is not limited to this. It is possible that trenches are formed in the inter-layer insulation film, a conduction film of Cu is formed in the trenches and on the inter-layer insulation film, and the conduction film is polished until the surface of the inter-layer insulation film is exposed to thereby bury the conduction layers 44a of Cu and the conduction layers 44b of Cu in the inter-layer insulation film (not illustrated). That is, the conduction layers 44a, the conduction layers 44b may be buried in the inter-layer insulation film by single damascene.

Next, the inter-layer insulation film 46 of, e.g., silicon oxide film is formed on the entire surface by, e.g., CVD.

Figure 21A:
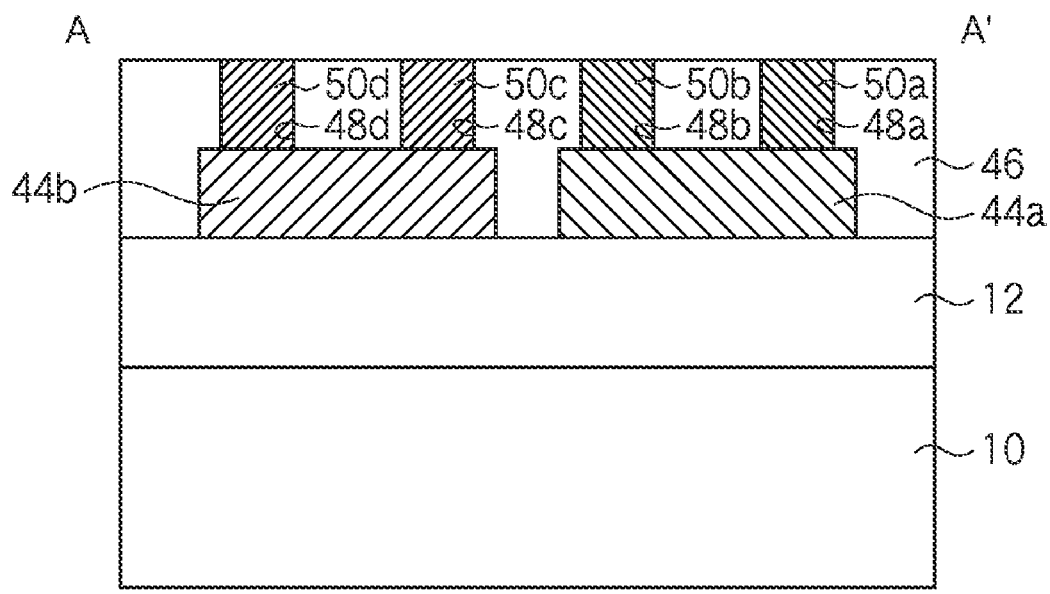
Figure 21B:
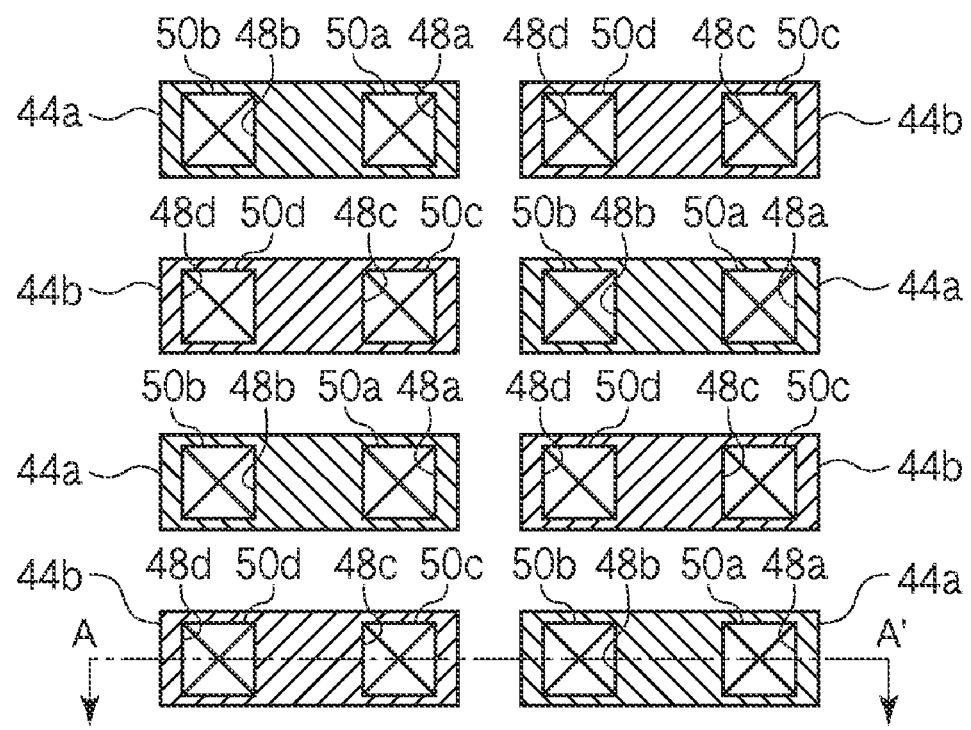
Figure 22A:
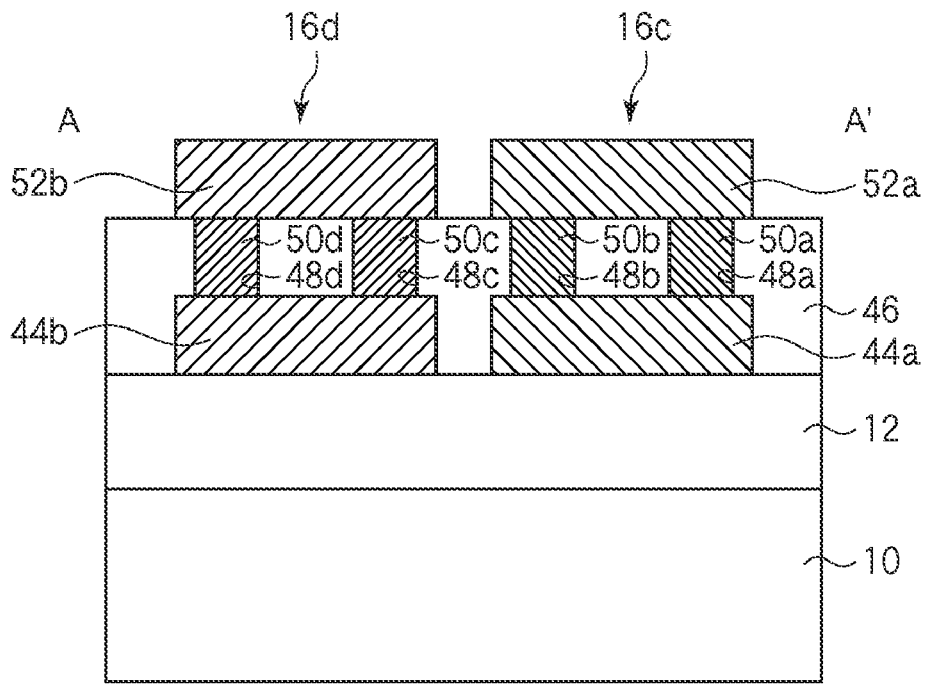
Figure 22B:
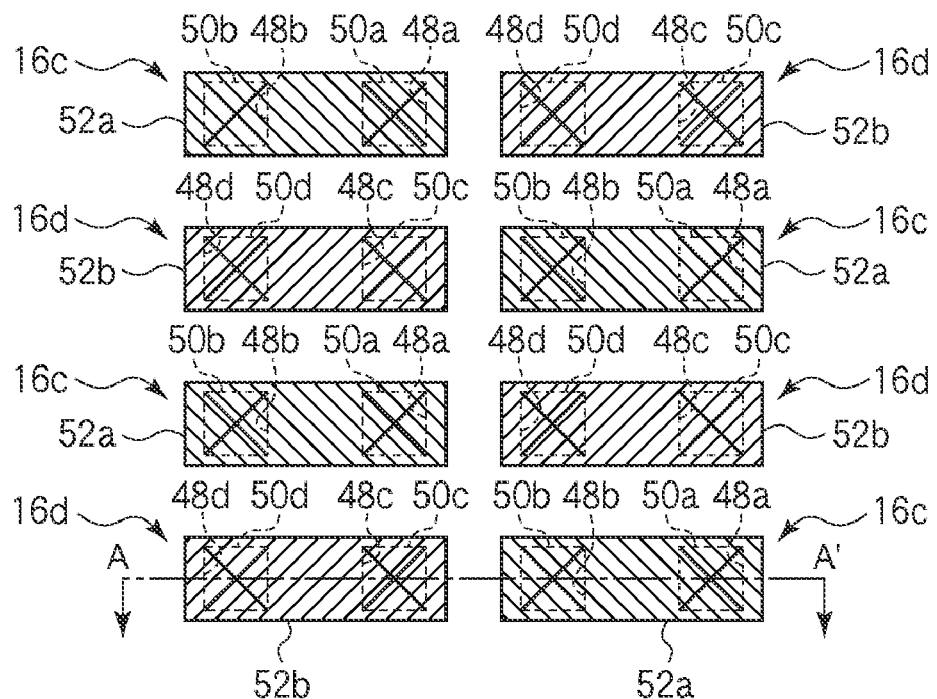
Figure 23A:
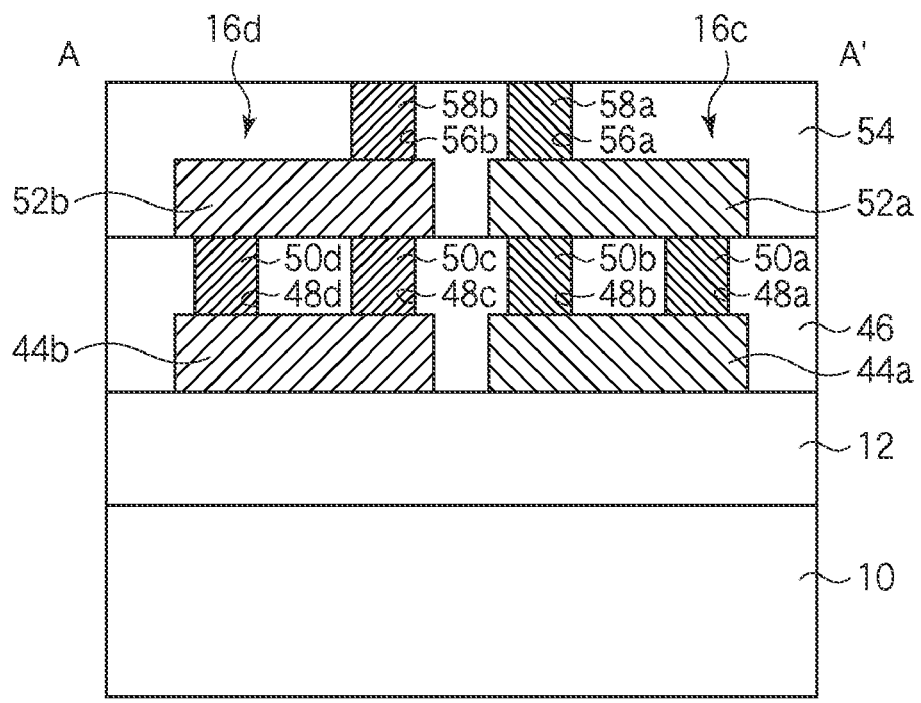
Figure 23B:
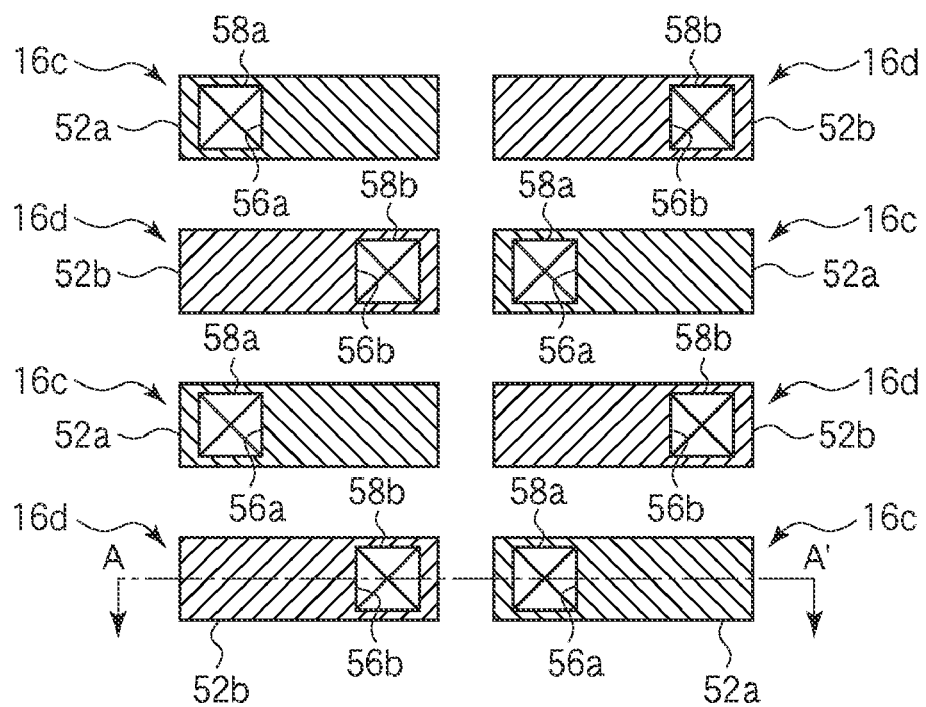
Figure 24A:
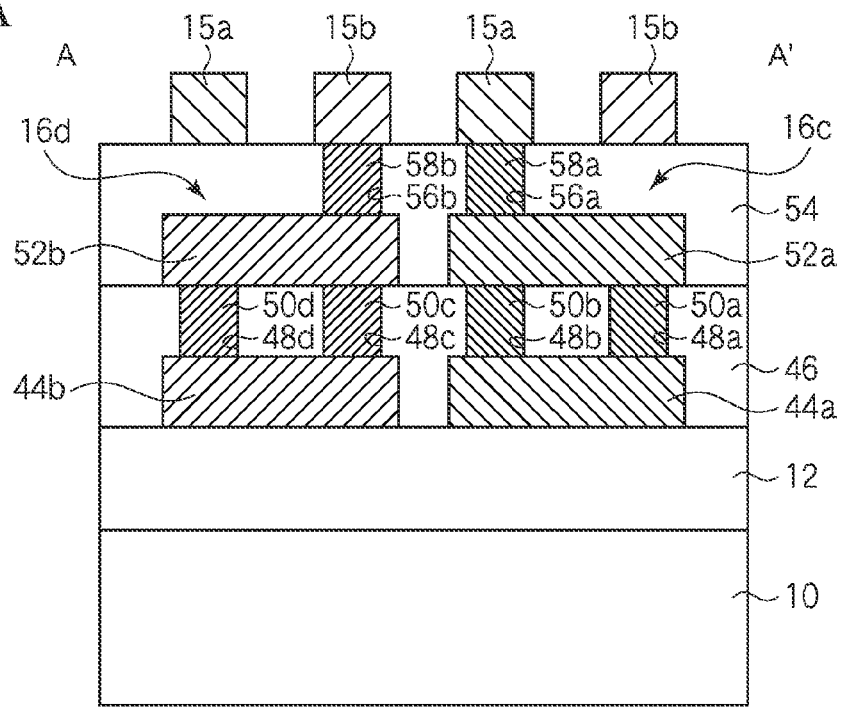
Figure 24B:
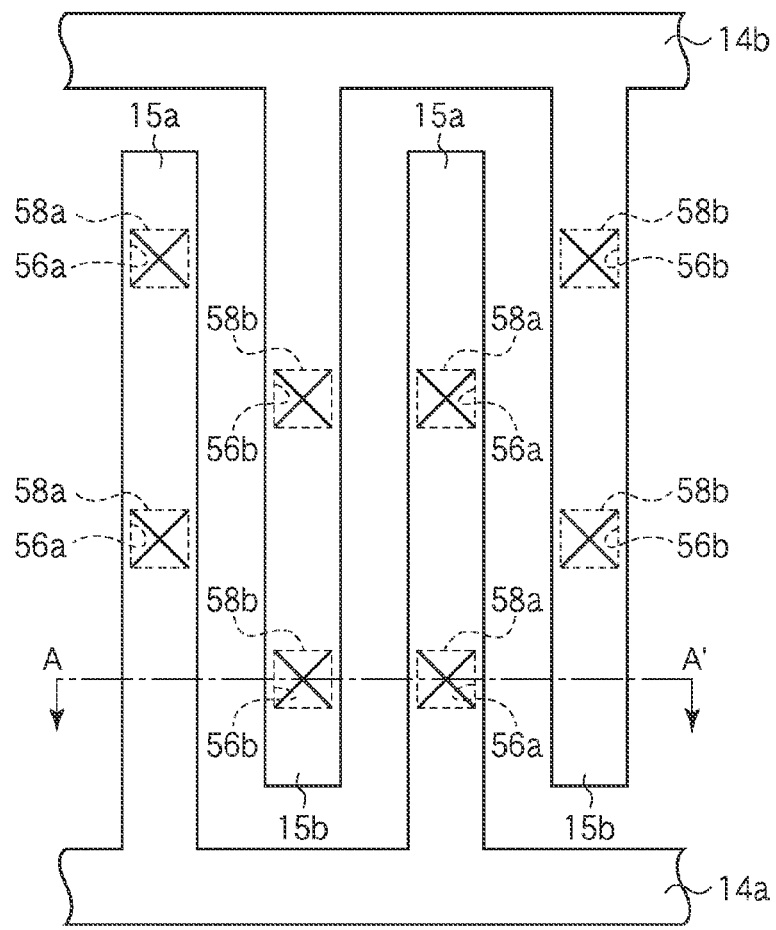
Figure 25A:
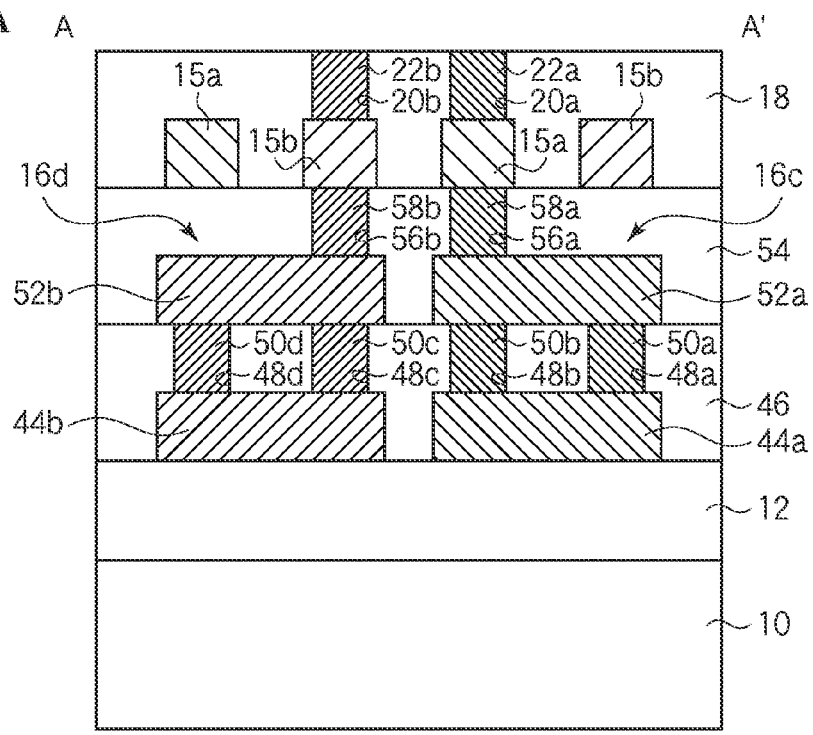
Figure 25B:
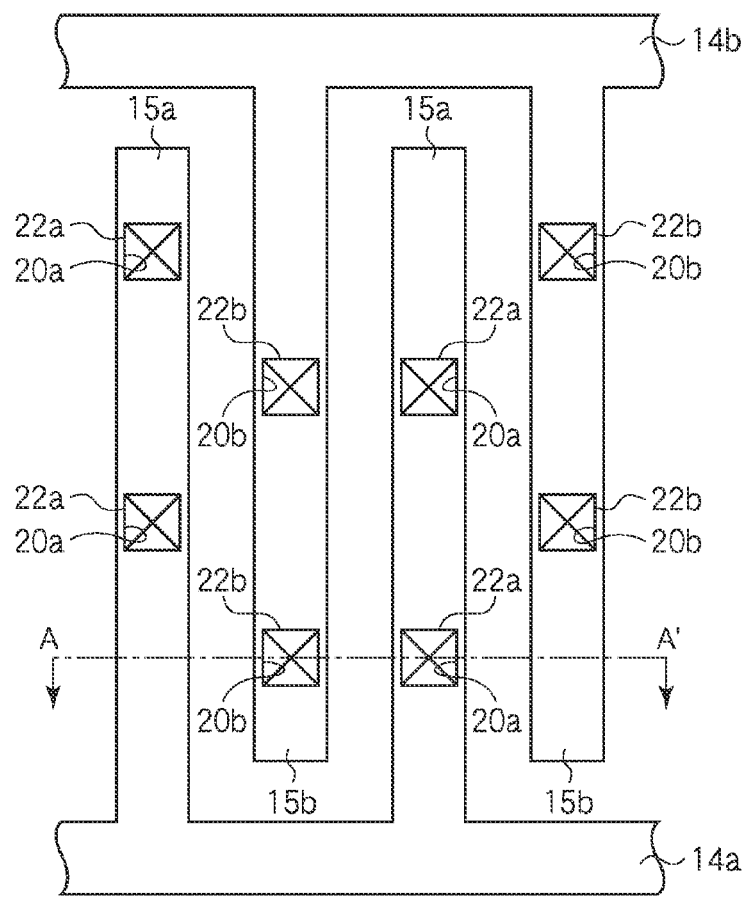

Then, in the inter-layer insulation film 46, the contact holes 48a arriving at one ends of the conduction layers 44a, the contact holes 48b arriving at the other ends of the conduction layers 44a, the contact holes 48c arriving at one ends of the conduction layers 44b and the contact holes 48d arriving at the other ends of the conduction layers 44b are formed by photolithography (see FIGS. 21A and 21B).

Next, on the entire surface, a conduction film of aluminum or others of an about 200-300 film thickness is formed by, e.g., sputtering.

Then, the conduction film is patterned by photolithography. Thus, on the inter-layer insulation film 46, the linear conduction layers 52a and the linear conduction layers 52b are formed. The conduction layers 52a, 52b are alternately formed and, as viewed from above the semiconductor substrate 10, are arranged in a matrix as a whole (see FIGS. 22A and 22B). The linear conduction layers 52a have one ends connected to the conductor plugs 50a, and have the other ends connected to the conductor plugs 50b. The conduction layers 52a are electrically connected to the linear conduction layers 44a, 44b via the conductor plugs 50a, 50b. The conduction layers 52b are electrically connected to the conduction layers 44b via the conductor plugs 50c, 50d.

The case that the conduction layers 52a and the conduction layers 52b are formed by forming a conduction film of aluminum or others and etching the conduction film is exemplified here. However, the method of forming the conduction layers 52a and the conduction layers 52b is not limited to this. For example, it is possible that the contact holes for the conductor plugs 50a-50d to be buried in and the trenches for the conduction layers 52a, 52b to be buried in are formed in the inter-layer insulation film, a conduction film of Cu is formed in the contact holes and the trenches and on the inter-layer insulation film, and the conduction film is polished until the surface of the inter-layer insulation film is exposed to thereby bury the conductor plugs 50a-50d of Cu and the conduction layers 52a, 52b of Cu in the inter-layer insulation film (not illustrated). That is, the conductor plugs 50a-50d and the conduction layers 52a, 52b may be formed by dual damascene. In this case, the conductor plugs 50a, 50b of Cu and the conduction layers 52a of Cu are formed integral, and the conductor plugs 50c, 50d of Cu and the conduction layers 52b of Cu are formed integral.

Next, on the inter-layer insulation film 46 with the conduction layers 52a, 52b formed on, the inter-layer insulation film 54 of, e.g., silicon oxide film is formed on the entire surface by, e.g., CVD.

Then, by photolithography, the contact holes arriving at one ends of the conduction layers 52a and the contact holes 56b arriving at one ends of the conduction layers 52b are formed in the inter-layer insulation film 54.

Next, on the entire surface, a barrier film and a tungsten film are formed by, e.g., CVD.

Next, the tungsten film and the barrier film are polished by, e.g., CMP until the surface of the inter-layer insulation film 54 is exposed. Thus, the conductor plugs 58a, 58b of, e.g., tungsten are buried in the contact holes 56a, 56b, respectively (see FIGS. 23A and 23B).

Then, on the entire surface, a conduction film of aluminum or others of an about 200-300 nm-film thickness is formed by, e.g., sputtering.

Next, the conduction film is patterned by photolithography. Thus, on the inter-layer insulation film 54, the first comb-shaped interconnection 14a having the plural comb teeth 15a and the second comb-shaped interconnection 14b having the plural comb teeth 15b are formed (see FIGS. 24A and 24B).

The case that the first comb-shaped interconnection 14a and the second comb-shaped interconnection 14b are formed by forming a conduction film of aluminum or others and etching the conduction film is exemplified here. However, the method of forming the first comb-shaped interconnection 14a and the second comb-shaped interconnection 14b is not limited to this. For example, it is possible that the contact holes for the conductor plugs 58a, 58b to be buried in and trenches for the comb-shaped interconnections 14a, 14b to be buried in are formed in the inter-layer insulation film, a conduction film of Cu is formed in the contact holes, the trenches and on the inter-layer insulation film, and the conduction film is polished until the surface of the inter-layer insulation film is exposed to thereby bury the conductor plugs 58a, 58b of Cu and the comb-shaped interconnections 14a, 14b of Cu in the inter-layer insulation film (not illustrated). That is, the conductor plugs 58a, 58b and comb-shaped interconnections 14a, 14b may be formed by dual damascene. In this case, the conductor plug 58a of Cu and the first comb-shaped interconnections 14a of Cu are formed integral, and the conductor plugs 58b and the second comb-shaped interconnections 14b of Cu are formed integral.

Next, on the inter-layer insulation film 54 with the first comb-shaped interconnection 14a and the second comb-shaped interconnection 14b are formed on, the inter-layer insulation film 18 of, e.g., silicon oxide film is formed on the entire surface by, e.g., CVD.

Next, by, e.g., photolithography, the contact holes 20a arriving at the first comb-shaped interconnection 14a and the contact holes 20b arriving at the second comb-shaped interconnection 14b are formed in the inter-layer insulation film 18.

Next, a barrier film and a tungsten film are formed on the entire surface by, e.g., CVD.

Then, the tungsten film and the barrier film are polished by, e.g., CMP until the surface of the inter-layer insulation film 18 is exposed. Thus, the conductor plugs 22a, 22b of, e.g., tungsten are buried in the contact holes 20a, 20b (see FIGS. 25A and 25B).

Next, a conduction film of aluminum or others of an about 200-300 nm-film thickness is formed on the entire surface by, e.g., sputtering.

Next, the conduction film is patterned by photolithography. Thus, the linear conduction layers 24a and the linear conduction layers 24b are formed on the inter-layer insulation film 18. The conduction layers 24a, 24b are alternately formed and, as viewed from above the semiconductor substrate 10, are arranged in a matrix as a whole. The linear conduction layers 24a have one ends connected to the conductor plugs 22a. The conduction layers 24a are electrically connected to the comb-shaped interconnection 14a via the conductor plugs 22a. The linear conduction layers 24b have one ends connected to the conductor plugs 22b. The conduction layers 24b are electrically connected to the comb-shaped interconnection 14b via the conductor plugs 22b (see FIG. 26 and FIG. 27).

The case that the conduction layers 24a and the conduction layers 24b are formed by forming a conduction film of aluminum or others and etching the conduction film is exemplified here. However, the method of forming the conduction layers 24a and the conduction layer 24b is not limited to this. For example, it is possible that contact holes for the conductor plugs 22a, 22b to be buried in and trenches for the conduction layers 24a, 24b to be buried in are formed in the inter-layer insulation film, a conduction film of Cu is formed in the contact holes and the trenches and on the inter-layer insulation film, and the conduction film is polished until the surface of the inter-layer insulation film is exposed to thereby bury the plugs 22a, 22b of Cu and the conduction layers 24a, 24b of Cu in the inter-layer insulation film (not illustrated). That is, the conductor plugs 22a, 22b and the conduction layers 24a, 24b may be formed by dual damascene. In this case, the conductor plugs 22a of Cu and the conduction layer 24a of Cu are formed integral, and the conductor plugs 22b of Cu and the conduction layers 24b of Cu are formed integral.

Then, on the inter-layer insulation film 18 with the conduction layers 24a, 24b formed on, the inter-layer insulation film 26 of, e.g., silicon oxide film is formed on the entire surface by, e.g., CVD.

Next, the contact holes 28a arriving at one ends of the conduction layers 24a, the contact holes 28b arriving at the other ends of the conduction layers 24a, the contact holes 28c arriving at one ends of the conduction layers 24b, and the contact holes 28d arriving at one ends of the conduction layers 24b are formed in the inter-layer insulation film 26 by photolithography.

Next, a barrier film and a tungsten film are formed on the entire surface by, e.g., CVD.

Next, the tungsten film and the barrier film are polished by, e.g., CMP until the surface of the inter-layer insulation film 26 is exposed. Thus, the conductor plugs 30a-30d of, e.g., tungsten are buried respectively in the contact holes 28a-28d (see FIG. 28 and FIG. 29).

Next, a conduction film of aluminum or others of an about 200-300 nm-film thickness is formed on the entire surface by, e.g., sputtering.

Then, the conduction film is patterned by photolithography. Thus, the linear conduction layers 32a and the linear conduction layers 32b are formed on the inter-layer insulation film 26. The conduction layers 32a, 32b are alternately formed and, as viewed from above the semiconductor substrate 10, are arranged in a matrix as a whole. The linear conduction layers 32a have one ends connected to the conductor plugs 30a and the other ends connected to the conductor plugs 30b. The conduction layers 32a are electrically connected to the conduction layers 24a, 234b via the conductor plugs 30a, 30b. The conduction layer 32b is electrically connected to the conduction layer 24b via the conductor plugs 30c, 30d.

The case that the conduction layers 32a and the conduction layer 32b are formed by forming a conduction film of aluminum or others and etching the conduction film is exemplified here. However, the method of forming the conduction layers 32a and the conduction layers 32b is not limited to this. For example, it is possible that contact holes for the conductor plugs 30a-30d to be buried in and trenches for the conduction layers 32a, 32b to be buried in are formed in the inter-layer insulation film, a conduction film of Cu is formed in the contact holes and the trenches and on the inter-layer insulation film, and the conduction film is polished until the surface of the inter-layer insulation film is exposed to thereby bury the conductor plugs 30a-30d of Cu and the conduction layers 32a, 32b in the inter-layer insulation film (not illustrated). That is, the conductor plugs 30a-30d and the conduction layers 32a, 32b may be formed by dual damascene. In this case, the conductor plugs 30a, 30b of Cu and the conduction layers 32a of Cu are formed integral, and the conductor plugs 30c, 30d of Cu and the conduction layers 32b of Cu are formed integral Next, on the entire surface, the inter-layer insulation film 34 of, e.g., silicon oxide film is formed by, e.g., CVD (see FIG. 30 and FIG. 31).

Thus, the semiconductor device according to the present embodiment is manufactured.

(Modification)

Figure 32:
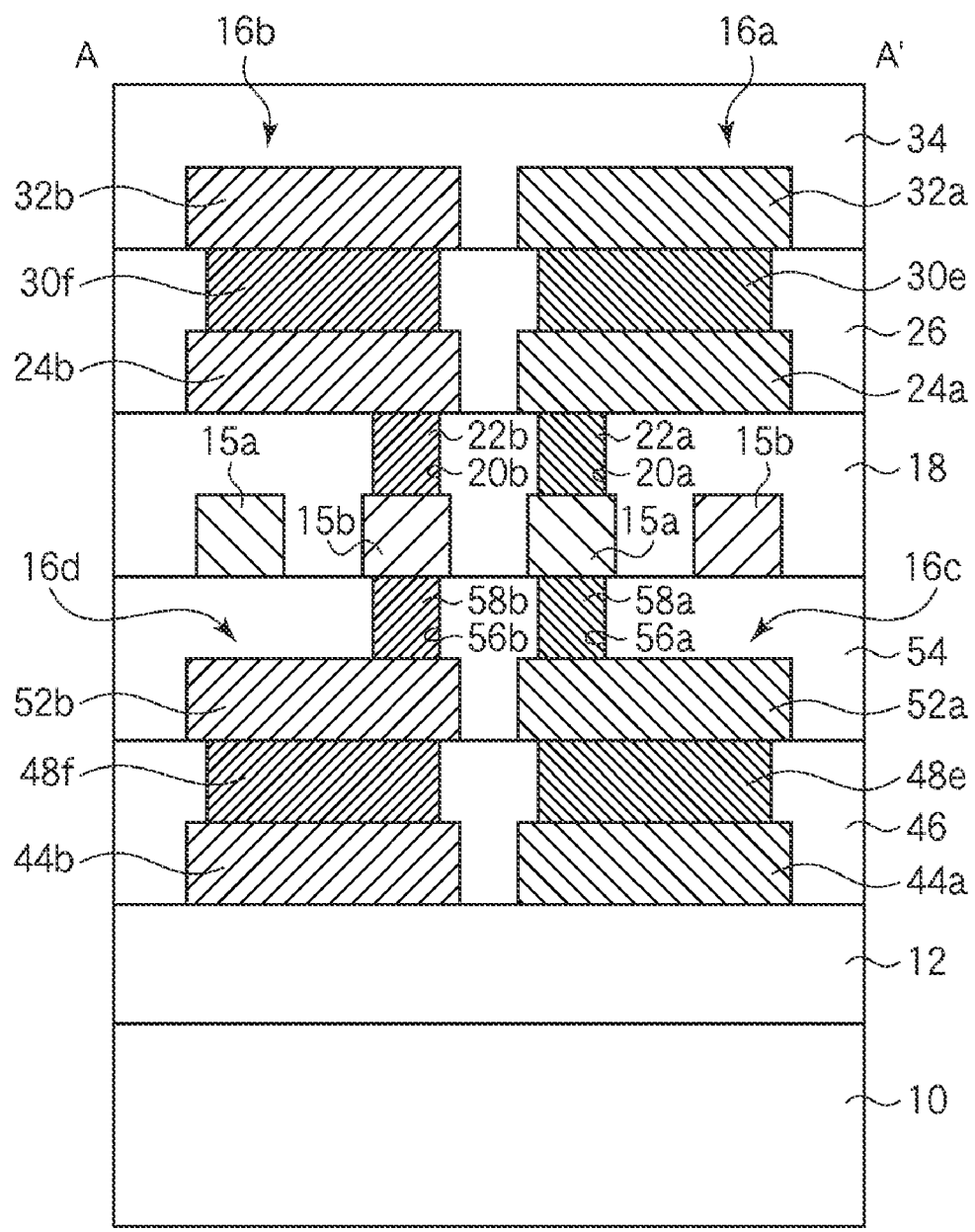
FIG. 32 is a sectional view of a semiconductor device according to a modification of the second embodiment.

Next, the capacitor element according to a modification of the present embodiment and the semiconductor device including the capacitor will be explained with reference to FIG. 32. FIG. 32 is a sectional view of the semiconductor device according to the present modification.

The capacitor element according to the present modification and the semiconductor device including the capacitor element is characterized mainly in that the linear conduction layers 44a, 44b and the linear conduction layers 52a, 52b are respectively connected by the linear conduction layers 48e, 48f buried in the inter-layer insulation film 46, and the linear conduction layers 24a, 24b and the linear conduction layers 32a, 32b are connected by the linear conduction layers 30e, 30f buried in the inter-layer insulation film 26.

As described above, the linear conduction layers 44a, 44b and the linear conduction layers 52a, 52b may be connected respectively by the linear conduction layers 48e, 48f without connecting the linear conduction layers 44a, 44b and the linear conduction layers 52a, 52b respectively by the conductor plugs 50a-50d. The linear conduction layers 24a, 24b and the linear conduction layers 32a, 32b may be connected respectively by the linear conduction layers 30e, 30f without connecting the linear conduction layers 24a, 24b and the linear conduction layers 32a, 32b respectively by the conductor plugs 30a-30d.

[c] Third Embodiment

The capacitor element according to a third embodiment and the semiconductor device including the capacitor element, and their manufacturing method will be explained with reference to FIGS. 33 to 43. The same members of the capacitor element according to the present embodiment and the semiconductor device including the capacitor element, etc. as those of the capacitor element and the semiconductor device, etc. according to the first or the second embodiment illustrated in FIGS. 1 to 28 are represented by the same reference numbers not to repeat or to simplify their explanation.

(Capacitor Element and Semiconductor Device)

Figure 33:
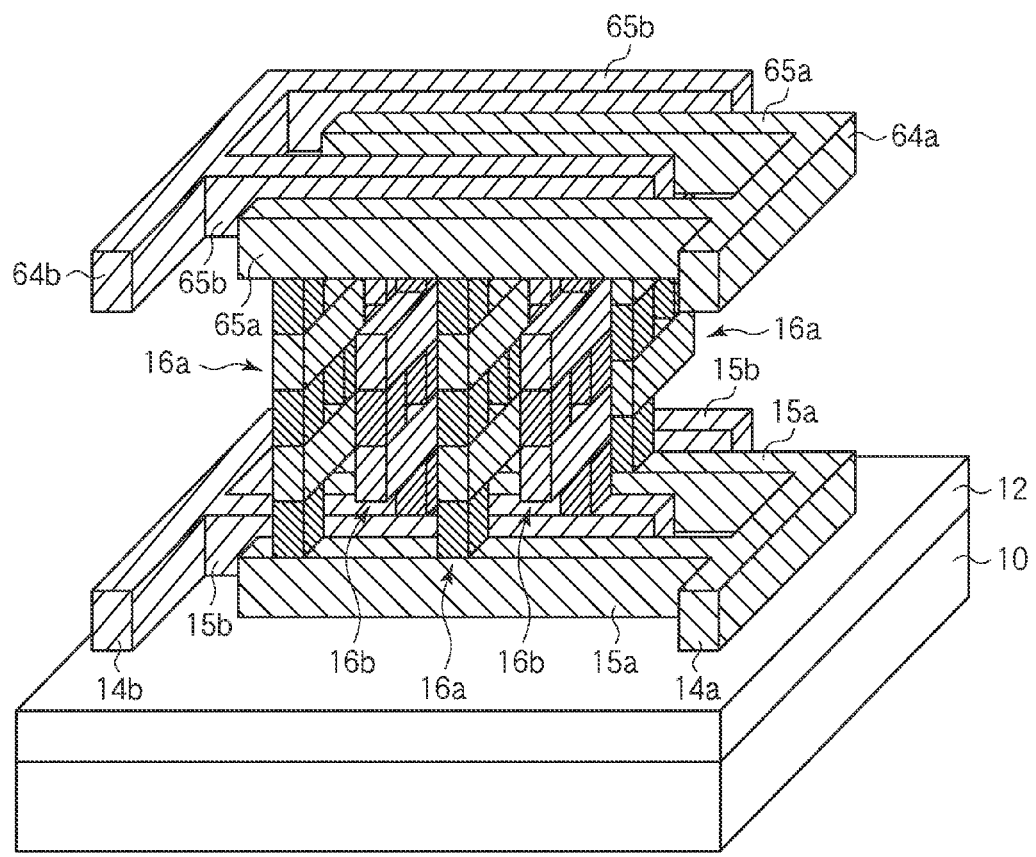
FIG. 33 is a perspective view of the semiconductor device according to a third embodiment.
Figure 34:
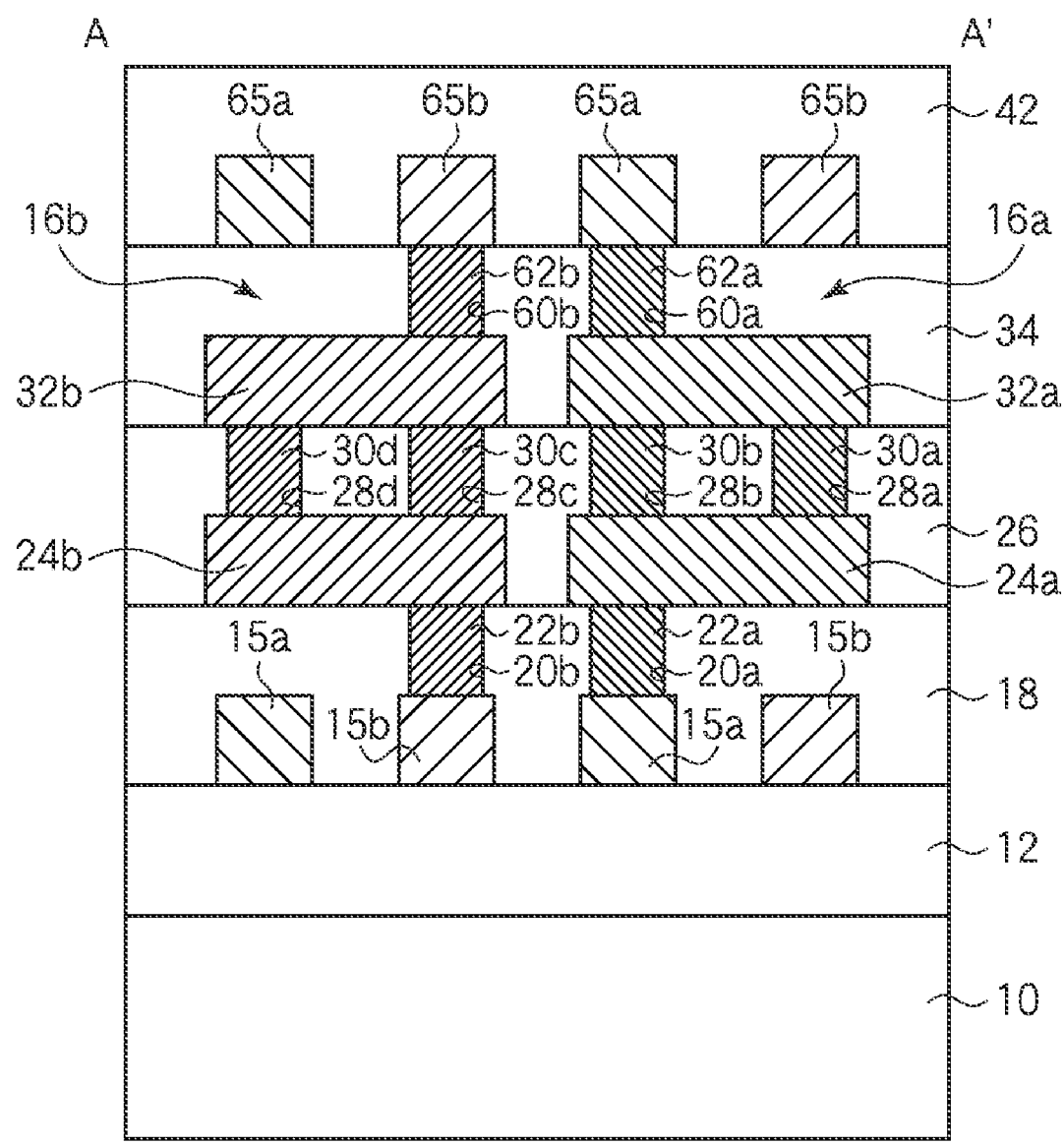
FIG. 34 is a sectional view of the semiconductor device according to the third embodiment.
Figure 35:
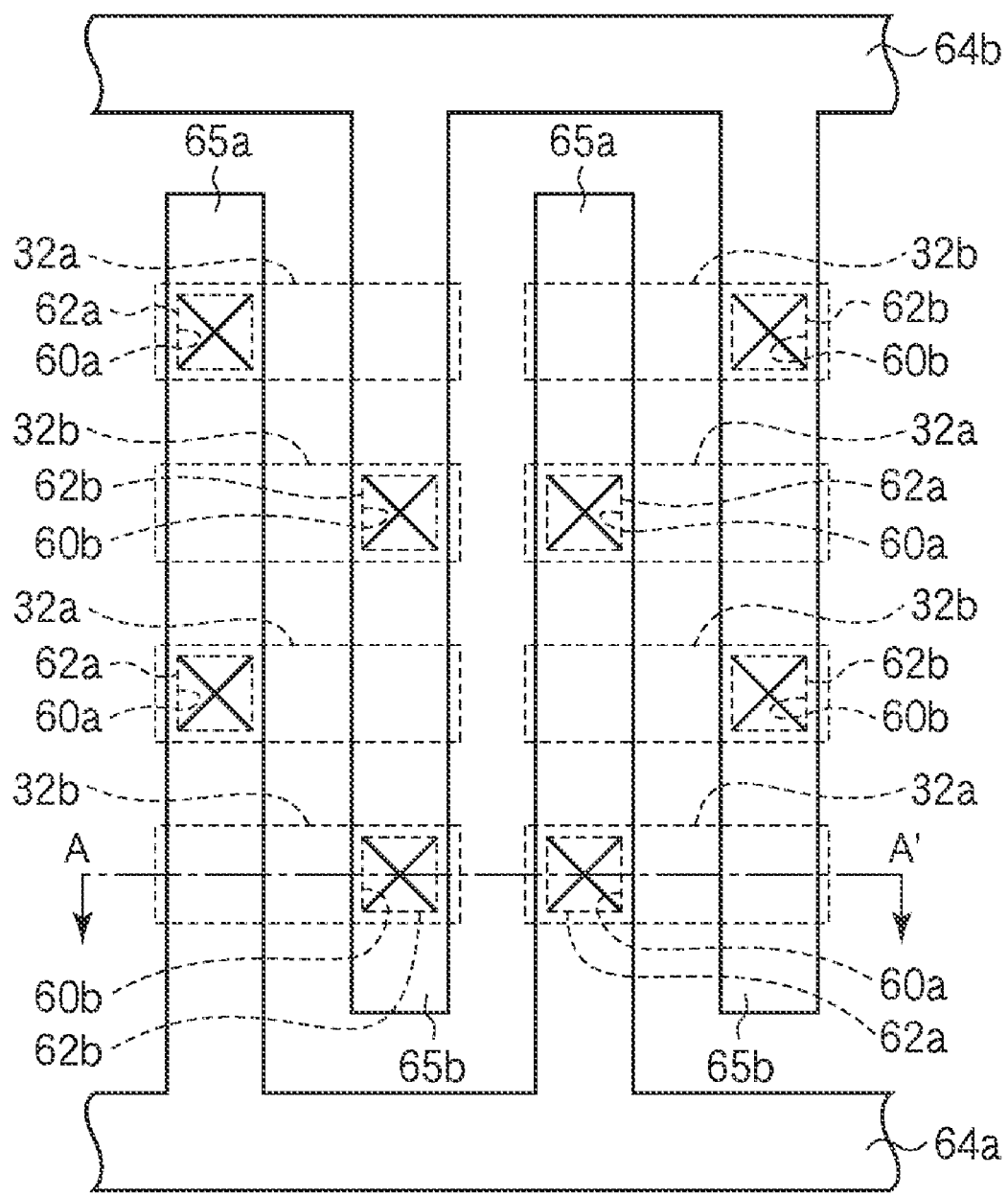
FIG. 35 is a plan view of the semiconductor device according to the third embodiment.
Figure 36A:
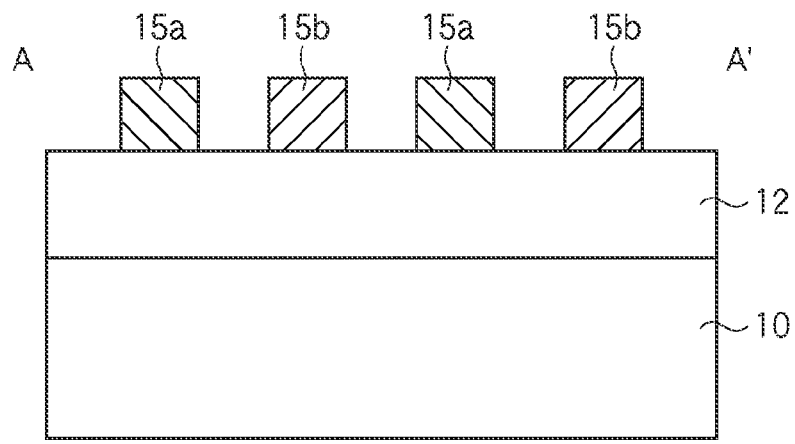
FIGS. 36A to 43 are views of the semiconductor device according to the third embodiment in the steps of the method of manufacturing the semiconductor device, which illustrate the method.
Figure 36B:
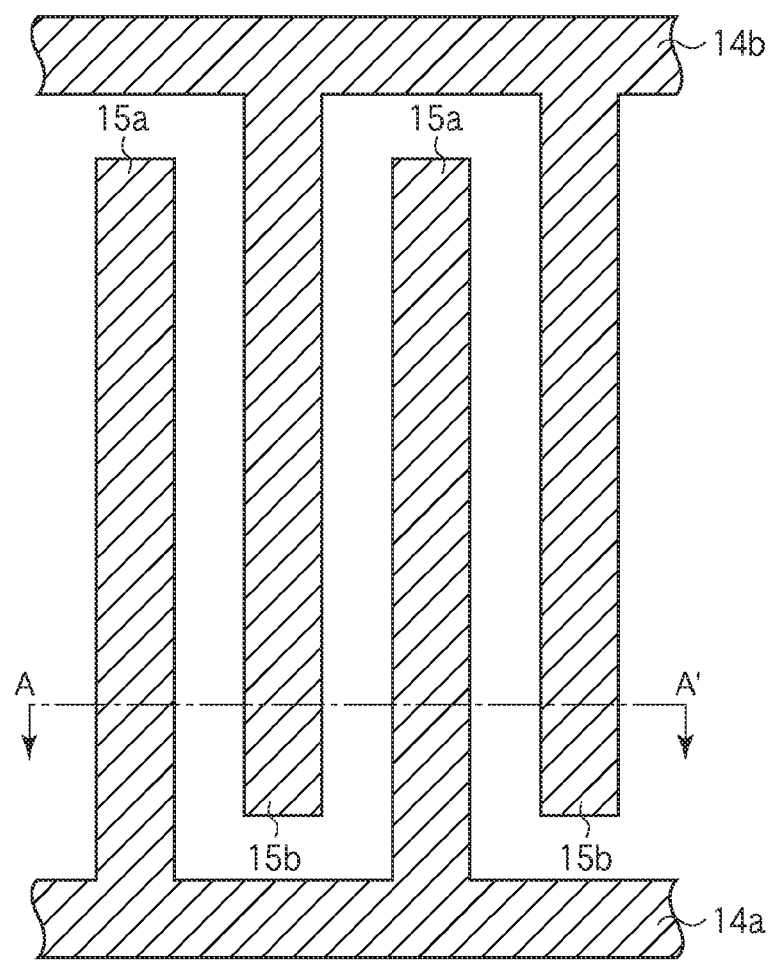
Figure 37A:
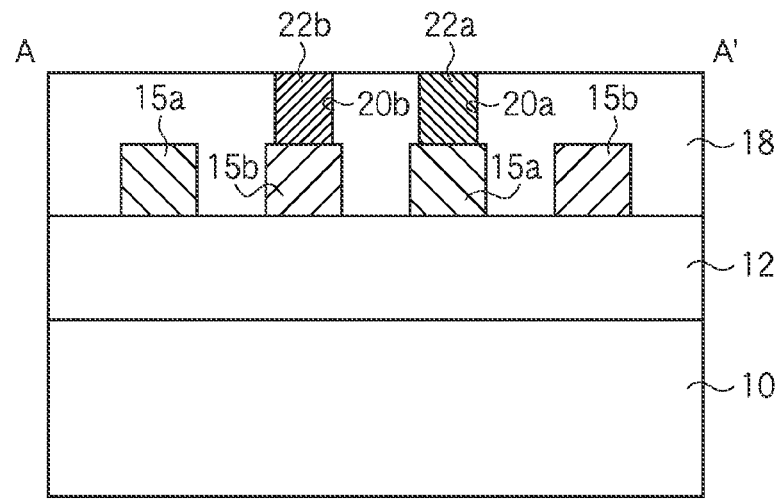
Figure 37B:
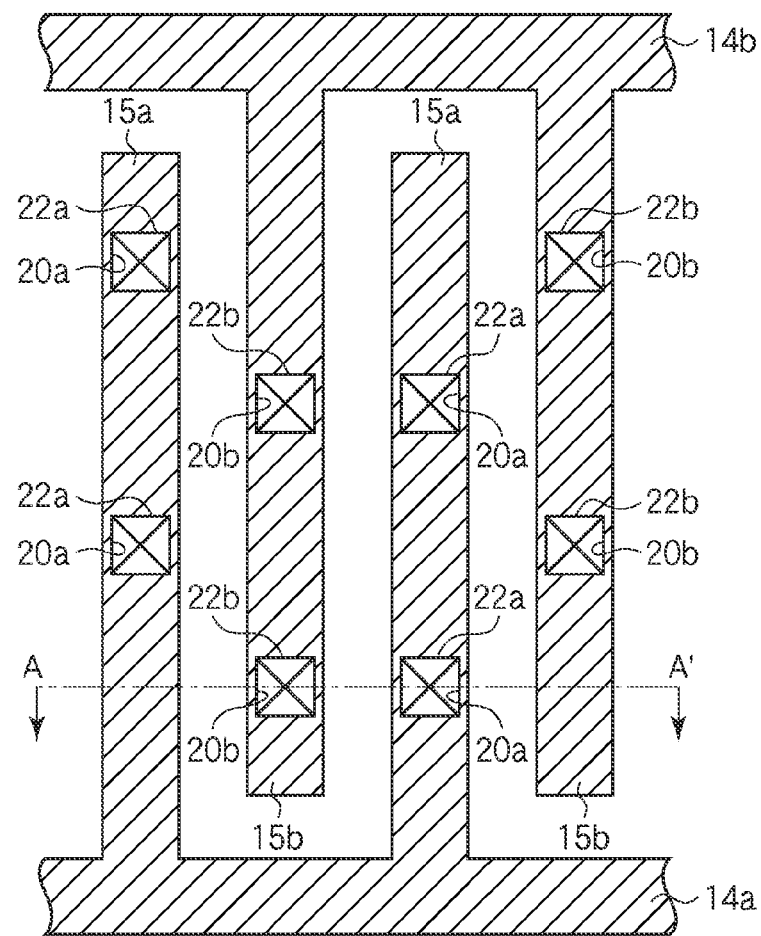
Figure 38A:
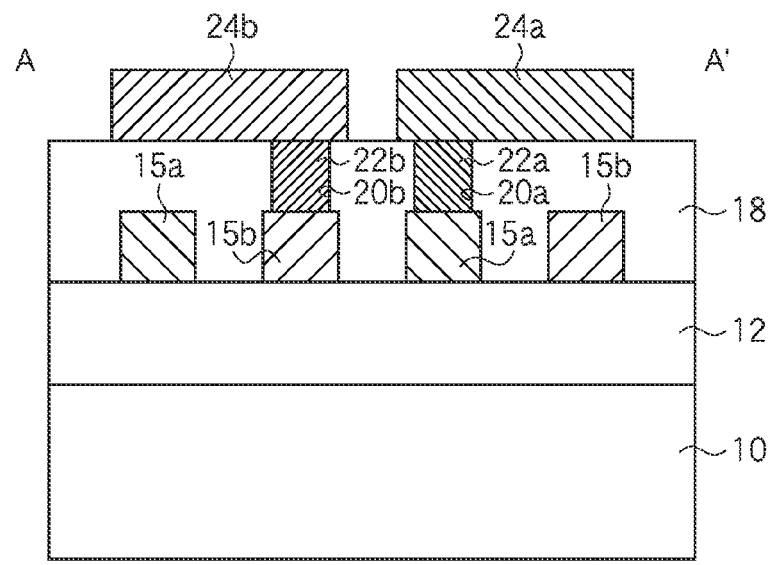
Figure 38B:
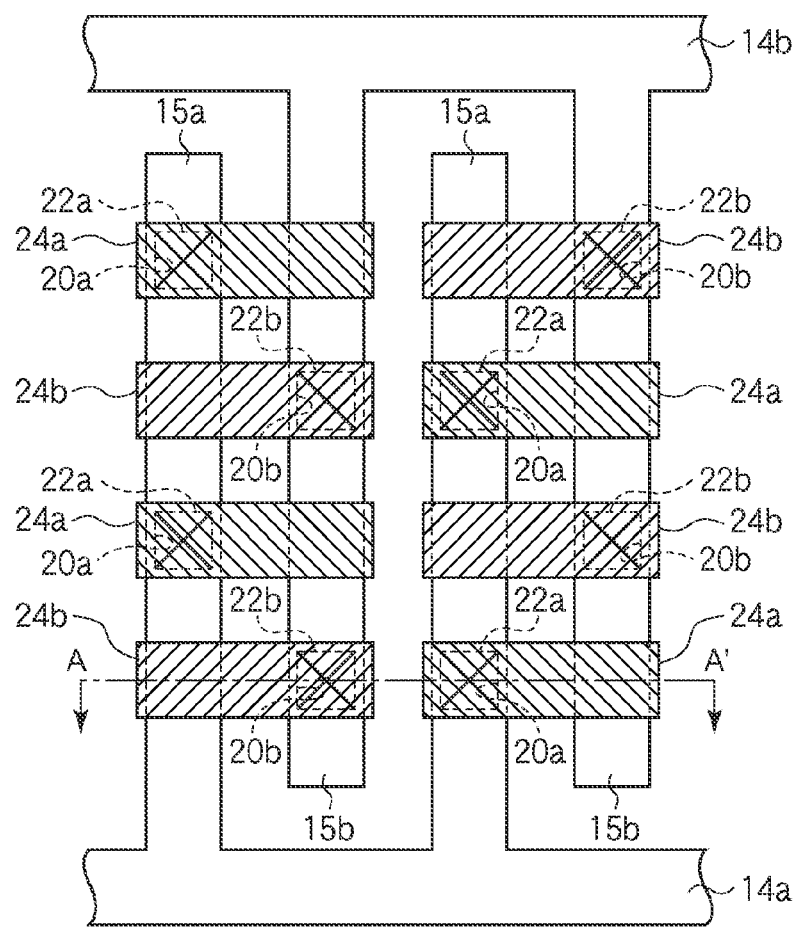
Figure 39A:
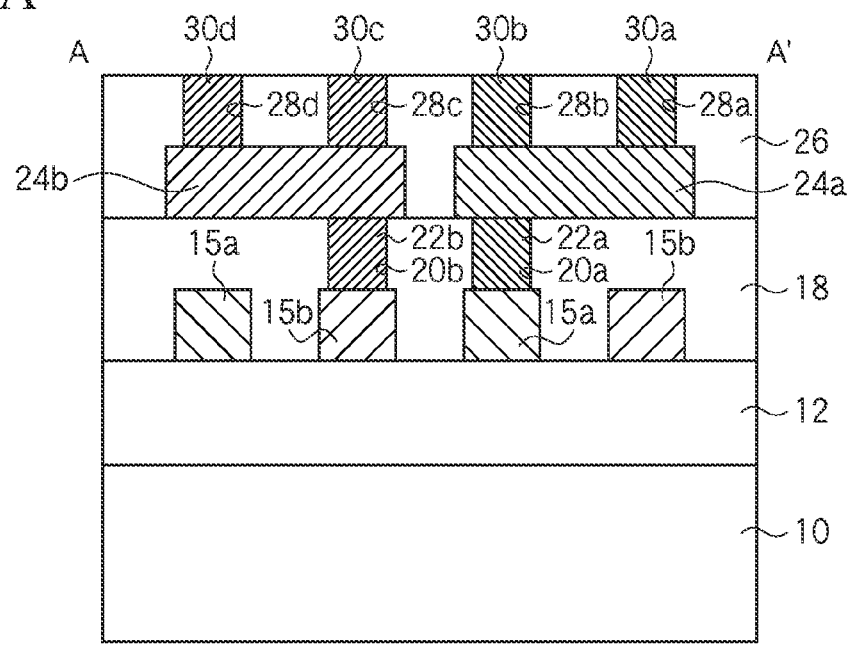
Figure 39B:
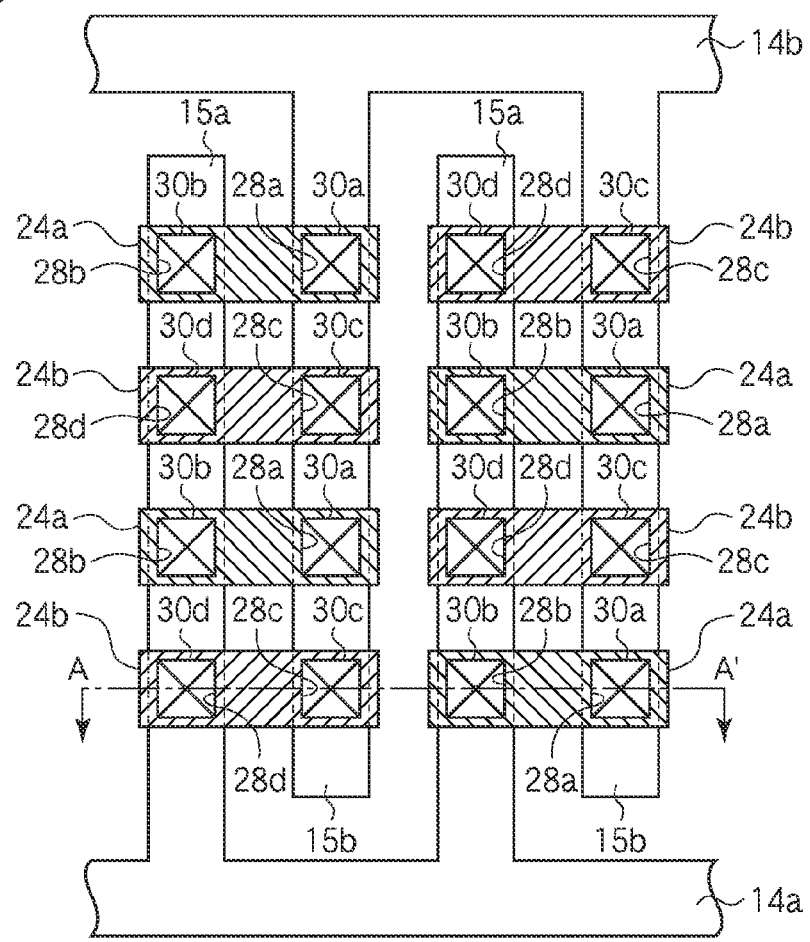
Figure 40A:
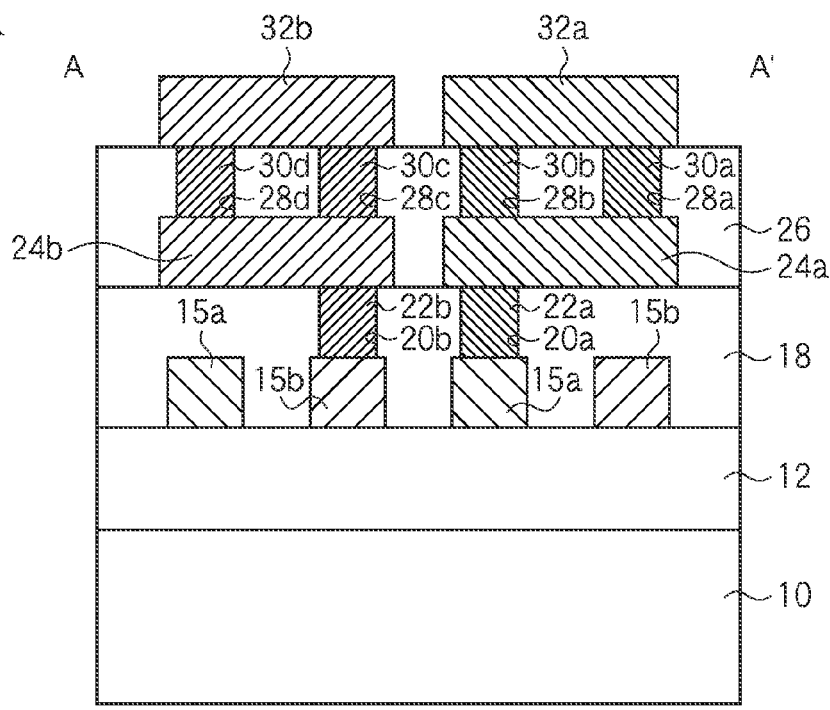
Figure 40B:
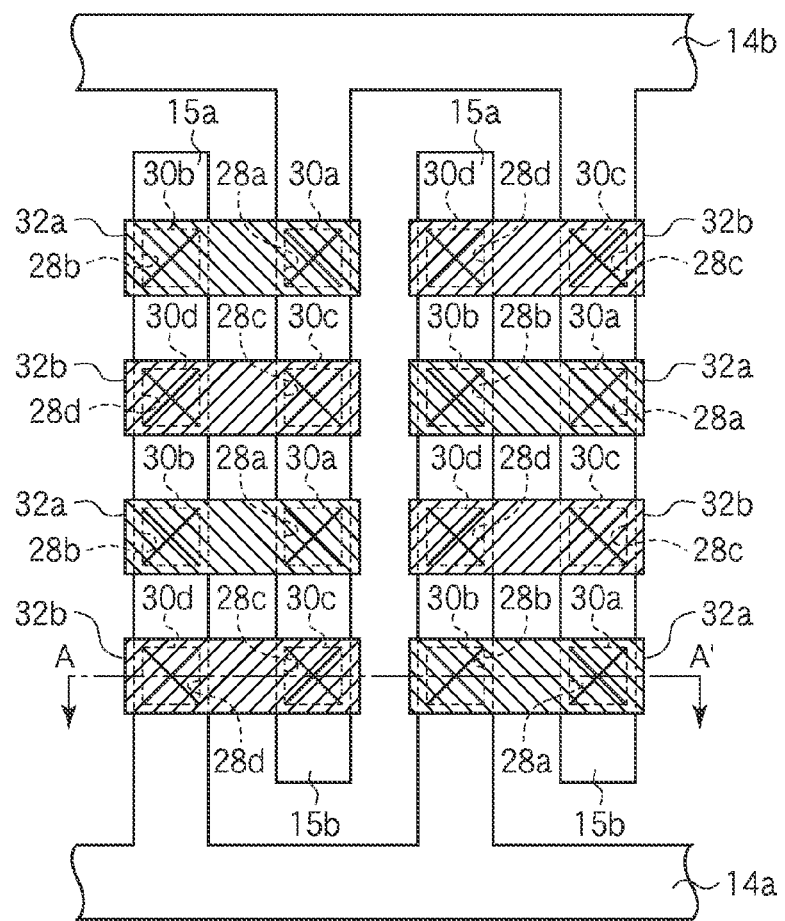
Figure 41A:
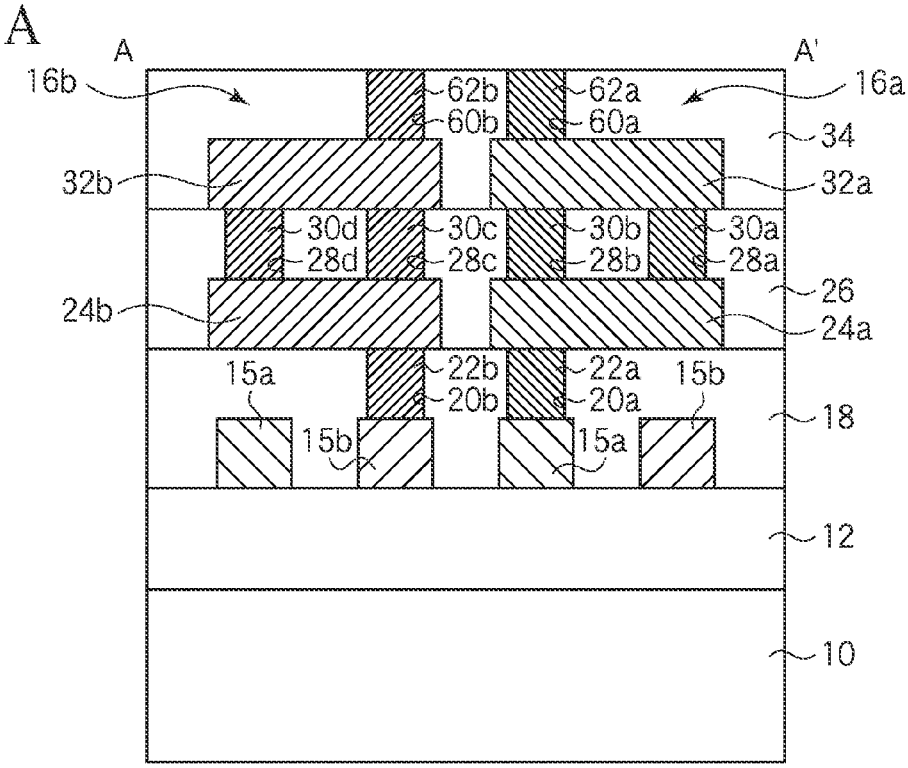
Figure 41B:
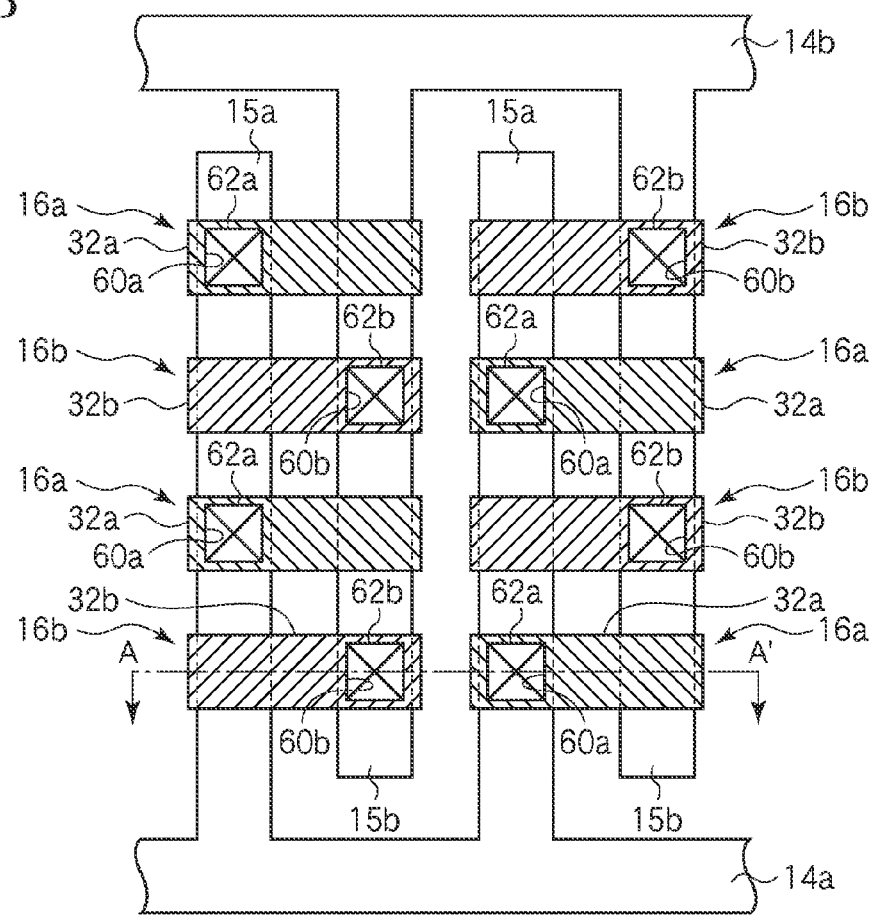

First, the capacitor element according to the present embodiment and the semiconductor device including the capacitor element will be explained with reference to FIGS. 33 to 35. FIG. 33 is a perspective view of the semiconductor device according to the present embodiment. In FIG. 33, the inter-layer insulation films 18, 26, 34, 42 formed burying the first electrodes 16a and the second electrodes 16b are omitted. FIG. 34 is a sectional view of the semiconductor device according to the present embodiment. FIG. 35 is a plan view of the semiconductor device according to the present embodiment. FIG. 34 is the sectional view along the A-A' line in FIG. 35.

The semiconductor device according to the present embodiment is characterized mainly in that a first comb-shaped interconnection 14a is formed below the first electrodes 16a, also above the first electrodes 16a, a third comb-shaped interconnection 64a electrically connected to the first electrodes 16a is formed, a second comb-shaped interconnection 14b is formed below the second electrodes 16b, and also above the second electrodes 16b, a fourth comb-shaped interconnection 64b electrically connected to the second electrodes 16b is formed.

As illustrated in FIG. 33, on the semiconductor substrate 10 of, e.g., a silicon substrate, the inter-layer insulation film 12 of, e.g., silicon oxide film is formed.

On the semiconductor substrate 10 with the inter-layer insulation film 12 formed on, the first comb-shaped interconnection 14a and the second comb-shaped interconnection 14b are formed. The first comb-shaped interconnection 14a and the second comb-shaped interconnection 14b are formed in the same layer. The plural comb teeth 15a of the first comb-shaped interconnection 14a and the plural comb-teeth 15b of the second comb-shaped interconnection 14b are formed alternately. The first comb-shaped interconnection 14a is connected to, e.g., a first potential. The second comb-shaped interconnection 14b is connected to, e.g., a second potential different from the first potential. The first potential is, e.g., a power supply potential. The second potential is, e.g., the ground potential.

On the semiconductor substrate 10 with the first comb-shaped interconnection 14a and the second comb-shaped interconnection 14b formed on, the plural first electrodes 16a and the plural second electrodes 16b are formed, projected perpendicularly to the surface of the semiconductor substrate 10. The plural first electrodes 16a and the plural second electrodes 16b are formed alternately. As viewed from above the semiconductor substrate 10, the plural first electrodes 16a and the plural second electrodes 16b are arranged in a matrix as a whole.

As detailed below, the first electrodes 16a are formed of the conductor plugs 22a, the conduction layers 24a, the conductor plugs 30a, 30b, the conduction layers 32a and the conductor plugs 62a sequentially stacked.

As detailed below, the second electrodes 16b are formed of the conductor plugs 22b, the conduction layer 24b, the conductor plugs 30c, 30d, the conduction layers 32b and the conductor plugs 62b sequentially stacked.

The plural first electrodes 16a and the plural second electrodes 16b are buried respectively in the inter-layer insulation films 18, 26, 34, 42.

On the inter-layer insulation film 12 with the first comb-shaped interconnection 14a and the second comb-shaped interconnection 14b formed on, the inter-layer insulation film 18 of, e.g., silicon oxide film is formed.

In the inter-layer insulation film 18, the contact holes 20a arriving at the first comb-shaped interconnection 14a and the contact holes 20b arriving at the second comb-shaped interconnection 14b are formed.

The conductor plugs 22a, 22b are respectively buried in the contact holes 20a, 20b.

On the inter-layer insulation film 18 with the conductor plugs 22a, 22b buried in, the linear conduction layers 24a, 24b are formed. The linear conduction layers 24a are connected to the conductor plugs 22a, and the linear conduction layers 24b are connected to the conductor plugs 22b.

On the inter-layer insulation film 18 with the linear conduction layers 24a, 24b formed on, the inter-layer insulation film 26 of, e.g., silicon oxide film is formed.

In the inter-layer insulation film 26, the contact holes 28a, 28b respectively arriving at the linear conduction layers 24a and the contact holes 28c, 28d respectively arriving at the linear conduction layers 24b are formed.

The conductor plugs 30a, 30b are respectively buried in the contact holes 28a, 28b. The conductor plugs 30a are connected to one ends of the linear conduction layers 24a, and the conductor plugs 30b are connected to the other ends of the linear conduction layers 24a.

The conductor plugs 30c, 30d are respectively buried in the contact holes 28c, 28d. The conductor plugs 30c are connected to one ends of the linear conduction layers 24b, and the conductor plugs 30d are connected to the other ends of the linear conduction layers 24b.

On the inter-layer insulation film 26 with the conductor plugs 30a-30d buried in, the linear conduction layers 32a, 32b are formed.

The linear conduction layers 32a have one ends connected to one ends of the linear conduction layers 24a via the conductor plugs 30a. The linear conduction layers 32a have the other ends connected to the other ends of the linear conduction layers 24a via the conductor plugs 30b.

The linear conduction layers 32b have one ends connected to one ends of the linear conduction layers 24b via the conductor plugs 30c. The linear conduction layers 32b have the other ends connected to the other ends of the linear conduction layers 24b via the conductor plugs 30d.

On the inter-layer insulation film 26 with the linear conduction layers 32a, 32b formed on, the inter-layer insulation film 34 of, e.g., silicon oxide film is formed.

In the inter-layer insulation film 34, the contact holes 60a arriving at one ends of the linear conduction layers 32a and the contact holes 60b arriving at one ends of the conduction layers 32b are formed.

The conductor plugs 62a, 62b are respectively buried in the contact holes 60a, 60b. The conductor plugs 62a are connected to one ends of the linear conduction layers 32a, and the conductor plugs 62b are connected t one ends of the linear conduction layers 32b.

On the inter-layer insulation film 34 with the conductor plugs 62a, 62b buried in, the third comb-shaped interconnection 64a and the fourth comb-shaped interconnection 64b are formed (see FIG. 35). The third comb-shaped interconnection 64a and the fourth comb-shaped interconnection 64b are formed in the same layer. The third comb-shaped interconnection 64a has a plurality of comb teeth 65a. The plural comb teeth 65a of the third comb-shaped interconnection 64a are formed in parallel with each other. The fourth comb-shaped interconnection 64b has a plurality of comb teeth 65b. The plural comb teeth 65b of the fourth comb-shaped interconnection 64b are formed in parallel with each other. The plural comb teeth 65a of the third comb-shaped interconnection 64a and the plural comb teeth 65b of the fourth comb-shaped interconnection 64b are formed alternately. In other words, the plural comb teeth 65a of the third comb-shaped interconnection 64a and the plural comb teeth 65b of the fourth comb-shaped interconnection 64b are formed in combination with each other. The comb teeth 65a of the third comb-shaped interconnection 64a and the comb teeth 65b of the fourth comb-shaped interconnection 64b are opposed to each other. One of the comb tooth 65b of the fourth comb-shaped interconnection 64b is arranged between one of the comb tooth 65a of the third comb-shaped interconnection 64a and the other comb tooth 65b of the third comb-shaped interconnection 64b. The other comb tooth 65a of the third comb-shaped interconnection 64a is arranged between one of the comb tooth 65b of the fourth comb-shaped interconnection 64b and the other comb tooth 65b of the fourth comb-shaped interconnection 64b. The third comb-shaped interconnection 64a is connected to the same potential as the first comb-shaped interconnection 14a, i.e., the first potential. The fourth comb-shaped interconnection 64b is connected to the same potential as the second comb-shaped interconnection 14b, i.e., the second potential.

The comb teeth 65b of the third comb-shaped interconnection 64a are connected to one ends of the linear conduction layers 32a via the conductor plugs 62a.

The comb teeth 65b of the fourth comb-shaped interconnection 64b are connected to one ends of the linear conduction layers 32b via the conductor plugs 62b.

On the inter-layer insulation film 34 with the third comb-shaped interconnection 64a and the fourth comb-shaped interconnection 64b formed on, the inter-layer insulation film 42 of, e.g., silicon oxide film is formed.

Thus, the first electrodes 16a including the conductor plugs 22a, the conduction layers 24a, the conductor plugs 30a, 30b, the conduction layer 32a and the conductor plugs 62a are constituted.

The second electrodes 16b including the conductor plugs 22b, the conduction layers 24b, the conductor plugs 30c, 30d, the conduction layer 32b and the conductor plugs 62b are constituted.

As described above, in the semiconductor device according to the present embodiment, the first comb-shaped interconnection 14a is formed below the first electrodes 16a, and also above the first electrodes 16a, the third comb-shaped interconnection 64a electrically connected to the first electrodes 16a is formed. In the present embodiment, as described above, the second comb-shaped interconnection 14b is formed below the second electrodes 16b, and also above the second electrodes 16b, the fourth comb-shaped interconnection 64b electrically connected to the second electrodes 16b is formed. Thus, according to the present embodiment, the capacitor element can have good frequency characteristics.

(Manufacturing Method of Capacitor Element and Semiconductor Device)

Figure 42:
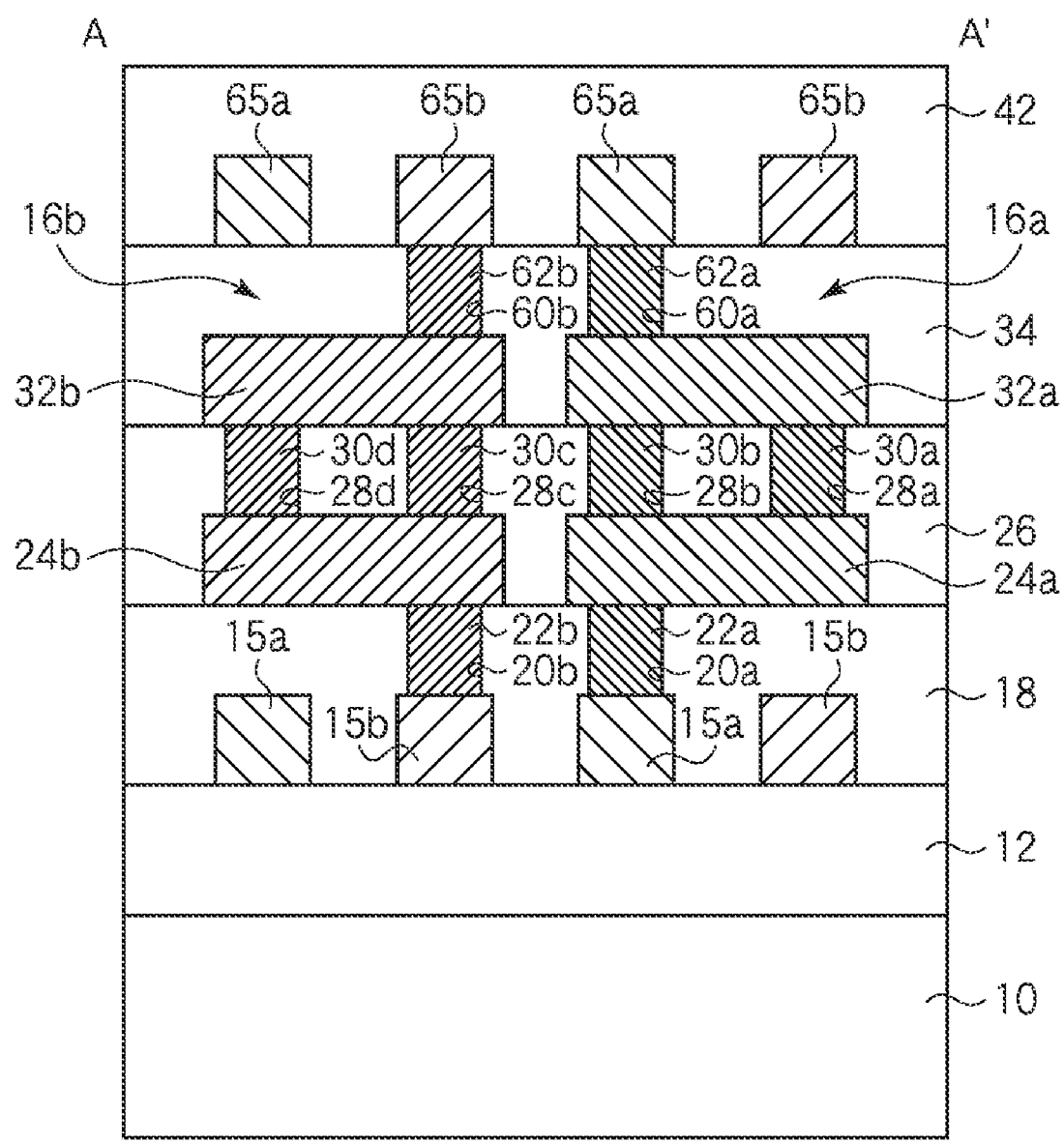
Figure 43:
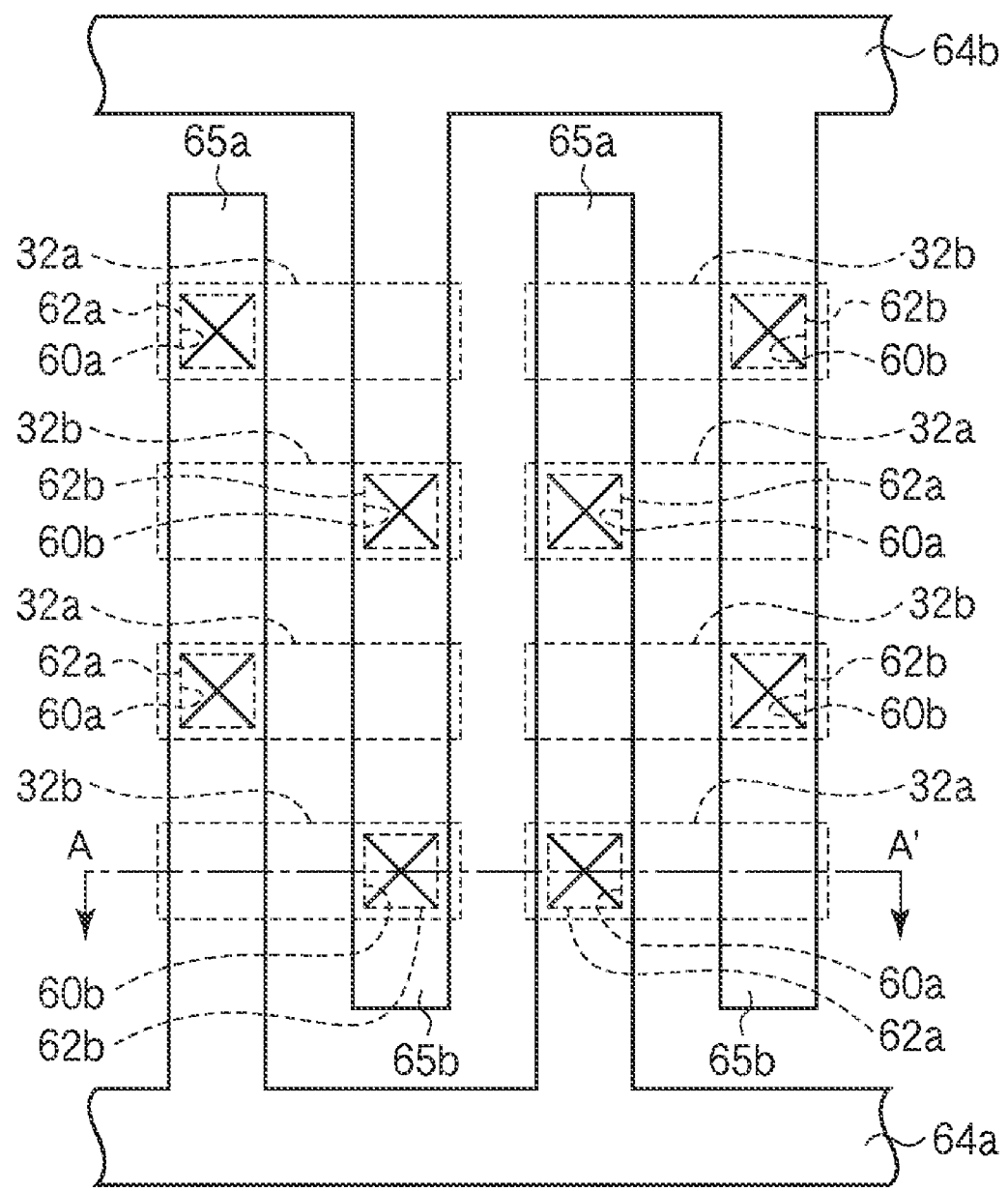

Next, the method of manufacturing the capacitor element according to the present embodiment and the semiconductor device including the capacitor element will be explained with reference to FIG. 36A to FIG. 43. FIGS. 36A to 43 are views of the semiconductor device according to the present embodiment in the steps of the method for manufacturing the semiconductor device. FIG. 36A, FIG. 37A, FIG. 38A, FIG. 39A, FIG. 40A and FIG. 41A are sectional views along the A-A' line respectively in FIG. 36B, FIG. 37B, FIG. 38B, FIG. 39B, FIG. 40B and FIG. 41B. FIG. 42 is a sectional view, and FIG. 43 is a plan view. FIG. 42 is the sectional view along the A-A' line in FIG. 43.

First, the step of forming the inter-layer insulation film 12 on the semiconductor substrate 10 to the step of forming the conduction layers 32a, 32b on the inter-layer insulation film 26 are the same as those of the method of manufacturing the semiconductor device according to the first embodiment described above with reference to FIGS. 4A to 8B, and their explanation is not repeated (see FIG. 36A to FIG. 40B).

Then, on the inter-layer insulation film 26 with the conduction layers 32a, 32b formed on, the inter-layer insulation film 34 of, e.g., silicon oxide film is formed on the entire surface by, e.g., CVD.

Then, the contact holes 60a arriving at one ends of the conduction layers 32a and the contact holes 60b arriving at the other ends of the conduction layers 32a are formed in the inter-layer insulation film 34 by photolithography.

Then, a barrier film and a tungsten film are formed on the entire surface by, e.g., CVD.

Next, the tungsten film and the barrier film are polished by, e.g., CMP until the surface of the inter-layer insulation film 34 is exposed by, e.g., CMP. Thus, the conductor plugs 62a, 62b of, e.g., tungsten are buried respectively in the contact holes 60a, 60b (see FIGS. 41A and 41B).

Then, on the entire surface, a conduction film of aluminum or others of an about 200-300 nm-film thickness is formed by, e.g., sputtering.

Next, the conduction film is patterned by photolithography. Thus, on the inter-layer insulation film 34, the third comb-shaped interconnection 64a having the plural comb teeth 65a and the fourth comb-shaped interconnection 64b having the plural comb teeth 65b are formed. The comb teeth 65a of the third comb-shaped interconnection 64a are electrically connected to one ends of the condition layers 32a via the conductor plugs 62a. The comb teeth 65b of the fourth comb-shaped interconnection 64b are electrically connected to one ends of the conduction layers 32b via the conductor plugs 62b.

The case that the third comb-shaped interconnection 64a and the fourth comb-shaped interconnection 64b are formed by forming a conduction film of aluminum or others and etching the conduction film is exemplified. However, the method of forming the third comb-shaped interconnection 64a and the fourth comb-shaped interconnection 64b is not limited to this. For example, it is possible that contact holes for the conductor plugs 62a, 62b to be buried in and trenches for the comb-shaped interconnections 64a, 64b to be buried in are formed in the inter-layer insulation film, a conduction film of Cu is formed in the contact holes and the trenches and on the inter-layer insulation film, and the conduction film is polished until the surface of the inter-layer insulation film is exposed to thereby bury the conductor plugs 62a, 62b of Cu and the comb-shaped interconnections 64a, 64b of Cu in the inter-layer insulation film (not illustrated). That is, the conductor plugs 62a, 62b and the comb-shaped interconnections 64a, 64b may be formed by dual damascene. In this case, the conductor plugs 62a of Cu and the third comb-shaped interconnection 64a of Cu are formed integral, and the conductor plugs 62b of Cu and the fourth comb-shaped interconnection 64b of Cu are formed integral.

Then, on the entire surface, the inter-layer insulation film 42 of, e.g., silicon oxide film is formed by, e.g., CVD.

Thus, the semiconductor device according to the present embodiment is manufactured (see FIG. 42 and FIG. 43).

(Modification)

Figure 44:
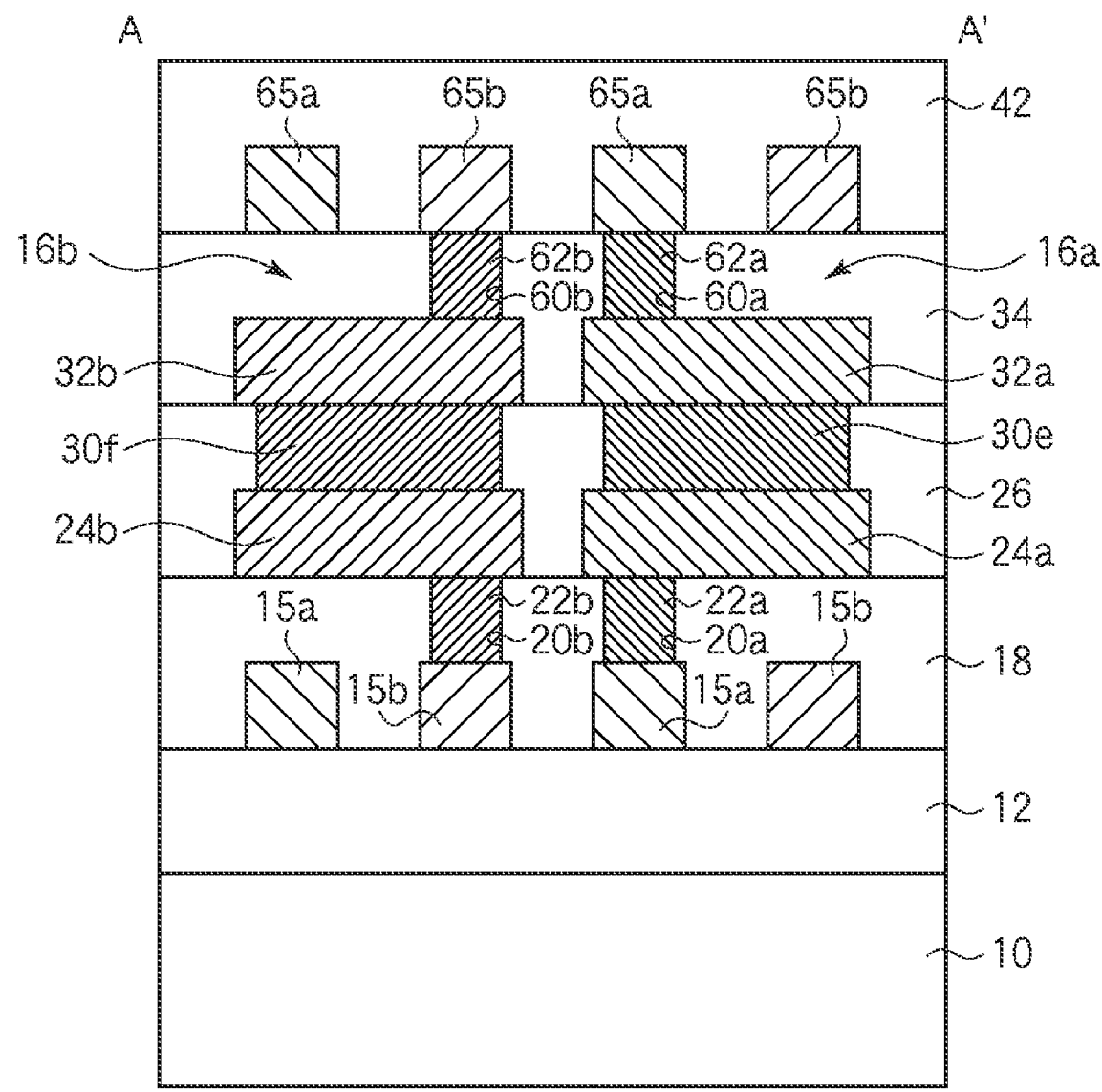
FIG. 44 is a sectional view of a semiconductor device according to a modification of the third embodiment.

The capacitor element according to a modification of the present embodiment and the semiconductor device including the capacitor element will be explained with FIG. 44. FIG. 44 is a sectional view of the semiconductor device according to the present modification.

The capacitor element according to the present modification and the semiconductor device including the capacitor element are characterized mainly in that the linear conduction layers 24a, 24b and the linear conduction layers 32a, 32b are respectively connected by the linear conduction layers 30e, 30f buried in the inter-layer insulation film 26.

As described above, the linear conduction layers 24a, 24b and the linear conduction layers 32a, 32b may be connected respectively by the conduction layers 30e, 30f without connecting the linear conduction layers 24a, 24b and the linear conduction layers 32a, 32b respectively by the conductor plugs 30a-30d.

Modified Embodiments

The present invention is not limited to the above-described embodiments and can cover other various modifications.

For example, in the above-described embodiments, the first comb-shaped interconnection 14a and the second comb-shaped interconnection 14b are formed of a metal of aluminum or others. However, the first comb-shaped interconnection 14a and the second comb-shaped interconnection 14b are not limited to metal. The first comb-shaped interconnection 14a and the second comb-shaped interconnection 14b may be formed of, e.g., polycrystalline silicon or others.

In the above-described embodiments, the third comb-shaped interconnection 64a and the fourth comb-shaped interconnection 64b are formed of the metal of aluminum or others. However, the third comb-shaped interconnection 64a and the fourth comb-shaped interconnection 64b may not be essentially formed of metal. The third comb-shaped interconnection 64a and the fourth comb-shaped interconnection 64b may be formed of, e.g., polycrystalline silicon or others.

In the above-described embodiments, the conduction layers 24a, 24b, 32a, 32b, 40a, 40b, 44a, 44b, 52a, 52b are formed of the metal of aluminum or others. However, the material of the conduction layers 24a, 24b, 32a, 32b, 40a, 40b, 44a, 44b, 52a, 52b is not limited to metal. The conduction layers 24a, 24b, 32a, 32b, 40a, 40b, 44a, 44b, 52a, 52b may be formed of, e.g., polycrystalline silicon or others.

In the third embodiment, the electrodes 16a, 16b are formed only between the comb-shaped interconnections 14a, 14b and the comb-shaped interconnections 64a, 64b. However, the electrodes 16c, 16d as illustrated in FIG. 17 may be further formed below the comb-shaped interconnections 14a, 14b.

In the third embodiment, the electrodes 16a, 16b are formed only between the comb-shaped interconnections 14a, 14b and the comb-shaped interconnections 64a, 64b. However, the same electrodes as the electrodes 16a, 16b may be formed above the comb-shaped interconnections 64a, 64b.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A capacitor element comprising:
a first comb-shaped interconnection formed over a substrate and including a first comb tooth;
a second comb-shaped interconnection formed over the substrate and including a second comb tooth formed in parallel with the first comb tooth;
a first electrode and a second electrode opposed to each other, a normal direction of opposed surfaces of the first electrode and the second electrode being parallel with a longitudinal direction of the first comb tooth and the second comb tooth; and
a first dielectric layer formed between the first electrode and the second electrode,
the first electrode being connected to the first comb tooth, and
the second electrode being connected to the second comb tooth.

2. The capacitor element according to claim 1, further comprising
a third electrode and a fourth electrode opposed to each other with opposed surfaces of the third electrode and the fourth electrode intersecting the longitudinal direction of the first comb tooth and the second comb tooth,
the first comb-shaped interconnection further including a third comb tooth parallel with the first comb tooth,
the second comb-shaped interconnection further including a fourth comb tooth parallel with the second comb tooth, and
the third electrode being connected to the third comb tooth, and
the fourth electrode being connected to the fourth comb tooth.

3. The capacitor element according to claim 1, further comprising:
a fifth electrode formed below the first electrode and including a top connected to the first comb-shaped interconnection;
a sixth electrode formed below the second electrode and including a top connected to the second comb-shaped interconnection and opposed to the fifth electrode; and
a second dielectric layer formed between the fifth electrode and the sixth electrode.

4. The capacitor element according to claim 1, further comprising:
a third comb-shaped interconnection formed over the substrate and including a fifth comb tooth; and
a fourth comb-shaped interconnection formed over the substrate and having a sixth comb tooth opposed to the fifth comb tooth,
a top of the first electrode being connected to the fifth comb tooth, and
a top of the second electrode being connected to the sixth comb tooth.

5. The capacitor element according to claim 1, wherein
the first electrode or the second electrode is formed of conduction layers and conductor plugs alternately stacked.

6. The capacitor element according to claim 2, wherein
the third electrode or the fourth electrode is formed of conduction layers and conductor plugs alternately stacked.

7. The capacitor element according to claim 1, wherein
the first electrode or the second electrode is formed of a plurality of conduction layers stacked.

8. The capacitor element according to claim 2, wherein
the third electrode and the fourth electrode is formed of a plurality of conduction layers stacked.

9. The capacitor element according to claim 5, wherein
one conduction layer of a plurality of the conduction layers and another conduction layer formed over said one conduction layer are connected via a plurality of the conductor plugs formed directly on said one conduction layer.

10. The capacitor element according to claim 9, wherein
said a plurality of conductor plugs are formed on both ends of said one conduction layer.

11. The capacitor element according to claim 2, wherein
the second comb tooth are arranged between the first comb tooth and the third comb tooth, and
the third comb tooth are arranged between the second comb tooth and the fourth comb tooth.

12. The capacitor element according to claim 1, wherein
the first comb-shaped interconnection and the second comb-shaped interconnection are formed of polycrystalline silicon, a metal containing Cu or a metal containing Al.

13. A semiconductor device comprising a capacitor element formed over a semiconductor substrate,
the capacitor element including
a first comb-shaped interconnection formed over the substrate and including a first comb tooth;
a second comb-shaped interconnection formed over the substrate and including a second comb tooth formed in parallel with the first comb tooth;
a first electrode and a second electrode opposed to each other, a normal direction of opposed surfaces of the first electrode and the second electrode being parallel with a longitudinal direction of the first comb tooth and the second comb tooth; and
a first dielectric layer formed between the first electrode and the second electrode, the first electrode being connected to the first comb tooth, and the second electrode being connected to the second comb tooth.

14. The semiconductor device according to claim 13, wherein
the capacitor element further includes a third electrode formed below the first electrode and including a top connected to the first comb-shaped interconnection; a fourth electrode formed below the second electrode and including a top connected to the second comb-shaped interconnection and opposed to the third electrode; and a second dielectric layer formed between the third electrode and the fourth electrode.

15. The semiconductor device according to claim 13, wherein
the capacitor element further includes a third comb-shaped interconnection formed over the substrate and having a fifth comb tooth; and a fourth comb-shaped interconnection formed over the substrate and including a sixth comb tooth opposed to the fifth comb tooth, a top of the first electrode connected to the fifth comb tooth, and a top of the second electrode being connected to the sixth comb tooth.

16. A capacitor element comprising:
a first conductive layer formed above a substrate, the first conductive layer includes a first conductive pattern extending to a first direction and connected to a plurality of second conductive patterns extending to a second direction different from the first direction, and a third conductive pattern extending to the first direction and connected to a plurality of fourth conductive patterns extending to the second direction, the second conductive patterns and the fourth conductive patterns are arranged alternately each other;
a first insulation film formed above the first conductive layer;
a plurality of first conductive plugs formed in the first insulation film and connected to the second conductive patterns;
a plurality of second conductive plugs formed in the first insulation film and connected to the fourth conductive patterns;
a second conductive layer formed above the first insulation film, the second conductive layer includes a plurality of fifth conductive pattern extending to the first direction and connected to the first conductive plugs, and a plurality of sixth conductive patterns extending to the first direction and connected to the second conductive plugs;
a second insulation film formed above the first insulation film;
a plurality of third conductive plugs formed in the second insulation film and on the fifth conductive patterns;
a plurality of fourth conductive plugs formed in the second insulation film and on the sixth conductive patterns; and
a third conductive layer formed above the second insulation film, the third conductive layer includes a plurality of seventh conductive patterns extending to the first direction and formed on the third conductive plugs, and a plurality of eighth conductive patterns extending to the first direction and formed on the fourth conductive plugs.

17. The capacitor element according to claim 16, wherein the fifth conductive patterns and the sixth conductive patterns are arranged alternately.

18. The capacitor element according to claim 17, wherein the fifth conductive patterns locates above one of the fourth conductive patterns; and
the sixth conductive patterns locates above one of the second conductive patterns.

19. The capacitor element according to claim 18, wherein each of the fifth conductive patterns is connected to at least two plugs included in plurality of the third conductive plugs; and
each of the sixth conductive patterns is connected to at least two plugs included in plurality of the fourth conductive plugs.

20. The capacitor element according to claim 19, wherein each of the seventh conductive patterns are connected to at least two plugs included in plurality of the third conductive plugs, and
each of the eighth conductive patterns are connected to at least two plugs included in plurality of the fourth conductive plugs.

21. The capacitor element according to claim 16, wherein;
in a first region, a first plug included in plurality of the first conductive plugs is connected to a first pattern included in plurality of the second conductive patterns;
in a second region, a second plug included in plurality of the second conductive plugs is connected to a second pattern included the fourth conductive patterns;
the first plug is located nearest to the first conductive pattern among plurality of the first conductive plugs connected to the first pattern;
the second plug is located nearest to the first conductive pattern among plurality of the second conductive plugs connected to the second pattern; and
a first distance between the first region and the first conductive pattern is different from a second distance between the second region and the first conductive pattern.

22. The capacitor element according to claim 16, further comprising:
a third insulation film formed above the second insulation film;
a plurality of fifth conductive plugs formed in the third insulation film and connected to the seventh conductive patterns;
a plurality of sixth conductive plugs formed in the third insulation film and connected to the eighth conductive patterns; and
a fourth conductive layer formed above the third insulation film, the fourth conductive layer includes ninth conductive pattern extending to the first direction and connected to a plurality of tenth conductive patterns extending to the second direction, and a eleventh conductive pattern extending to the first direction and connected to a plurality of twelfth conductive patterns extending to the second direction, the tenth conductive patterns and the twelfth conductive patterns are arranged alternately each other;
wherein the tenth conductive patterns are connected to the fifth conductive plugs, and the twelfth conductive patterns are connected to the sixth conductive plugs.

23. The capacitor element according to claim 16, further comprising:
a fourth insulation film formed under the first conductive layer;
a plurality of seventh conductive plugs formed in the fourth insulation film and connected to the second conductive patterns;
a plurality of eighth conductive plugs formed in the fourth insulation film and connected to the fourth conductive patterns;
a fifth conductive layer formed under the fourth insulation film, the fifth conductive layer includes a plurality of thirteenth conductive patterns extending to the first direction and connected to the seventh conductive plugs, and a plurality of fourteenth conductive patterns extending to the first direction and connected to the eighth conductive plugs.

24. A method of manufacturing a capacitor element comprising:
forming a first conductive layer above a substrate, the first conductive layer includes a first conductive pattern extending to a first direction and connected to a plurality of second conductive patterns extending to a second direction different from the first direction, and a third conductive pattern extending to the first direction and connected to a plurality of fourth conductive patterns extending to the second direction, the second conductive patterns and the fourth conductive patterns are arranged alternately each other;

forming a first insulation film above the first conductive layer;

etching the first insulation film to form a plurality of first tranches and a plurality of first contact holes reaching the second conductive patterns, and to form a plurality of second tranches and a plurality of second contact holes reaching the fourth conductive patterns;

forming a first conductive film over the first insulation film, in the first contact holes, in the second contact holes, in the first trenches and in the second tranches;

polishing the first conductive film over the first insulation film to form a plurality of first conductive plugs, a plurality of second conductive plugs, a plurality of fifth conductive patterns and a plurality of sixth conductive patterns, wherein the fifth conductive patterns and the sixth conductive patterns extends to the first direction;

forming a second insulation film above the first insulation film;

etching the second insulation film to form a plurality of third tranches and a plurality of third contact holes reaching the fifth conductive patterns, and to form a plurality of fourth tranches and a plurality of fourth contact holes reaching the sixth conductive patterns;

forming a second conductive film over the second insulation film, in the third contact holes, in the fourth contact holes, in the third trenches and in the fourth tranches;

polishing the second conductive film over the second insulation film to form a plurality of third conductive plugs, a plurality of fourth conductive plugs, a plurality of seventh conductive patterns and a plurality of eighth conductive patterns, wherein the seventh conductive patterns and the eighth conductive patterns extends to the first direction.

25. The method of manufacturing the capacitor element according to claim 24, further comprising:

forming a barrier metal in the first contact holes, in the second contact holes, in the first trenches, and in the second tranches before forming the first conductive film.

26. The method of manufacturing the capacitor element according to claim 25, wherein;

the first conductive film includes Cu.

* * * * *